(12) United States Patent
Granger-Jones et al.

(10) Patent No.: US 8,633,754 B2
(45) Date of Patent: Jan. 21, 2014

(54) VARIABLE ATTENUATOR HAVING STACKED TRANSISTORS

(75) Inventors: Marcus Granger-Jones, Scotts Valley, CA (US); Brad Nelson, Redwood City, CA (US); Ed Franzwa, San Jose, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/549,018

(22) Filed: Jul. 13, 2012

(65) Prior Publication Data

US 2012/0280738 A1 Nov. 8, 2012

Related U.S. Application Data

(63) Continuation of application No. 12/977,958, filed on Dec. 23, 2010, now Pat. No. 8,334,718.

(60) Provisional application No. 61/384,763, filed on Sep. 21, 2010, provisional application No. 61/289,883, filed on Dec. 23, 2009.

(51) Int. Cl.
*H03L 5/00* (2006.01)

(52) U.S. Cl.
USPC .......................................... 327/308; 333/81 R

(58) Field of Classification Search
USPC ................... 327/306, 308; 333/81 R
See application file for complete search history.

(56) References Cited

U.S. PATENT DOCUMENTS

| | | | |
|---|---|---|---|
| 2,259,945 A | 10/1941 | Velia | |
| 4,890,077 A | 12/1989 | Sun | |
| 6,297,709 B1 | 10/2001 | Wey et al. | |
| 7,105,391 B2 * | 9/2006 | Doris et al. | 438/151 |
| 7,205,817 B1 * | 4/2007 | Huang et al. | 327/308 |
| 7,221,207 B2 | 5/2007 | Fukumoto et al. | |
| 7,646,231 B2 * | 1/2010 | Vice | 327/308 |
| 7,646,239 B2 | 1/2010 | Iwasaki | |
| 7,710,181 B2 | 5/2010 | Nakatani et al. | |
| 7,919,812 B2 * | 4/2011 | Cai et al. | 257/336 |
| 8,183,927 B2 | 5/2012 | Mochizuki | |
| 2008/0136518 A1 | 6/2008 | Iwasaki | |
| 2011/0148501 A1 | 6/2011 | Granger-Jones et al. | |
| 2011/0148502 A1 | 6/2011 | Granger-Jones et al. | |
| 2011/0148503 A1 | 6/2011 | Granger-Jones et al. | |

OTHER PUBLICATIONS

Final Office Action for U.S. Appl. No. 12/978,149 mailed Oct. 17, 2012, 9 pages.

Notice of Allowance for U.S. Appl. 12/978,179 mailed Oct. 25, 2012, 5 pages.

(Continued)

*Primary Examiner* — Dinh T. Le
(74) *Attorney, Agent, or Firm* — Withrow & Terranova, P.L.L.C.

(57) ABSTRACT

In one embodiment, a variable attenuator is disclosed having an attenuation circuit and a control circuit. The attenuation circuit may include a first series connected attenuation circuit segment and a shunt connected attenuation circuit segment, as well as additional attenuation circuit segments. Each attenuation circuit segment includes a stack of transistors that are coupled to provide the attenuation circuit segment with a variable impedance level having a continuous impedance range. In this manner, the control circuit may be operably associated with the stack of transistors in each attenuation circuit segment to control the variable attenuation level of the variable attenuator.

20 Claims, 37 Drawing Sheets

(56) References Cited

OTHER PUBLICATIONS

Bayruns, R. et al., "The bootstrapped gate FET (BGFET)—a new control transistor," 17th Annual Gallium Arsenide Integrated Circuit Symposium, Oct. 29-Nov. 1, 1995, pp. 136-139, IEEE.

Caverly, R. H., "Distortion behavior in wireless and RF MOS-based switches," 2006 IEEE Radio and Wireless Symposium, Jan. 17-19, 2006, pp. 175-178, IEEE.

Dogan, H. et al., "Intermodulation Distortion in CMOS Attenuators and Switches," IEEE Journal of Solid-State Circuits, Mar. 2007, pp. 529-539, IEEE.

Dogan, H. et al, "Analysis and Design of RF CMOS Attenuators," IEEE Journal of Solid-State Circuits, Oct. 2008, pp. 2269-2283, vol. 43, No. 10, IEEE.

Vlassis, S. et al., "Differential-voltage attenuator based on floating-gate MOS transistors and its applications," IEEE Transactions on Circuits and Systems I: Fundamental Theory and Applications, Nov. 2001, pp. 1372-1378, vol. 48, No. 11, IEEE.

Kaunisto, R. et al, "A linear-control wide-band CMOS attenuator," The 2001 IEEE International Symposium on Circuits and Systems, May 6-9, 2001, pp. 458-461, vol. 4, IEEE.

Shifrin, M.B. et al., "Monolithic FET structures for high-power control component applications," IEEE Transactions on Microwave Theory and Techniques, Dec. 1989, pp. 2134-2141, vol. 37, No. 12, IEEE.

Kelly, D. et al., "The state-of-the-art of silicon-on-sapphire CMOS RF switches," IEEE Compound Semiconductor Integrated Circuit Symposium, Oct. 30-Nov. 2, 2005, pp. 200-203, IEEE.

Non-final Office Action for U.S. Appl. No. 12/978,149 mailed May 15, 2012, 11 pages.

Non-final Office Action for U.S. Appl. No. 12/977,958 mailed Apr. 27, 2012, 9 pages.

Quayle Action for U.S. Appl. No. 12/978,179 mailed Aug. 3, 2012, 6 pages.

Notice of Allowance for U.S. Appl. No. 12/977,958 mailed Aug. 21, 2012, 7 pages.

Advisory Action for U.S. Appl. No. 12/978,149, mailed Dec. 13, 2012, 2 pages.

Notice of Allowance for U.S. Appl. No. 12/978,149 mailed Feb. 11, 2013, 7 pages.

Non-final Office Action for U.S. Appl. No. 13/748,119 mailed Apr. 3, 2013, 5 pages.

Non-Final Office Action for U.S. Appl. No. 13/748,119, mailed Aug. 7, 2013, 9 pages.

* cited by examiner

VARIABLE ATTENUATOR HAVING STACKED TRANSISTORS

RELATED APPLICATIONS

This application is a contuation of U.S. patent application No. 12/977,958 filed Dec. 23, 2010, now U.S. Pat. No. 8,334,718, which claims the benefit of provisional patent application Ser. No. 61/289,883, filed Dec. 23, 2009, and provisional patent application Ser. No. 61/384,763, filed Sep. 21, 2010, the disclosures of which are hereby incorporated herein by reference in their entireties.

FIELD OF THE DISCLOSURE

The present disclosure relates to attenuators configured to have variable impedance levels and methods of operating the same. The present disclosure also relates to attenuators that compensate for temperature changes during operation of the attenuator. The present disclosure also related to attenuators having variable impedance levels that are controlled based on a temperature.

BACKGROUND

Attenuators are designed to introduce a known loss between two or more nodes in a circuit. Often, these devices are utilized in radio frequency (RF) circuits, audio equipment, and measuring instruments to lower voltage, dissipate power, and/or for impedance matching. Attenuators may be passive attenuators, variable attenuators, and/or temperature compensation attenuators. Passive attenuators are designed with passive components, such as resistors, to introduce a designed loss between the nodes of a circuit. Passive attenuators generally have fixed impedance levels. Unfortunately, passive attenuators are not dynamic and modifying their impedance levels requires physically changing the passive components in the passive attenuator.

Variable attenuators are capable of varying their impedance levels. For example, a digitally controlled attenuator (DCA), also known as a step attenuator, may include a stack of transistors coupled to passive components. These transistors act as switches and vary the impedance level by being turned on and off so as to introduce the attenuation of the passive components selected by the transistors. However, since the impedance level of the digitally controlled attenuator can only vary in accordance with the attenuation being introduced by the passive components coupled to the transistors, the impedance levels of the DCA are discrete and thus the attenuation range of the DCA suffers from low resolution.

Other variable attenuators, such as voltage controlled attenuators (VCA), include active components that allow the VCA's impedance level to vary within a continuous impedance range. These active components may, for example, be individual transistors placed in different circuit segments of the VCA. Unfortunately, these types of VCA's suffer from a high degree of distortion. To ameliorate the distortion in the VCA, prior art VCA's use pin diodes and quadrature hybrid techniques. These techniques however provide VCAs with very limited bandwidth. Also, these solutions are relatively expensive.

Thus, there remains a need for a variable attenuator with a high dynamic attenuation range and/or a wide bandwidth and low distortion that is relatively inexpensive.

Temperature compensation attenuators are designed to compensate for variations in attenuation caused by changes in temperature of the attenuation components of the attenuator. Generally, temperature compensation attenuators modify the operation of the attenuation components to compensate for changes in attenuation that result from changes in temperature. Unfortunately, many temperature compensation attenuators also have very limited bandwidth and/or do not have low distortion or a control voltage that is easily adjustable to compensate for temperature changes in the attenuator.

Accordingly, there remains a need for a temperature compensation attenuator with a dynamic attenuation range and/or a wide bandwidth and low distortion that is relatively inexpensive.

Temperature controlled attenuators are designed to create a temperature dependant attenuation that compensate for variations in gain of a cascade of amplifiers, mixers and other electronic components caused by changes in temperature of the components. Generally, temperature controlled attenuators modify the operation of the attenuation components to compensate for changes in gain of the other components in the lineup that result from changes in temperature. Unfortunately, many temperature controlled attenuators also have very limited bandwidth and/or do not have low distortion or an easily adjustable/programmable temperature coefficient.

Accordingly, there remains a need for a temperature compensation attenuator with a dynamic attenuation range and/or a wide bandwidth and low distortion that is relatively inexpensive.

SUMMARY OF THE DISCLOSURE

The present disclosure relates generally to variable attenuators and temperature compensation attenuators. More specifically, the disclosure relates to variable attenuators and temperature compensation attenuators having dynamic attenuation ranges and/or wide bandwidth, and low distortion. In one embodiment, a variable attenuator includes an attenuation circuit having a first series connected attenuation circuit segment and a first shunt connected attenuation circuit segment. Additional series connected and/or shunt connected attenuation circuit segments may also be provided so that the attenuation circuit can be arranged as a Tee or Pi type attenuator if desired. Each attenuation circuit segment in the attenuation circuit includes a plurality of stacked transistors. The plurality of stacked transistors in each attenuation circuit segment are coupled to provide the attenuation circuit segment with a variable impedance level having a continuous impedance range. By having a plurality of stacked transistors in each attenuation circuit segment, the signal being attenuated by the attenuation circuit is distributed among each of the transistors in the stack. Furthermore, the width of the transistors may be increased to compensate for the stacking of serial device. As a result, the stack of transistors in each attenuation circuit segment can thus reduce distortion A control circuit may be operably associated with each of the plurality of stacked transistors to control the variable impedance level of each of the attenuation circuit segments. The control circuit controls the variable impedance level in each attenuation circuit segment based on the signal level of the attenuation control signal. In this manner, the variable impedance levels of each of the attenuation circuit segments in the attenuation circuit may be controlled so that the variable attenuator is set at a desired impedance level.

In another embodiment, a temperature compensation attenuator includes an attenuation circuit having a first series connected attenuation circuit segment and a first shunt connected attenuation circuit segment. As in the variable attenuator described above, additional series connected and/or shunt connected attenuation circuit segments may also be provided so that the attenuation circuit can be arranged as a Tee or Pi type attenuator if desired. Each attenuation circuit segment in the attenuation circuit includes a plurality of stacked transistors. The plurality of stacked transistors in each attenuation segment is coupled to attenuate an input signal. The plurality of stacked transistors may be set by a control circuit to a constant impedance level that provides attenuation at a desired value. In the alternative, the plurality of stacked transistors may be configured by the control circuit to provide each attenuation circuit segment with a variable impedance level having a continuous impedance range. By having a plurality of stacked transistors in each attenuation circuit segment, the signal being attenuated by the attenuation circuit is distributed among each of the transistors in the stack. As a result, the stack of transistors in each attenuation circuit segment can reduce distortion and preserve bandwidth.

A control circuit may be operably associated with each of the plurality of stacked transistors to set the impedance level of each of the attenuation circuit segments. This control circuit may be adapted to receive an attenuation control signal having a signal level related to a desired impedance level of the attenuation circuit. A temperature compensation circuit is provided in the attenuator that can detect a change in an operating temperature associated with the attenuation circuit. The temperature compensation circuit generates an attenuation control adjustment signal that adjusts the signal level of the attenuation control signal in accordance to the change in the operating temperature. In this manner the temperature compensation circuit reduces or prevents changes in attenuation caused by a change in the operating temperature.

In yet another embodiment, a temperature controlled attenuator includes an attenuation circuit having a first series connected attenuation circuit segment and a first shunt connected attenuation circuit segment. As in the variable attenuator described above, additional series connected and/or shunt connected attenuation circuit segments may also be provided so that the attenuation circuit can be arranged as a Tee or Pi type attenuator if desired. Each attenuation circuit segment in the attenuation circuit includes a plurality of stacked transistors. The plurality of stacked transistors in each attenuation segment is coupled to attenuate an input signal. The plurality of stacked transistors may be set by a control circuit to an impedance level that varies as a function of temperature to provide a desired attenuation characteristic. In the alternative, the plurality of stacked transistors may be configured to provide each attenuation circuit segment with a variable impedance level having a continuous impedance range. A control circuit adjusts a variable impedance levels in accordance with an attenuation control signal to adjust the variable attenuation level. The attenuation control signal operates at a quiescent operating point and is adjusted from the quiescent operating point by a temperature coefficient and thus the attenuation is temperature controlled. By having a plurality of stacked transistors in each attenuation circuit segment, the signal being attenuated by the attenuation circuit is distributed among each of the transistors in the stack. As a result, the stack of transistors in each attenuation circuit segment can reduce distortion.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
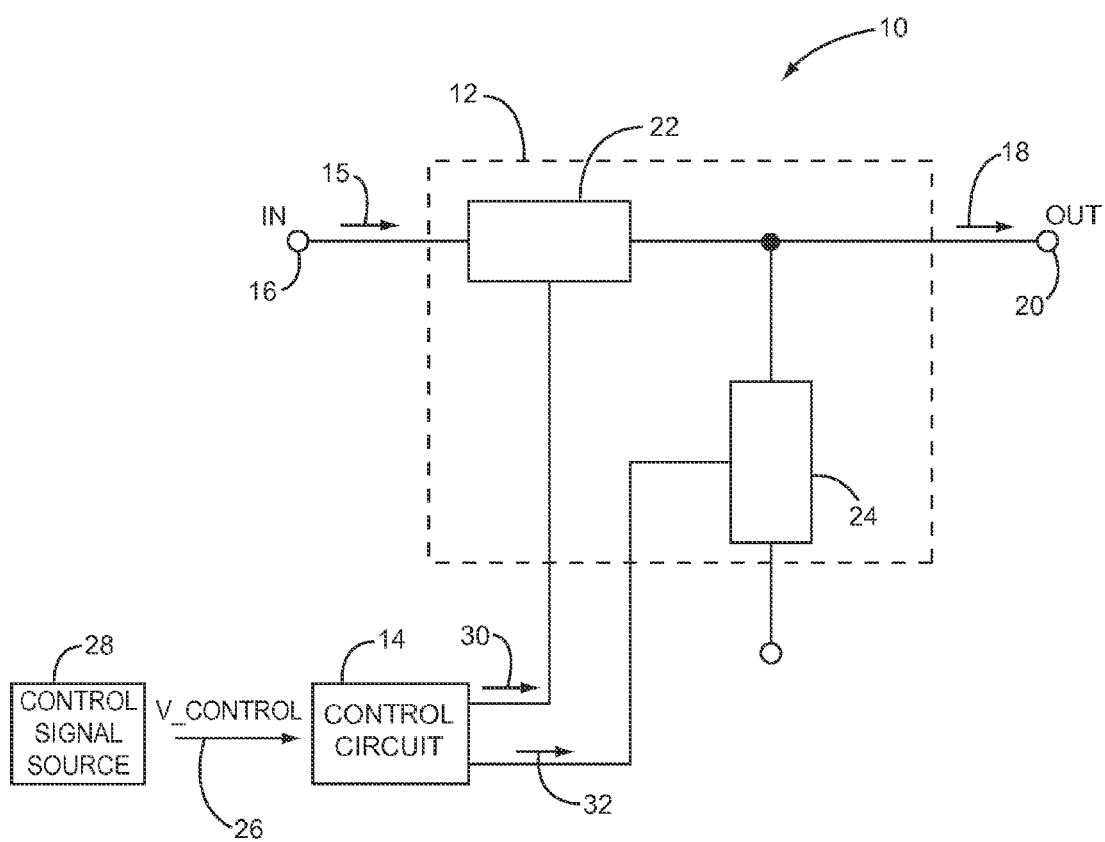
FIG. 1 illustrates one embodiment of a variable attenuator in accordance with the present disclosure.

The present disclosure relates generally to variable attenuators and methods of operating the same. More particularly, the disclosure describes variable attenuators that have dynamic attenuation ranges and/or high bandwidth and low distortion. FIG. 1 illustrates a variable attenuator 10 having an attenuation circuit 12 and a control circuit 14. The attenuation circuit 12 attenuates an input signal 15 received from the input terminal 16 and delivers an attenuated output signal 18 to the output terminal 20. The attenuator 10 may be utilized in any type circuit requiring attenuation, such as radio frequency (RF) circuits, signal processing circuits, and circuits utilized for measurement.

The attenuation circuit 12 of this embodiment is one type of attenuation circuit and is often referred to as an L-type attenuation circuit 12. The attenuation circuit 12 includes a series connected attenuation circuit segment 22 and a shunt connected attenuation circuit segment 24. As shall be explained in further detail below, additional series connected and shunt connected attenuation circuit segments may be provided to define more complex attenuation circuits. The series connected attenuation circuit segment 22 and the shunt connected attenuation circuit segment 24 each include a plurality of stacked transistors. The plurality of stacked transistors in the series connected attenuation circuit segment 22 are coupled to provide the first series connected attenuation circuit segment with a first variable impedance level having a first continuous impedance range. Thus, the plurality of stacked transistors in series connected attenuation circuit segment 22 provide attenuation to the input signal 15 and the first variable impedance level may be varied within the first continuous impedance range by controlling the plurality of stacked transistors between a minimum impedance value to a maximum impedance value.

The stacked transistors may be the only components in the series connected attenuation circuit segment 22 that provide attenuation to the input signal 15. In this embodiment, the first plurality of stacked transistors are coupled to provide the first variable impedance level within the first continuous impedance range because the impedance level of the plurality of stacked transistors which can be varied along a continuous impedance range of the plurality of stacked transistors. In this case, the first impedance level of the series connected attenuation circuit segment may be equal to the impedance level of the plurality of stacked transistors. However, as shall be explained in further detail below, other passive or active components may be coupled to the plurality of stacked transistors and also provide an impedance to the input signal 15. Still, the plurality of stacked transistors provide the first variable impedance level of the series connected attenuation circuit segment 22 because the plurality of stacked transistors are coupled to present a variable impedance to the input signal 15. Consequently, by providing the variable impedance level of the plurality of stacked transistors one also provides the first variable impedance level of the series connected attenuation circuit segment 22. This is so even though the first variable impedance level of the series connected attenuation circuit segment 22 and the variable impedance level of the plurality of stacked transistors may not be equal.

The same may be true for the plurality of stacked transistors in the shunt connected attenuation circuit segment 24. The plurality of stacked transistors in the shunt connected attenuation circuit segment 24 are coupled to provide the shunt connected attenuation circuit segment 24 with a second variable impedance level having a second continuous impedance range. As explained above, the plurality of stacked transistors in the shunt connected attenuation circuit segment 24 may be the only components providing attenuation or there may be additional components providing attenuation. In either case, the plurality of stacked transistors are coupled to attenuate the input signal 15 and thus provide the shunt connected attenuation circuit segment 24 with the second variable impedance level having the second continuous impedance range. Thus, the plurality of stacked transistors in the shunt connected attenuation circuit segment 24 provide attenuation to the input signal 15 and the second variable impedance level may be varied within the second continuous impedance range by controlling the plurality of stacked transistors.

Note that the first continuous impedance range of the series connected attenuation circuit segment 22 may be the same or different than the second continuous impedance range of the shunt connected attenuation circuit segment 24. This depends on the particular characteristics required or desired for the attenuation circuit 12. Also, the attenuation circuit 12 has a variable attenuation level that is provided as a function of the first variable impedance level and the second variable impedance level of each of the attenuation circuit segments 22, 24. Thus, the variable attenuation level can be said to be based on the first variable impedance level and the second variable impedance level.

To control the first variable impedance level and the second variable impedance level, the attenuator 10 includes a control circuit 14 that may be adapted to receive an attenuation control signal 26 from a control signal source 28. In this embodiment, the attenuation control signal 26 is a control voltage, V_control, has a variable voltage level, which can be varied between a control voltage minimum and a control voltage maximum. The control signal source 28 may be a variable DC voltage source. The voltage level of the variable DC voltage source may be programmed by other components (not shown) or in the alternative be manually controlled by a user. In this example, the control voltage, V_control, may vary between 0-5V.

The control circuit 14 is operably associated with the plurality of stacked transistors in the series connected attenuation circuit segment 22 and also in the shunt connected attenuation circuit segment 24. By controlling the operation of plurality of stacked transistors in each of the attenuation circuit segments 22, 24 the control circuit 14 can control the first variable impedance level and second variable impedance level to determine the variable impedance level of the attenuator 10 and set the input and output terminals 16, 20 of the structure to the desired impedance. The control circuit 14 may control the plurality of stacked transistors in each of the attenuation circuit segments 22, 24 based on the voltage level of the control voltage, V_control. Accordingly, the first variable impedance level and the second variable impedance level are related or are associated with the voltage level of the control voltage, V_control.

In this embodiment, the control circuit 14 is operable to generate a series segment control signal 30 and a shunt segment control signal 32 based on the control voltage, V_control. The control circuit 14 may have a transfer function that determines a signal level of the series segment control signal 30 and a signal level of the shunt have a signal level in accordance with the voltage level of the control voltage, V_control. Accordingly, as the voltage level of the control voltage, V_control is varied so are the signal levels of the series segment control signal 30 and shunt segment control signal 32. The series segment control signal 30 may be utilized to determine the operation of the plurality of stacked transistors in the series connected attenuation circuit segment 22 and control the first variable impedance level. Similarly, the shunt segment control signal 32 may be utilized to determine the operation of the plurality of stacked transistors in the shunt connected attenuation circuit segment 24 and control the second variable impedance level. Varying the signal level of the series segment control signal 30 and shunt segment control signal 32 thus varies the first variable impedance level and the second variable impedance level to adjust the variable attenuation level of the attenuation circuit 12.

The control circuit 14 may be configured in any manner such that the transfer function generates the appropriate signal levels for the series segment control signal 30 and shunt segment control signal 32. For example, the control circuit 14 may utilize preconditioning circuit(s) utilizing open-loop techniques, like ad hoc approximation circuitry, or squaring circuitry, so that each of the signal levels of the series segment control signal 30 and shunt segment control signal 32 have a desired relationship to the voltage level of the control voltage, V_control.

Figure 2:
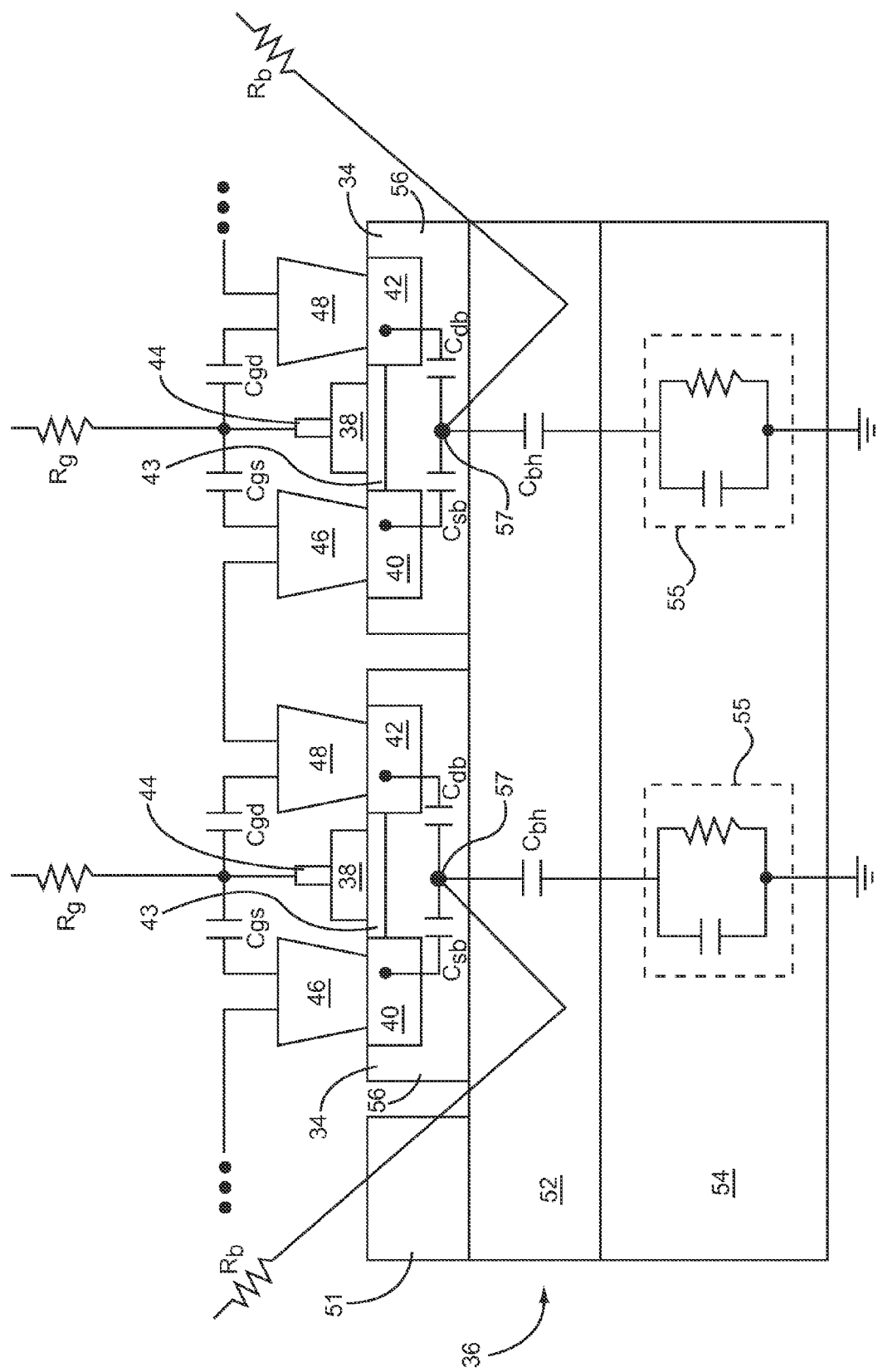
FIG. 2 illustrates one embodiment of a stack of transistors formed on a silicon-on-insulator type substrate.

Next, FIG. 2 illustrate a plurality of stacked transistors 34 formed on a common substrate 36. The plurality of stacked transistors 34 in this disclosure may be any type of transistor such as complementary metal-oxide-semiconductor field effect transistors (CMOS), a metal semiconductor field effect transistors (MESFETs), and a high electron mobility transistor field effect transistors (HFETs) and the like. In the illustrated embodiment, each of the plurality of stacked transistors 34 is a field effect transistor (FET). Thus each of the stacked transistors 34 includes a gate 38, a source 40, and a drain 42 formed within the substrate 36 and conductive terminals 44, 46, 48 coupled to the gate 38, the drain 42, and the source 40, respectively. When a voltage is applied to the gate 38, a channel 43 is provided that permits current to flow between the source 38 and drain 42. In the illustrated embodiment, each of the sources 40 and drains 42 are independently formed for each of the stacked transistors 34 but, in other embodiments, the sources 40 and drains 42 between one of the stacked transistors 34 and another one of the stacked transistors 34 may be merged to form a structure having a plurality of merged stacked transistors.

The drain 42 and the source 40 may be doped regions of the substrate 36 as is known in the art. In the illustrated example, the stacked transistors 34 may be formed on a complementary metal-oxide-semiconductor (CMOS) type transistor, such as MOSFETs. As mentioned above, the stacked transistors 34 may also be other types of transistors 34 such as MESFETs and HFETs. The substrate 36 may be a silicon-on-insulator (SOI) type substrate or a silicon-on-sapphire (SOS) type substrate, or a Gallium Arsenide (GaAs) type substrate.

In the illustrated embodiment, the substrate 36 is a silicon-on-insulator type substrate having a device layer 51 made of silicon (Si) that forms the plurality of stacked transistors 34. Beneath the device layer 51, the silicon-on-insulator type substrate may include an insulating layer 52 (also known as a Buried Oxide layer "BOX") and a handle layer 54. The insulating layer 52 is typically made from an insulating or dielectric type oxide material such as SiO2 while the handle layer 54 is typically made from a semiconductor, such as silicon (Si). As illustrated, the device layer 51 may include the doped transistor layers that form the channel 43, the drain 42, and the source 40. The stacked transistors 34 also have transistor bodies 56, which may include a body contact 57 for providing a bias voltage to the body 56.

The degradation in bandwidth normally associated with the increased parasitic capacitances of the extra components and their increased size is mitigated by implementing the attenuator on a technology that has low parasitic capacitances to substrate such as SOI or SOS and through other techniques provided in this disclosure that suppress the loading effects of other capacitances. These parasitic capacitances may be represented as the gate to source capacitance, $C_{gs}$, gate to drain capacitances, $C_{gd}$, and body to handle layer capacitances, $C_{bh}$, in FIG. 2. For example, one of the advantages to SOI and SOS designs are their low body to handle layer parasitic capacitances, such as $C_{bh}$. In the case of SOI the low parasitic is because of the presence of the insulating layer 52. The effective parasitic can be further improved through the use of a high resistivity substrate (such as, 1 kohm-cm or more). The high resistivity of the handle layer 54 is modeled by impedance 55. In the case of SOS, the low parasitic is due to the use of the sapphire as the handle layer. The low parasitic capacitance allows for high degrees of transistor stacking and large transistors to be used without compromising the overall attenuator's frequency bandwidth. The active device used to implement the stacked FET structures can be either PFET or NFET devices. Other parasitic capacitances may be modeled between the as the source to body capacitances, $C_{sb}$, and drain to body capacitances, $C_{db}$.

To increase linearization, high value resistances Rg and/or Rb may be provided by resistive and biasing circuits (with single and or multiple resistor topologies) coupled to the stacked transistors 34. Rg is the resistance presented to the gate 38 while Rb is the resistance presented to a body contact Rb. When the stacked transistors 34 are utilized to attenuate RF signals, these resistors Rg and/or Rb may improve linearization by assuring that the gate 38 to body voltages are maintained at or near the average of the source 40 to drain 42 RF voltages. To do this, the high pass filter pole to the gate 38 and body 56 created by Rg and $C_{gs}/C_{gd}$ and Rb and $C_{sb}/C_{db}$ should be significantly lower than the target operating frequency. It is difficult to write a universal equation for the values of Rg and Rb because their values are dependent on the topology of resistive and biasing network employed. These may however be determined once a topology for the resistive and biasing network is selected.

The device layer may be between 50 nm to 100 nm thick for a fully depleted SOI process, between 100 nm and 150 nm for a partially depleted SOI process and much greater than 200 nm for a thick film process. The handle layer 54 is generally around 150-750 microns in thickness. In one embodiment, the handle layer 54 has impedance 55 with a resistivity of around 1 kohm-cm. Other layers may be included in, between, or below the device layer 51, the insulating layer 52, and the handle layer 54. As shall be explained in further detail below, the body contact 57 of each of the transistors bodies 56 may be externally biased through a biasing circuit. In these design the transistor bodies 56 may be biased to ground though other bias potentials are possible. In the alternative and also explained in further detail below, the transistor bodies 56 of the plurality of stacked transistors may be left floating, where there is no external body connection and no external bias is applied to the body 56. If transistor bodies 56 are left floating, leakage currents across the drain-body and source-body reverse biased diodes may define a voltage on the transistor body and achieve similar results (i.e., high bandwidth and low distortion). It is also possible to make stacked structures of transistors with a combination of floating and biased transistor bodies 56.

In the illustrated embodiment, the plurality of stacked transistors 34 are stacked coupling the terminal 46 for the drain 42 and the terminal 48 for the source 40 in series. As discussed above, the plurality of stacked transistors 34 may be utilized in the attenuation circuit segments of an attenuation circuit to provide the attenuation circuit segments with a variable impedance levels that are adjustable within a continuous impedance range. This may dramatically increase the bandwidth of the attenuator by reducing distortion.

Figure 2A:
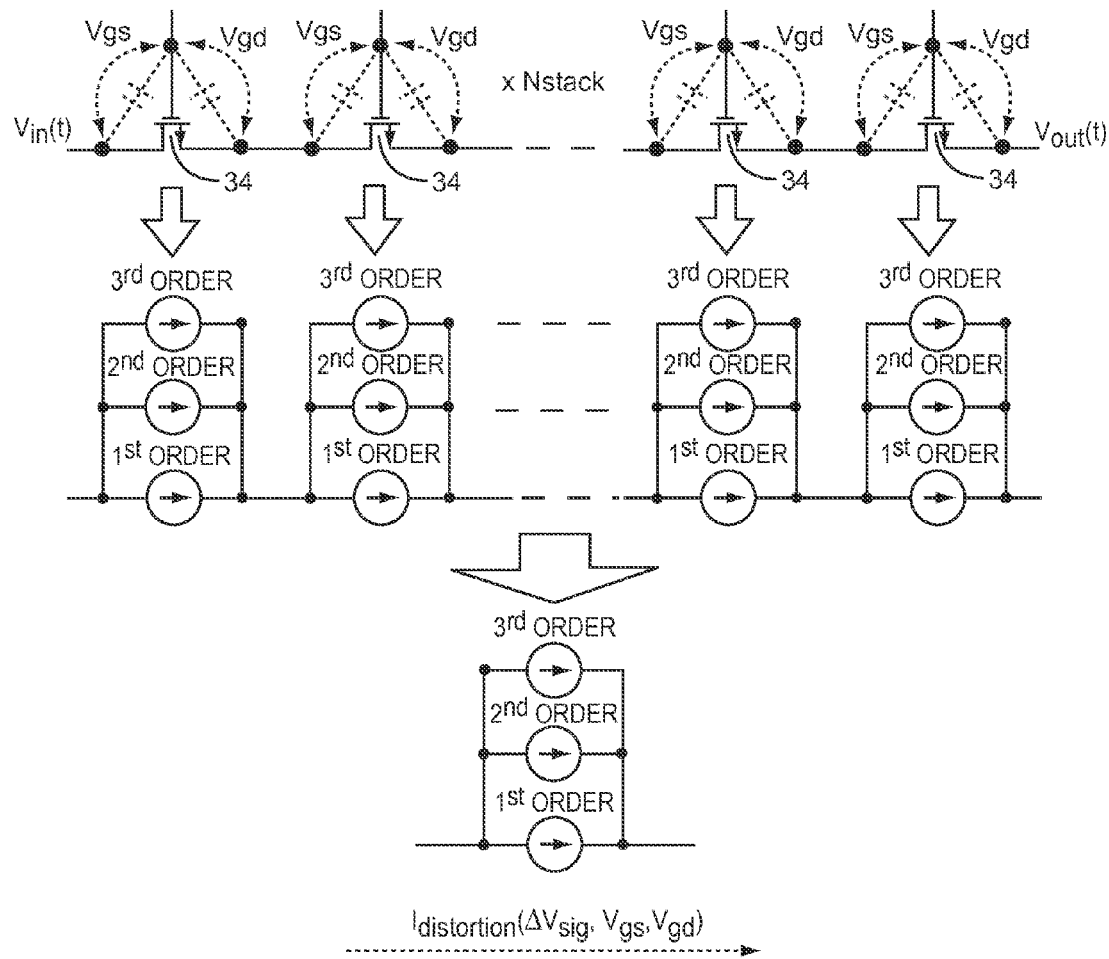
FIG. 2A illustrate a conceptualized illustration of the stack of transistors in FIG. 1.

FIG. 2A illustrates a conceptualized drawing of the plurality of stacked transistors 34. The unexpected performance of the plurality of stacked transistors 34 will be compared to the performance of a single transistor in an attenuator. If a single transistor were utilized in the attenuation circuit segments, the real impedance of the transistor may be expressed as a resistance, $R_{on}$. To get the same real impedance, $R_{on}$, from the plurality of stacked transistors 34, the width of each of the stacked transistors 34 may be increased by a factor of N, where N is the number of stacked transistors 34 in the plurality of stacked transistors 34. An estimation of the distortion current, $i_{distortion}$ (t), for the single transistor can be estimated in terms of a power series as:

$$i_{distortion}(t) = p_1 V_{sig}(t) + p_2 V_{sig}(t)^2 + p_3 V_{sig}(t)^3 \ldots + p_x V_{sig}(t)^x$$

Where $V_{sig}(t)$ is the input signal voltage and $p_x$ are a function of the voltage at the gate terminal and the source and load impedances. The distortion current, $i_{distortion}$ (t), can be rewritten in terms of the voltage drop $\Delta V_{sigN}(t)$ across the entire plurality of stacked transistors if the parasitic capacitances of to the handle wafer 54 are low and the gate resistance high relative to the characteristic impedance level of the plurality of stacked transistors 34. In this embodiment, the plurality of stacked transistors 34 may be considered a two-port network at the frequencies of the input signal, which for the purposes of this example are RF frequencies. By increasing the width of the plurality of stacked transistors 34 such that they provide the same $R_{on}$ as the single transistor, the input signal voltage, the plurality of stacked transistors 34 can provide a similar impedance yet distribute the input voltage signal, $V_{sig}(t)$ across each of the plurality of stacked transistors 34. The distortion current, $i_{distortion}(t)$, may be estimated by harmonics derived from a Taylor series expansion and conceptually illustrated in FIG. 2A.

For one of the plurality of stacked transistors, the Taylor series expansion may be expressed as:

$$i{distortion}(t) = q_1 \Delta V_{sigN}(t) + q_2 \Delta V_{sigN}(t)^2 + q_3 \Delta V_{sigN}(t)^3 \ldots + q_x \Delta V_{sigN}(t)^x$$

$$\Delta V_{sigN}(t) = V_{in}(t) - V_{out}(t)$$

$$V_{in}(t) = a_1 V_{sig}(t) + a_2 V_{sig}(t)^2 + a_3 V_{sig}(t)^3 + \ldots a_x V_{sig}(t)^x$$

$$V_{out}(t) = b_1 V_{sig}(t) + b_2 V_{sig}(t)^2 + b_3 V_{sig}(t)^3 \ldots + b_x V_{sig}(t)^x$$

Where parameters $q_x$, $a_x$, $b_x$ are functions of the voltage at the gate terminals and the source and load impedances derived from a Taylor expansion series. However, it should be noted that this approximation may not be true in for all types of substrates 36, such as a triple well bulk CMOS implementations.

In this embodiment, the distortion is a function of the voltage drop $\Delta V_{sig}(t)$ and not any particular common mode voltage. Since the width of each of the plurality of stacked transistors 34 was scaled so that the plurality of stacked transistors 34 have the same real impedance, Ron, as the single transistor, the plurality of stacked transistors 34 have the same small signal attenuation characteristic as the single transistor and the $\Delta V_{sig}(t)$ but evenly distributed across each of the plurality of stacked transistors 34. The parameters qx are the same for the single transistor as for each individual transistor in the plurality of stacked transistors 34 but the voltage drop across each individual transistor of the plurality of stacked transistors 34 can be expressed as:

$$\Delta V_{sigN}(t) = \Delta V_{sig}(t)/N$$

Applying this formula to the estimation for idistortion (t) of the plurality of stacked transistors 34 we get:

$$i_{distortion}(t) = N*[q_1(\Delta V_{sig}(t)/N) + q_2(\Delta V_{sig}(t)/N)^2 + q_3(\Delta V_{sig}(t)/N)^3 \ldots + q_x(\Delta V_{sig}(t)/N)^x]$$

As can be seen from the above equations, a factor of N distortion may be introduced into the distortion current $i_{distortion}(t)$ by the plurality of stacked transistors 34. However, this is more than compensated for by the $(1/N)^x$ reduction in distortion. From this equation, the intermodulation distortion number, IIM3, of the plurality of stacked transistors 34 can be estimated to be:

$$IIM3 \text{ dB} = 40*\log_{10}[(p1/p3)*(\Delta V_{sig}(t)/N)]$$

The improvement in the third-order intercept point, IIP3, due to stacking can be estimated to be:

$$IIP3_N/IIP3_{single} = 20*\log_{10} N$$

The plurality of stacked transistors 34 thus provides the same real impedance level Ron as the single transistor but distributes the input signal among the plurality of stacked transistors 34 which may provide an estimated $20*\log_{10} N$ improvement in IIP3. For example, if there are twenty-four (24) stacked transistors 34 the improvement in IIP3 is almost twenty-eight (28) dB. However, prior to the discovery of the techniques disclosed in this disclosure, the degradation in bandwidth normally associated with the increased parasitic capacitances of the extra components and their increased size prevented the use of attenuators utilizing a plurality of stacked transistors 34 in attenuation circuit segments. The unexpected result resulting from the techniques described herein is that the effect of these parasitic capacitances can be mitigated by implementing the attenuator on a substrate that has low parasitic capacitances and/or by rendering these parasitic capacitances negligible through the use of resistive circuits, biasing circuits, and other techniques described in this disclosure. Also unexpected are the large number of transistors that may be stacked utilizing the techniques described herein while also maintaining low distortion and high bandwidth characteristics of the attenuator. Designs have been tested that provide stacks of over forty (40) transistors in an attenuation circuit segment. Furthermore, utilizing the plurality of stacked transistors 34 in the attenuation circuit segments is relatively cheap in comparison to pin diode and quadrature hybrid solutions and preserves the bandwidth of the attenuation circuit configuration.

Note that in determining the above equations it was assumed that all of the plurality of stacked transistors 34 were of the same type and width. Also, it was assumed that each of the plurality of stacked transistors 34 would have the same gate to source voltages, $V_{gs}$ and gate to drain voltages, $V_{gd}$ as operating points. This was done to simplify both the equations and the explanation. However, these conditions may but are not necessarily the case and there is no requirement that the plurality of stacked transistors 34 all be either the same type of transistor, have the same width, and/or have the same gate to source voltages as operating points.

Figure 3:
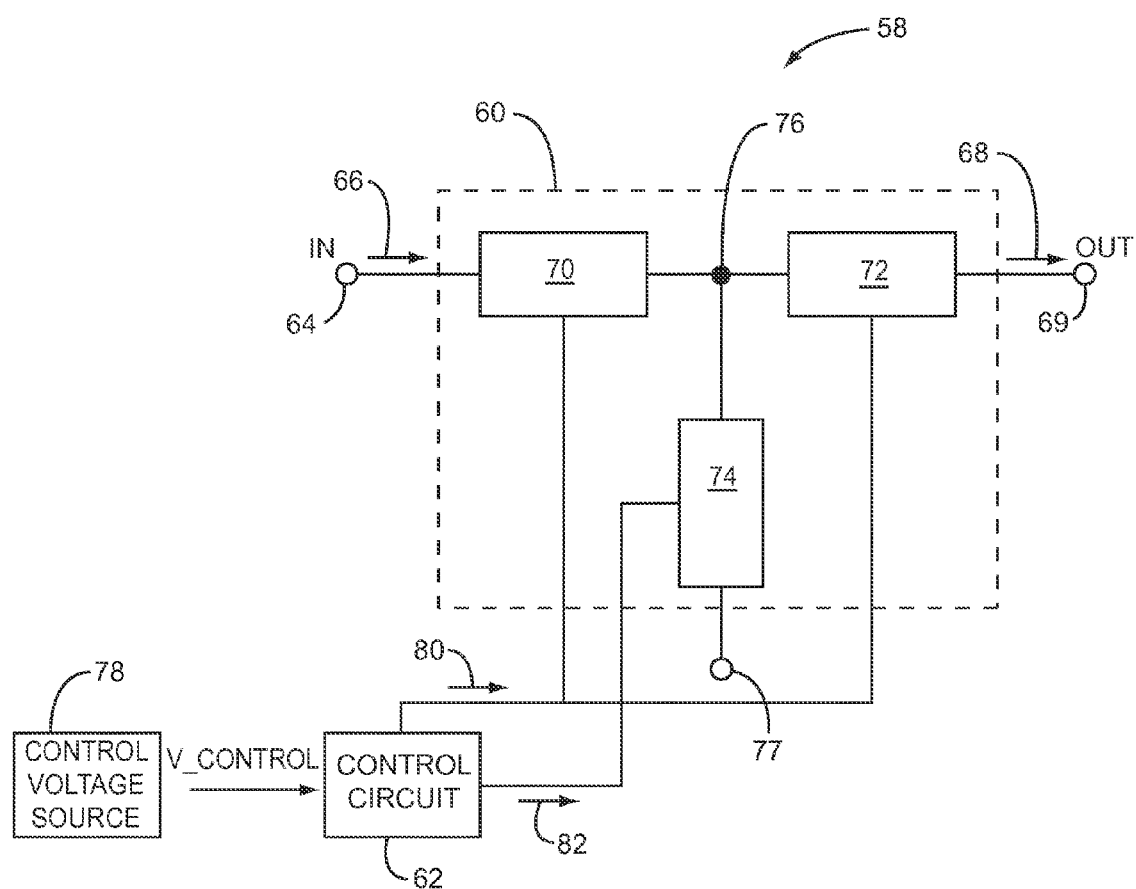
FIG. 3 illustrates one embodiment of a variable attenuator in accordance with the present disclosure that has an attenuation circuit in a classic Tee-type configuration.

FIG. 3 illustrates another embodiment of an attenuator 58 having an attenuation circuit 60 and a control circuit 62. The attenuation circuit 60 has a variable attenuation level having a total continuous attenuation range. The variable attenuation level of the attenuation circuit 60 is controlled by the control circuit 62. The control circuit 62 receives an attenuation control signal 68 which in this example is a control voltage, V_control. The control voltage, V_control, may be a DC voltage which can be varied to have any voltage level within a continuous voltage range. In this embodiment, the voltage range of control voltage, V_control, is anywhere between 0-5V. The control circuit 62 is operably associated with the attenuation circuit 60 to control the variable attenuation level based on the voltage level of the control voltage, V_control. Thus, the variable attenuation level of the attenuation circuit 60 is varied as the voltage level of the control voltage, V_control, is varied through the continuous voltage range. If desirable, the transfer function of the control circuit 62 allows the control circuit 62 to span the entire total continuous attenuation range of the attenuation circuit 60. Thus, the variable attenuation level may be set to any attenuation level within the total continuous attenuation range by the control circuit 62.

In this embodiment, the attenuation circuit 60 has an input terminal 64 for receiving an input signal 66. The attenuation circuit 60 attenuates the input signal 66 in accordance with the variable attenuation level to produce an attenuated output signal 68 that is output from an output terminal 69. To attenuate the input signal 66, the attenuation circuit 60 includes a first series connected attenuation circuit segment 70, a second series connected attenuation circuit segment 72, and a shunt connected attenuation circuit segment 74. The attenuation circuit segments 70, 72, 74 are configured so that the attenuation circuit 60 is arranged in a Tee-type configuration, which in this embodiment is a classic Tee-type configuration. Also, the first series connected attenuation circuit segment 70 is coupled in series between the input terminal 64 and an internal node 76 and the second series connected attenuation circuit segment 72 is coupled in series between the internal node 76 and the output terminal 69. The shunt connected attenuation circuit segment 74 has a shunt connection to the internal node 76 and is connected between the internal node 76 and another terminal 77.

Each of the attenuation circuit segments 70, 72, 74 has a plurality of stacked transistors. The plurality of stacked transistors in each of the attenuation circuit segments 70, 72, 74 may be formed on a common substrate, or the plurality of stacked transistors in each or some of the attenuation circuit segments 70, 72, 74 may be formed on separate substrates. Similarly, if the electronic components of the control circuit 62 require a substrate, the control circuit 62 may be also formed on a common substrate having one or more of the plurality of stacked transistors from the attenuation circuit segments 70, 72, 74, or on a separate substrate.

The plurality of stacked transistors in the first series connected attenuation circuit segment 70 are coupled to provide the first series connected attenuation circuit segment 70 with a first variable impedance level having a first continuous impedance range. Thus, the plurality of stacked transistors in the first series connected attenuation circuit segment 70 may attenuate the input signal 66 and thus provide the first variable impedance level of the first series connected attenuation circuit segment 70. Similarly, the plurality of stacked transistors in the second series connected attenuation circuit segment 72 are coupled to provide the second series connected attenuation circuit segment 72 with a second variable impedance level having a second continuous impedance range. Thus, the plurality of stacked transistors in the second series connected attenuation circuit segment 72 may attenuate the input signal 66. Finally, the plurality of stacked transistors in the shunt connected attenuation circuit segment 74 are coupled to provide the shunt connected attenuation circuit segment 74 with a third variable impedance level having a third continuous impedance range. Thus, the plurality of stacked transistors in the shunt connected attenuation circuit segment 74 may attenuate the input signal 66 in accordance with the third variable impedance level.

The variable attenuation level of the Tee-type configuration in the attenuation circuit 60 is a function of the first variable impedance level, the second variable impedance level, and the third variable impedance level (as well as other parameters such as the input impedance at the input terminal 64 and the output impedance at the output terminal 69), and thus the variable attenuation level may be said to be based on first variable impedance level, the second variable impedance level, and the third variable impedance level. Similarly, the continuous attenuation range of the attenuation circuit 60 may be related to the first continuous impedance range, the second continuous impedance range, and the third continuous impedance range. The control circuit 62 varies the variable attenuation level within the continuous attenuation range in accordance with the voltage level of the control voltage, V_control.

The control circuit 62 adjust the variable attenuation level by being operably associated with the plurality of stacked transistors in each of the attenuation circuit segments 70, 72, 74 and controlling the first variable impedance level, the second variable impedance level, and the third variable impedance level based on the voltage level of the control voltage, V_control, from a control voltage source 78. In the illustrated embodiment, the control circuit 62 is adapted to receive the control voltage, V_control, and generate a series segment control signal 80 and a shunt segment control signal 82 having signal levels that are based on the voltage level of the control voltage, V_control. The shunt segment control signal 82 controls the third variable impedance level by controlling the plurality of stacked transistors in the shunt connected attenuation circuit segment 74.

In this embodiment, the series segment control signal 80 controls the first variable impedance level and the second variable impedance level by controlling the plurality of stacked transistors in both of the first and second series connected attenuation circuit segments 70, 72. This may be advantageous if the first and second series connected attenuation circuit segments 70, 72 are the same and the first and second variable impedance levels are to have the same value. Also, if the first and second series connected attenuation circuit segments 70, 72 are different or if the first and second variable impedance levels are to be set to different values, electronic components may be provided within the first series connected attenuation circuit segment 70 and the second series connected attenuation circuit segment 72 so that each of the first and second series connected attenuation circuit segments 70, 72 may be operated by the same series segment control signal 80. As shall be discussed in further detail below, in other embodiments, the control circuit 62 may generate a series segment control signal 80 for each of the first and second series connected attenuation circuit segments 70, 72. The signal level of the shunt segment control signal 82 controls the third variable impedance level of the shunt connected attenuation circuit segment 74.

A transfer function of the control circuit 62 generates the series segment control signal 80 and shunt segment control signal 82 to control the first variable impedance level, the second variable impedance level, and the third variable impedance level to set them at a desired impedance level. Since the variable attenuation level is a function, this may set the variable attenuation level of the attenuation circuit 60 to a desired attenuation level. For example, if the control circuit 62 utilizes ad-hoc linear circuits, the control circuit 62 may include differential paths having the right amount of gain and switching times so that the first variable impedance level, the second variable impedance level, and the third variable impedance level have a desired relationship with the voltage level of the control voltage, V_control. In this manner, the setting the voltage level of the control voltage sets the variable attenuation level to a desired value within the total continuous control range of the attenuation circuit 60. Other techniques for designing the desired control circuit 62 may be utilized as well. The design and transfer function of the control circuit 62 may be determined through, for example, circuit calculations, circuit simulations, and/or empirical circuit design techniques.

The attenuator 58 in FIG. 3 and the other embodiments of attenuators described throughout this disclosure may be utilized in many different types of circuits. For example, the attenuator 58 may be utilized in the front end of a radio frequency (RF) transceiver (not shown) in which the input terminal 64 is coupled to an antenna (not shown) and the output terminal 69 is coupled to signal processing circuitry (not shown) of the RF transceiver. The terminal 77 may be connected to an external node such as, for example, a ground node. One of the advantages of attenuation circuit 60 being arranged in the Tee-type configuration is that the attenuation circuit 60 may be utilized to substantially match the impedance at both the input terminal 64 and the output terminal 69. The transfer function of the control circuit 62 may be configured to do this. Also, the attenuation circuit 60 may actually operate to adjust the input impedance and the output impedance at terminals 64, 69, so as to force matching.

When the RF transceiver is operating as a RF receiver, the input signal 66, which in this case is an RF signal received from the antenna, may be provided at the input terminal 64 for attenuation. The input signal 66 would be attenuated to generate the attenuated output signal 68 which would be received by the signal processing circuitry at the output terminal 69. On the other hand, when the RF transceiver is operating as a transmitter, the input signal 66 would be received from the output terminal 69. The attenuation circuit 60 generates the attenuated output signal 68 which is output from the input terminal 64 to the antenna. The control circuit 62 may control the first, second, and third impedance levels so that the impedance of the attenuation circuit 60, substantially matches the impedance at the input terminal 64 and the output terminal 69.

Figure 4:
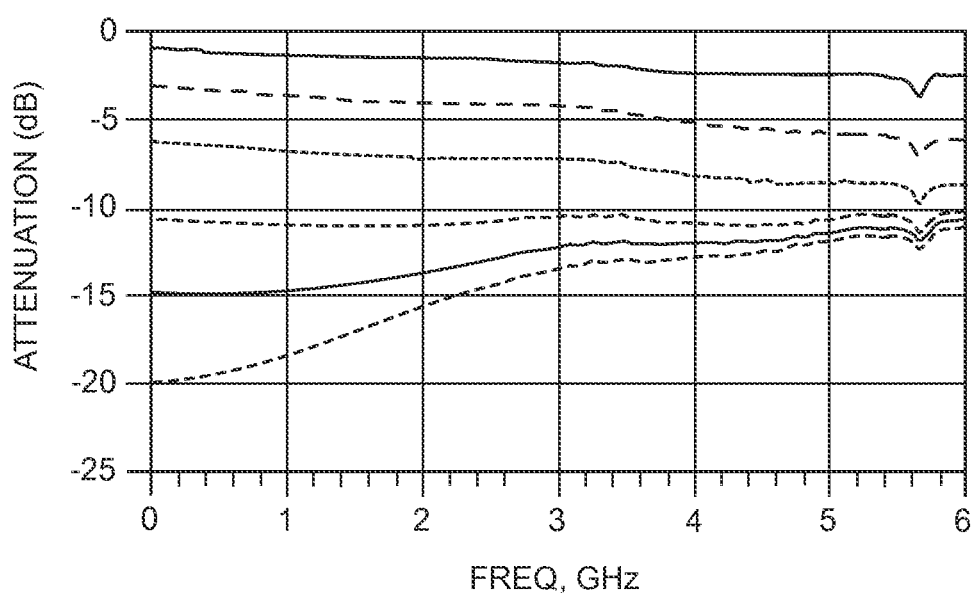
FIG. 4 is a graph illustrating a total attenuation level versus frequency of one embodiment of an attenuation illustrated in FIG. 3, at different control voltage levels.

Next, FIG. 4 is a graph demonstrating the performance of one embodiment of the attenuator 58 having the Tee-type attenuation circuit 60 described in FIG. 3. In this case, the attenuation circuit segments 70, 72, 74 each are provided with a stack of fourteen (14) metal-oxide-semiconductor field-effect transistors (MOSFETs) that formed on a silicon-on-insulator type substrate. The graph in FIG. 4 illustrates the variable attenuation level of the attenuation circuit 60 as a function of the frequency response. As illustrated, the variable attenuation level remains very consistent even as the frequency varies from 0-6 GHz. The continuous attenuation range of the variable attenuation level appears to have a somewhere around 0.9 dB and has a maximum value around 15-20 dB, depending on the frequency. The minimum value of the total continuous attenuation range may be set by the first and second series connected attenuation circuit segments 70, 72 while the maximum value of the variable attenuation level may be set by the shunt connected attenuation circuit segment 74. There is some degradation in the variable attenuation level particularly at higher frequencies and when the variable attenuation level is set near its minimum and maximum values. For example, the variable attenuation level appears to have a capacitive slope near its minimum values. This indicates the presence of some parasitic capacitance. On the other hand, variable attenuation level indicates some parasitic inductance by the inductive slope near its maximum values. In all however, the attenuator 58 preserves a large bandwidth. Furthermore, the degradation in the variable attenuation level may be reduced or eliminated through circuit design.

Figure 5:
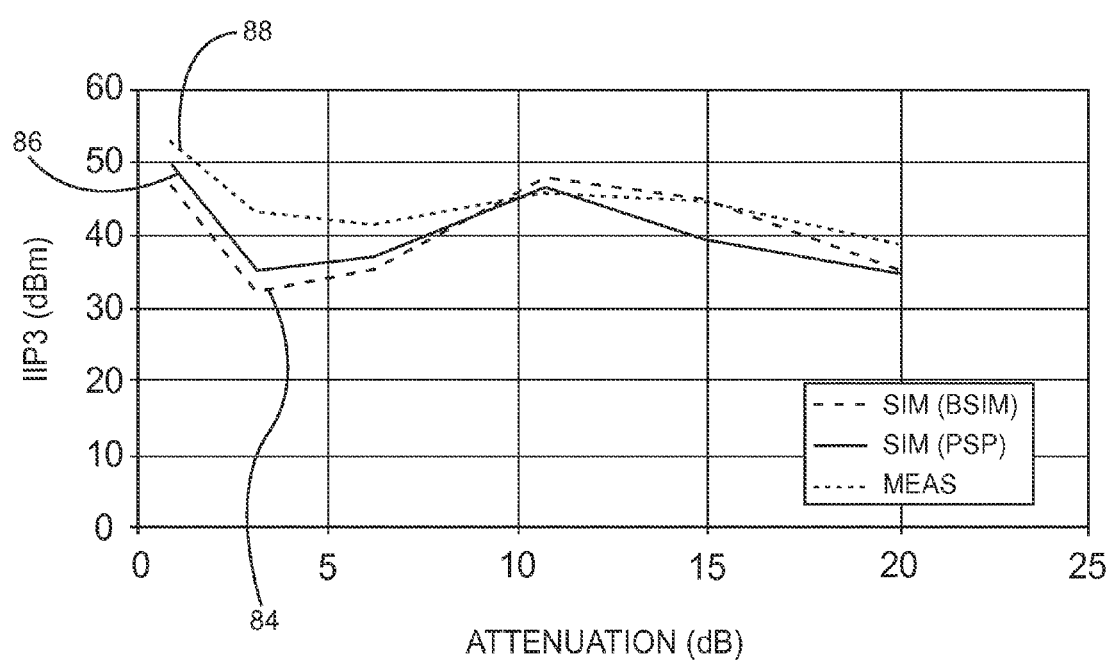
FIG. 5 is a graph illustrating the third order intercept point, IIP3, versus the total attenuation level of one embodiment of an attenuation circuit illustrated in FIG. 3.

FIG. 5 is a graph demonstrating the IIP3 of the same embodiment of the attenuator 58, as the variable attenuation level is varied across the span of the continuous attenuation range. The first line 84 is the IIP3 of the attenuator 58 as modeled by the Berkeley Short-channel IGFET model. The second line 86 is the IIP3 as simulated with the Penn State Phillips model. The third line 88 is the measured IIP3. As demonstrated by FIG. 5, the IIP3 of the attenuator 58 is relatively high indicating that the attenuator 58 is highly linear throughout the total continuous attenuation range.

Figure 6:
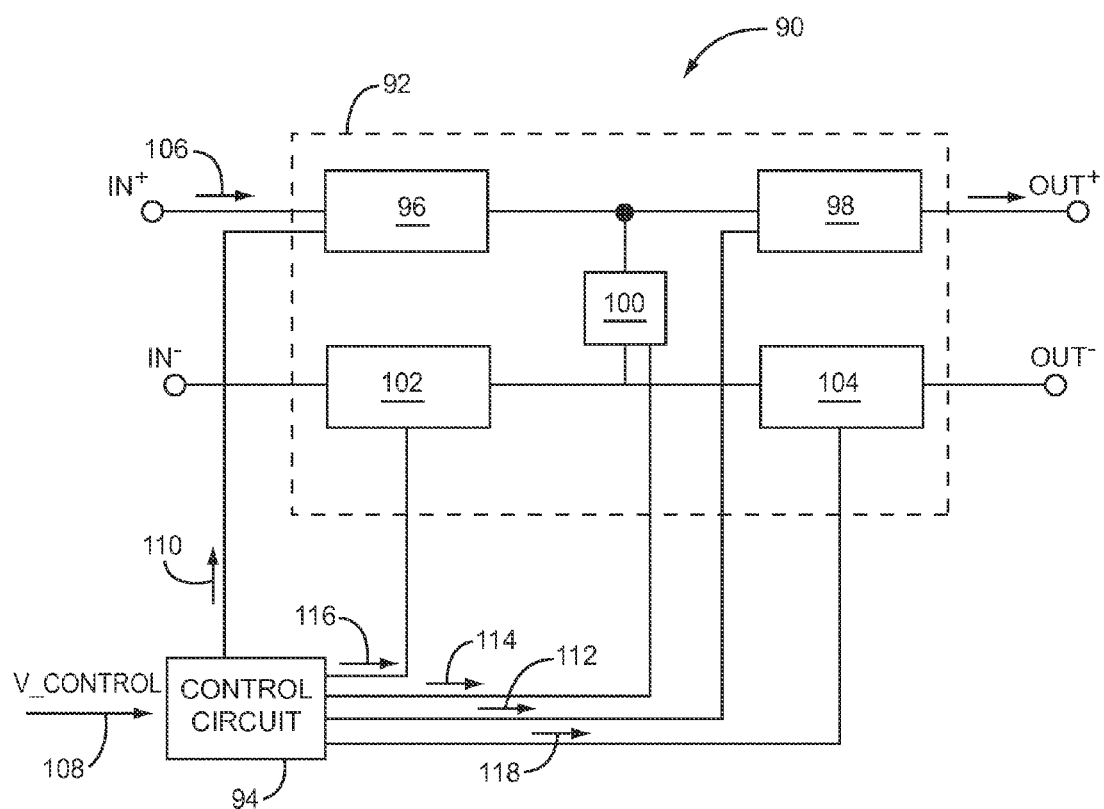
FIG. 6 illustrates one embodiment of a variable attenuator that has an attenuation circuit in a balanced Tee-type configuration.

Referring now to FIG. 6, another embodiment of an attenuator 90 is shown having an attenuation circuit 92 and a control circuit 94. As in the embodiment above described in FIG. 3, the attenuation circuit 92 shown in FIG. 6 also includes a first series connected attenuation circuit segment 96, a second series connected attenuation circuit segment 98, and a shunt connected attenuation circuit segment 100 and thus is in a Tee-type configuration. However, in this attenuation circuit 92, the Tee-type configuration also includes a first balancing attenuation circuit segment 102 and a second balancing attenuation circuit segment 104. Thus, this Tee-type configuration is sometimes referred to as a balanced Tee-type configuration or an H-type configuration. In this embodiment each of the attenuation circuit segments 96, 98, 100, 102, 104 include a plurality of stacked transistors.

In this embodiment, each of the attenuation circuit segments 96, 98, 100, 102, 104 have a plurality of stacked transistors. It should be noted however that in alternative embodiments, the balancing attenuation circuit segments 102, 104 may not each include a plurality of stacked transistors but for example may have passive components. The plurality of stacked transistors in the first series connected attenuation circuit segment 96 are coupled to provide the first series connected attenuation circuit segment 96 with a first variable impedance level having a first continuous impedance range. Thus, the plurality of stacked transistors in the first series connected attenuation circuit segment 96 may attenuate an input signal 106 in accordance with the first variable impedance level. Similarly, the plurality of stacked transistors in the second series connected attenuation circuit segment 98 are coupled to provide the second series connected attenuation circuit segment 98 with a second variable impedance level that can be adjusted within a second continuous impedance range. Thus, the plurality of stacked transistors in the second series connected attenuation circuit segment 98 may attenuate the input signal 106 in accordance with the second variable impedance level.

Next, the plurality of stacked transistors in the shunt connected attenuation circuit segment 100 are coupled to provide the shunt connected attenuation circuit segment 100 with a third variable impedance level having a third continuous impedance range. Thus, the plurality of stacked transistors in the shunt connected attenuation circuit segment 100 may attenuate the input signal 106 in accordance with the third variable impedance level. Also, the plurality of stacked transistors in the first balancing attenuation circuit segment 102 are coupled to provide the first balancing attenuation circuit segment 102 with a fourth variable impedance level having a fourth continuous impedance range. Thus, the plurality of stacked transistors in the first balancing attenuation circuit segment 102 may attenuate the input signal 106 in accordance with the fourth variable impedance level. Finally, the plurality of stacked transistors in the second balancing attenuation circuit segment 104 are coupled to provide the second balancing attenuation circuit segment 104 with a fifth variable impedance level having a fifth continuous impedance range. Thus, the plurality of stacked transistors in the second balancing attenuation circuit segment 104 may attenuate the input signal 106 in accordance with the fifth variable impedance level.

A variable attenuation level of the attenuation circuit 92 is a function of the first, second, third, fourth and fifth variable impedance levels (as well as other parameters such as the impedances between IN+, IN− and OUT+ and OUT−) and is adjustable within a continuous attenuation range. Accordingly, the variable attenuation level may be said to be based on the first, second, third, fourth and fifth variable impedance levels.

The control circuit 94 receives an attenuation control signal 108, in this case a control voltage, V_control, and controls the attenuation circuit segments 96, 98, 100, 102, 104 based on the voltage level of the control voltage, V_control. In this embodiment, the control circuit 94 generates a first and a second series segment control signals 110, 112 to control the plurality of stacked transistors in each of first and second series connected attenuation circuit segments 96, 98. A shunt segment control signal 114 is generated to control the plurality of stacked transistors in the shunt connected attenuation circuit segment 100. First and second balancing segment control signals 116, 118 are generated to control the plurality of stacked transistors in each of the balancing attenuation circuit segments 102, 104. The segment control signals 110, 112, 114, 116, 118 all have a signal level based on the voltage level of the control voltage, V_control and adjust the first, second, third, fourth and fifth variable impedance levels. The transfer function of the control circuit 94 assures that the signals levels of each of the segment control signals 110, 112, 114, 116, 118 is at the appropriate signal level so that the variable attenuation level of the attenuation circuit 92 is at the desired attenuation level within the continuous attenuation range.

Figure 7:
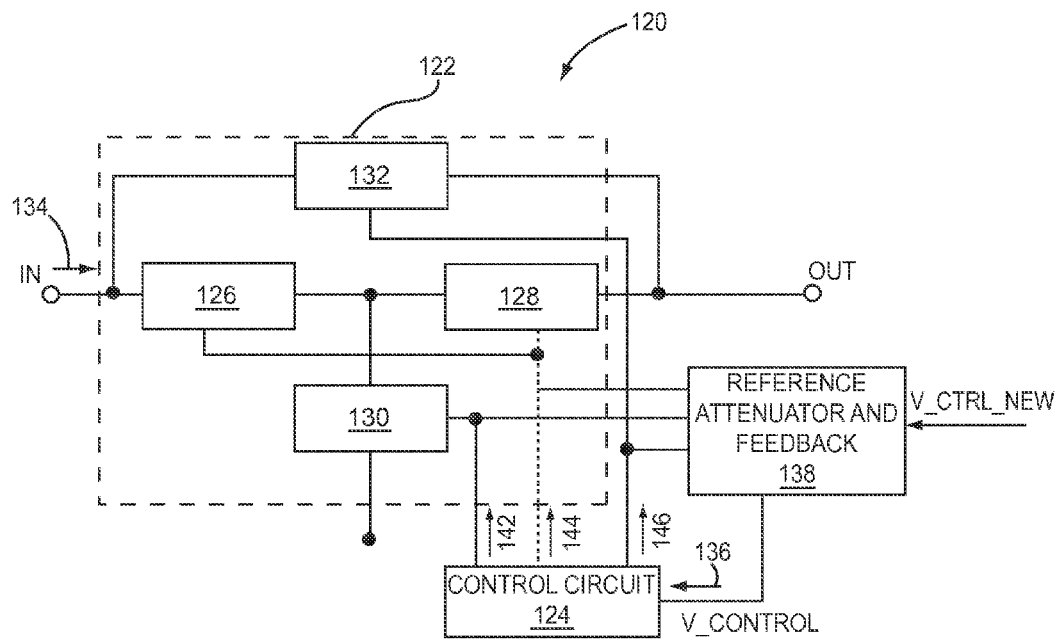
FIG. 7 illustrates one embodiment of a variable attenuator having an attenuation circuit in a bridged Tee-type configuration.

FIG. 7 illustrates yet another embodiment of an attenuator 120 having an attenuation circuit 122 and a control circuit 124. As in the embodiment above described in FIG. 6, the attenuation circuit 122 shown in FIG. 7 also includes a first series connected attenuation circuit segment 126, a second series connected attenuation circuit segment 128, and a shunt connected attenuation circuit segment 130. The attenuation circuit segments 126, 128, 130 are configured so that the attenuation circuit 122 is also arranged in a Tee-type configuration. However, in this attenuation circuit 122, the Tee-type configuration also includes a bridge connected attenuation circuit segment 132. Thus, attenuation circuit 122 may be referred to as being in a bridged Tee-type configuration.

In this embodiment, each of the attenuation circuit segments 126, 128, 130, 132 include a plurality of stacked transistors. Note however that in alternative embodiments, the bridge connected attenuation circuit segment 132 may not have a plurality of stacked transistors but for example may have passive components. The plurality of stacked transistors in the first series connected attenuation circuit segment 126 are coupled to provide the first series connected attenuation circuit segment 126 with a first variable impedance level having a first continuous impedance range. Thus, the plurality of stacked transistors in the first series connected attenuation circuit segment 126 may attenuate an input signal 134 in accordance with the first variable impedance level. Similarly, the plurality of stacked transistors in the second series connected attenuation circuit segment 128 are coupled to provide the second series connected attenuation circuit segment 128 with a second variable impedance level having a second continuous impedance range. Thus, the plurality of stacked transistors in the second series connected attenuation circuit segment 128 may attenuate the input signal 134 in accordance with the second variable impedance level.

Next, the plurality of stacked transistors in the shunt connected attenuation circuit segment 130 are coupled to provide the shunt connected attenuation circuit segment 130 with a third variable impedance level having a third continuous impedance range. Thus, the plurality of stacked transistors in the shunt connected attenuation circuit segment 130 may attenuate the input signal 134 in accordance with the third variable impedance level. Finally, the plurality of stacked transistors in the bridge connected attenuation circuit segment 132 are coupled to provide the bridge connected attenuation circuit segment 132 with a fourth variable impedance level having a fourth continuous impedance range. Thus, the plurality of stacked transistors in the bridge connected attenuation circuit segment 132 may attenuate the input signal 134 in accordance with the fourth variable impedance level.

In this embodiment, closed loop techniques are utilized to generate an attenuation control signal 136 which in this case is a control voltage, V_control. A reference attenuator 138 receives a control voltage, V_control_new to generate the control voltage, V_control. The control circuit 124 receives the control voltage, V_control and controls the attenuation circuit segments 126, 128, 130, 132 based on the voltage level of the control voltage, V_control. In this embodiment, the control circuit 124 generates a series segment control signal 142 to control the plurality of stacked transistors in each of first and second series connected attenuation circuit segments 126, 128. A shunt segment control signal 144 is generated to control the plurality of stacked transistors in the shunt connected attenuation circuit segment 130. A bridging segment control signal 146 may be generated to control the plurality of stacked transistors in the bridge connected attenuation circuit segment 132 and thus adjust the first, second, third, and fourth variable impedance levels. The segment control signals 142, 144, 146 all have a signal level based on the voltage level of the control voltage, V_control.

Figure 7A:
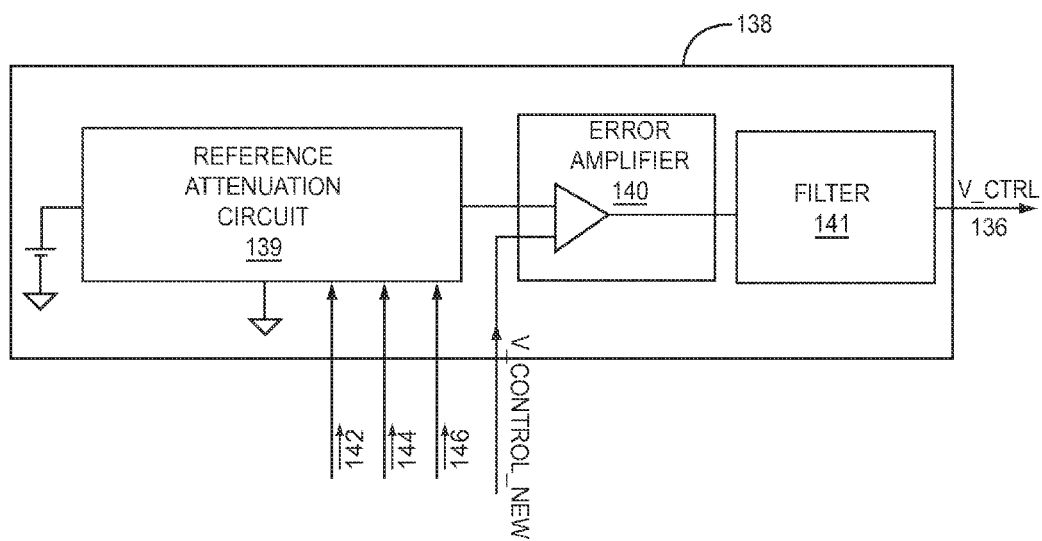
FIG. 7A illustrates a conceptualized illustration of the embodiment of a reference attenuator and feedback.

Referring now to FIG. 7A, a more detailed illustration of one embodiment of the reference attenuator and feedback 138 is shown. The reference attenuator and feedback includes a reference attenuation circuit 139 that may be a scaled down version of the attenuation circuit 122. The reference attenuation circuit 139 has a DC voltage applied to the input and receives a feedback of the segment control signals 142, 144, 146. The output of the reference attenuation circuit 139 is applied to an error amplifier 140. The error amplifier takes the difference between the output of the reference attenuation circuit 139 and the control voltage, V_control_new and amplifies it. It may then be filtered by a dominant pole filter for loop stability and generate the control voltage, V_control.

Figure 8:
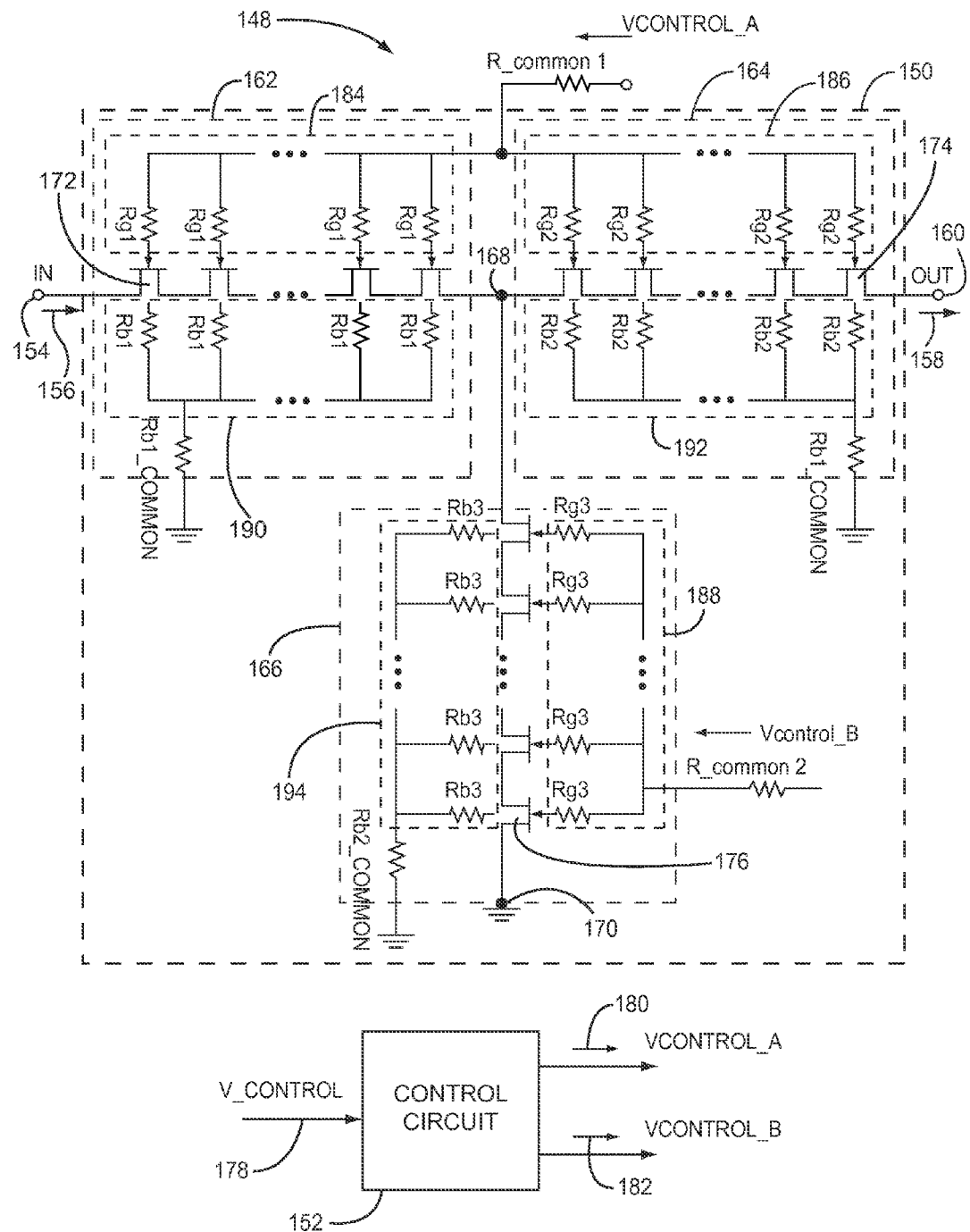
FIG. 8 is a circuit diagram of one embodiment of a variable attenuator having an attenuation circuit in a Tee-type configuration.

Referring now to FIG. 8, a circuit diagram of one embodiment of an attenuator 148 having an attenuation circuit 150 in a Tee-type configuration and a control circuit 152 is shown. All of the components in the attenuator 148 may be formed on a common substrate provided by a Monolific Microwave Integrated Chip (MMIC) or some or all of the components may be provided on separate substrates in the same MMIC or different MMICs. The attenuation circuit 150 has an input terminal 154 for receiving an input signal 156. The attenuation circuit 150 attenuates the input signal 156 in accordance with the variable attenuation level set by the control circuit 152. This generates an attenuated output signal 158 that is output from an output terminal 160. To attenuate the input signal 156, the attenuation circuit 150 includes a first series connected attenuation circuit segment 162, a second series connected attenuation circuit segment 164, and a shunt connected attenuation circuit segment 166. In this embodiment, the first series connected attenuation circuit segment 162 is coupled in series between the input terminal 154 and an internal node 168 and the second series connected attenuation circuit segment 164 is coupled in series between the internal node 168 and the output terminal 160. The shunt connected attenuation circuit segment 166 has a shunt connection to the internal node 168 and is connected between the internal node 168 and a ground node 170.

The attenuation circuit segments 162, 164, 166 each have a plurality of stacked transistors 172, 174, 176. The number and type of transistors in each of the plurality of stacked transistors 172, 174, 176 may be the same or vary depending on the desired attenuation characteristics of the attenuation circuit 150. In this embodiment, each of the transistors in the plurality of stacked transistors 172, 174, 176 is a FET and the transistors are stacked by coupling the source and drain terminals of each transistor in series. The first plurality of stacked transistors 172 are coupled in the first series connected attenuation circuit segment 162 to provide the first series connected attenuation circuit segment 162 with a first variable impedance level having a first continuous impedance range. In this embodiment, the first plurality of stacked transistors 172 provide substantially all of the attenuation for the first series connected attenuation circuit segment 162. Thus, the first variable impedance level of the first continuous impedance range is essentially equal to the variable impedance level having a continuous impedance range of the first plurality of stacked transistors 172. Similarly, the second plurality of stacked transistors 174 are coupled to provide the second series connected attenuation circuit segment 164 with a second variable impedance level having a second continuous impedance range and the third plurality of stacked transistors 176 are coupled to provide the shunt connected attenuation circuit segment 166 with a third variable impedance level having a third continuous impedance range. As with the first series connected attenuation circuit segment 162, the second and third plurality of stacked transistors 174, 176 provide substantially all of the attenuation in the second series connected attenuation circuit segment 164 and in the shunt connected attenuation circuit segment 166.

The control circuit 152 may be operably associated with the plurality of stacked transistors 172, 174, 176 in each of the attenuation circuit segments 162, 164, 166 to control the first variable impedance level, the second variable impedance level, and the third variable impedance level based on a signal level of an attenuation control signal 178 and thereby adjust the variable attenuation level to a desired attenuation level within the continuous attenuation range. In this case, the attenuation control signal 178 may be the control voltage, V_control, having a continuous voltage range of 0-5V. The control circuit 152 may be adapted to receive the control voltage, V_control, and generate a series segment control signal 180 and a shunt segment control signal 182 having signal levels that are based on the voltage level of the control voltage, V_control.

The gate terminals of the plurality of stacked transistors 172, 174, 176 may be coupled to the control circuit 152 to receive the series segment control signal 180 and the shunt segment control signal 182. In this embodiment, the series segment control signal 180 is a control voltage, Vcontrol_A, that is generated by the control circuit 152 based on the control voltage, V_control, received by the control circuit 152 to control the operation of the first and second plurality of stacked transistors in the first and second series connected attenuation circuit segments 162, 164. Similarly, the shunt segment control signal 182 is a control voltage, Vcontrol_B, that is generated by the control circuit 152 based on the control voltage, V_control, to control the third plurality of stacked transistors 176 in the shunt segment attenuation circuit segment. Consequently, the voltage levels of the control voltages, Vcontrol_A, Vcontrol_B, are set in accordance to the transfer function of the control circuit 152 which provide the appropriate bias to the gate terminals of the plurality of stacked transistors 172, 174, 176 and set the first variable impedance level, the second variable impedance level, and the third variable impedance level. In this manner, the control circuit 152 is operably associated with each of the plurality of stacked transistors 172, 174, 176 to control the first variable impedance level, the second variable impedance level, and the third variable impedance level based on the voltage level of the control voltage, V_control. In this manner, the variable attenuation level of the attenuation circuit 150 is set at the desired attenuation level based on the voltage level of the control voltage, V_control.

To reduce parasitic capacitances and preserve high bandwidth, each of the first, second, and third attenuation circuit segments 162, 164, 166 include a first, second, and third resistive circuit 184, 186, 188, respectively. The resistive circuits 184, 186, 188 may each be coupled between the first, second, and third plurality of stacked transistors 172, 174, 176 and the control circuit 152. The resistance of the first resistive circuit 184 may be selected to be high relative to the first continuous impedance range provided by the first series connected attenuation circuit segment 162. If the resistance of the resistive circuit 162 is high enough, the parasitic capacitances between the source terminals and gate terminals, and the drain terminals and gate terminals become negligible within the first continuous impedance range since these parasitic capacitances are coupled to the high resistances of the resistive circuit 184.

Generally, the resistive circuit 184 may provide a resistance at the gate terminals in the first plurality of stacked transistors 172 that is at least around 10 times greater than the inverse of the highest value of the drain to source conductance of the first plurality of stacked transistors 172. The control voltage, Vcontrol_A, may appear effectively as an open circuit voltage at the gate terminals of the first plurality of stacked transistors 172 so that the gate terminals of the first plurality of stacked transistors 172 do not load the first series connected attenuation circuit segment 162. However, the resistance at the gate terminals may vary depending on the materials and layers utilized in the first plurality of stacked transistors 172 and the desired bandwidth of the first series connected attenuation circuit segment 162. In the same manner, the resistance of the second and third resistive circuits 186, 188 may be selected to be high relative to the second and third continuous impedance range, respectively.

In the illustrated embodiment, each of the resistive circuits 184, 186, 188 has resistors, Rg1, Rg2, Rg3, respectively. Each of the resistors, Rg1, Rg2, Rg3, may be coupled in series with the gate terminal of one of the plurality of stacked transistors 172, 174, 176 and another one of the plurality of stacked transistors 172, 174, 176. While the resistance of each of the resistors Rg1 in the first series connected attenuation circuit segment 162 may be the same, this is not required. For example, each of the resistors, Rg1 may have different resistances so long as the resistance of the resistance circuit 184 presented at the gate terminals of the first plurality of stacked transistors 172 is high with respect to the first continuous impedance range. Similarly the resistance of each of the resistors Rg2, Rg3, may be the same but this however is not required. A common resistor R_common1, R_common2 may be utilized to provide part of or all of the a high resistance between the gate terminals in each of the first, second, and third plurality of stacked transistors 172, 174, 176 and the control circuit 152.

Next, the attenuation circuit segments 162, 164, 166 may also each include a biasing circuit 190, 192, 194 coupled between the bodies of each of the first, second, and third plurality of stacked transistors 172, 174, 176, respectively, and a ground node. The biasing circuits 190, 192, 194 help assure the voltage levels of the control voltages, Vcontrol_A, Vcontrol_B, are better defined within the first, second, and third plurality of stacked transistors 172, 174, 176. Furthermore, the biasing circuits 190, 192, 194 each may include resistors, Rb1, Rb2, Rb3, respectively, to provide a body bias to the first, second, and third plurality of stacked transistors 172, 174, 176. In this embodiment, the resistors, Rb1 are each coupled in series with the body of one of the first plurality of stacked transistors 172. Similarly, the resistors Rb2, Rb3 are each coupled in series with the body of the second and third plurality of stacked transistors 174, 176, respectively. The resistance of resistors Rb1, Rb2, Rb3 may be high so that the resistors Rb1, Rb2, Rb3 do not load the attenuation circuit segments 162, 164, 166. Also, if the first, second, or third plurality of stacked transistors 172, 174, 176 have unacceptably high parasitic capacitances between the source terminals and body, or drain terminals and body, the resistance of resistors Rb1, Rb2, Rb3 may be high enough to render these parasitic capacitances negligible.

Figure 9:
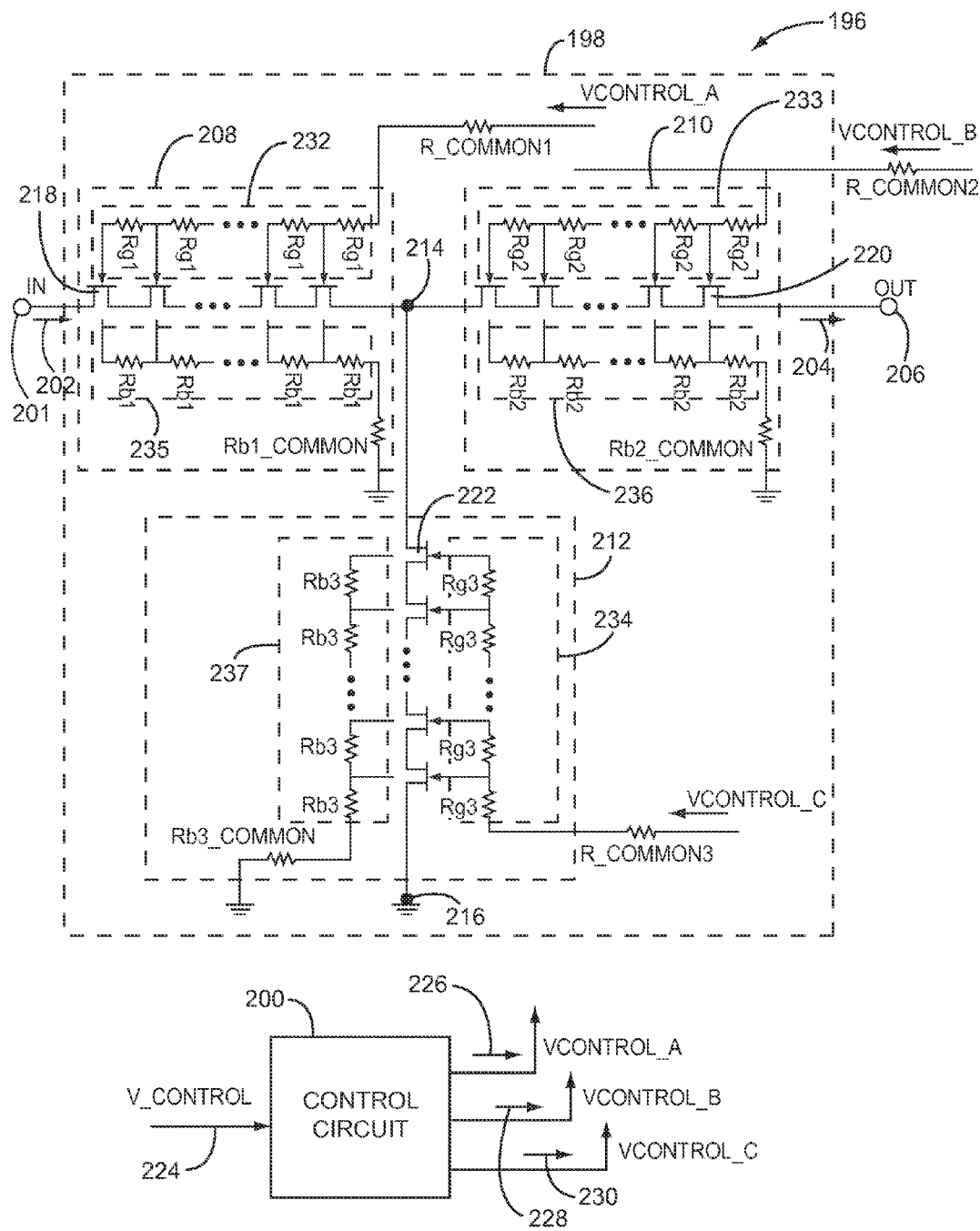
FIG. 9 is a circuit diagram of another embodiment of a variable attenuator having an attenuation circuit in a Tee-type configuration.

Referring now to FIG. 9, a circuit diagram of another embodiment of an attenuator 196 having an attenuation circuit 198 in a Tee-type configuration and a control circuit 200 is shown. The attenuation circuit 196 has an input terminal 201 for receiving an input signal 202. The attenuation circuit 196 attenuates the input signal 202 in accordance with the variable attenuation level set by the control circuit 200. This generates an attenuated output signal 204 that is output from an output terminal 206. To attenuate the input signal 202, the attenuation circuit 196 includes a first series connected attenuation circuit segment 208, a second series connected attenuation circuit segment 210, and a shunt connected attenuation circuit segment 212. As in the previous embodiment, the first series connected attenuation circuit segment 208 is coupled in series between the input terminal 201 and an internal node 214 and the second series connected attenuation circuit segment 210 is coupled in series between the internal node 214 and the output terminal 206. The shunt connected attenuation circuit segment 212 has a shunt connection to the internal node 214 and is connected between the internal node 214 and a ground node 216.

The attenuation circuit segments 208, 210, 212 each have a plurality of stacked transistors 218, 220, 222, which in this example are body connected stacked NFET devices. The number and type of transistors in each of the plurality of stacked transistors 218, 220, 222 may be the same or vary depending on the desired attenuation and linearity characteristics of the attenuation circuit 198. In this embodiment, each of the transistors in the plurality of stacked transistors 218, 220, 222 is a FET and the transistors are stacked by coupling the source and drain terminals of each transistor in series. The first plurality of stacked transistors 218 are coupled in the first series connected attenuation circuit segment 208 to provide the first series connected attenuation circuit segment 208 with a first variable impedance level having a first continuous impedance range. In this embodiment, the first plurality of stacked transistors 218 provide substantially all of the attenuation for the first series connected attenuation circuit segment 208. Thus, the first variable impedance level of the first continuous impedance range is essentially equal to the variable impedance level having a continuous impedance range of the first plurality of stacked transistors 218. Similarly, the second plurality of stacked transistors 220 are coupled to provide the second series connected attenuation circuit segment 210 with a second variable impedance level having a second continuous impedance range and the third plurality of stacked transistors 222 are coupled to provide the shunt connected attenuation circuit segment 212 with a third variable impedance level having a third continuous impedance range. As with the first series connected attenuation circuit segment 208, the second and third plurality of stacked transistors 220, 222 provide substantially all of the attenuation in the second series connected attenuation circuit segment 210 and in the shunt connected attenuation circuit segment 212.

The control circuit 200 may be operably associated with the plurality of stacked transistors 218, 220, 222 in each of the attenuation circuit segments 208, 210, 212 to control the first variable impedance level, the second variable impedance level, and the third variable impedance level based on a signal level of an attenuation control signal 224 and thereby set the variable attenuation level. In this case, the attenuation control signal 224 may be the control voltage, V_control, having a continuous voltage range of 0-5V. The control circuit 200 may be adapted to receive the control voltage, V_control, and generate a first series segment control signal 226, a second series segment control signal 228, and a shunt segment control signal 230 having signal levels that are based on the voltage level of the control voltage, V_control.

The gate terminals of the plurality of stacked transistors 218, 220, 222 may be coupled to the control circuit 200 to receive the first series segment control signal 226, the second series segment control signal 228, and the shunt segment control signal 230. In this embodiment, the first series segment control signal 226 is a control voltage, Vcontrol_A that is generated by the control circuit 200 based on the control voltage, V_control received by the control circuit 200 to control the operation of the first plurality of stacked transistors 218. The second series segment control signal 228 is a control voltage, Vcontrol_B, that is generated by the control circuit 200 based on the control voltage, V_control received by the control circuit 200 to control the operation of the first plurality of stacked transistors 218. The control voltages, Vcontrol_A and Vcontrol_B, may be different in accordance with the characteristics of the first and second plurality of stacked transistors 218, 220 in the first and second series connected attenuation circuit segments 208, 210. Similarly, the shunt segment control signal 230 is a control voltage, Vcontrol_C that is generated by the control circuit 200 based on the control voltage, V_control to control the third plurality of stacked transistors 222 in the shunt segment attenuation circuit segment. Consequently, the voltage levels of the control voltages, Vcontrol_A, Vcontrol_B, Vcontrol_C are set in accordance to the transfer function of the control circuit 200 which provide the appropriate voltage to the gate terminals of the plurality of stacked transistors 218, 220, 222 and set the first variable impedance level, the second variable impedance level, and the third variable impedance level. In this manner, the control circuit 200 is operably associated with each of the plurality of stacked transistors 218, 220, 222 to set the variable attenuation level of the attenuation circuit 198 at the desired attenuation level based on the voltage level of the control voltage, V_control.

To neutralize parasitic capacitances and preserve high bandwidth, each of the attenuation circuit segments 208, 210, 212 include a first, second, and third resistive circuit 232, 233, 234, respectively. In this embodiment, each of the resistive circuits 232, 233, 234, have resistors, Rg1, Rg2, Rg3. Each of the resistors, Rg1 in the first series connected attenuation circuit segment are coupled between the gate terminals of one of the first plurality of stacked transistors 218 and another one of the first plurality of stacked transistors 218. Similarly, each of the resistors Rg2, Rg3 is coupled between one of the second and third plurality of stacked transistors 220, 222, respectively, and another one of the second and third plurality of stacked transistors 220, 222, respectively. The resistance of resistors, Rg1, may be selected to be high relative to the first continuous impedance range provided by the first series connected attenuation circuit segment 208. If the resistance of the resistive circuit 232 is high enough, the parasitic capacitances between the source terminals and gate terminals, and the drain terminals and gate terminals become negligible within the first continuous impedance range since these parasitic capacitances are coupled to the high resistances of the resistors, Rg1.

Generally, the resistance, Rg1, should be high relative to the impedance of the Cgs and Cgd parasitic capacitors at the frequency of interest and may be at least around 10 times greater than the inverse of the highest value of the drain to source conductance of one of the first plurality of stacked transistors 218. The control voltage, Vcontrol_A, may appear effectively as a high impedance (open circuit) at the gate terminals of the first plurality of stacked transistors 218 so that the gate terminals of the first plurality of stacked transistors 218 do not load the first series connected attenuation circuit segment 208 at the operating frequency. However, the resistance at the gate terminals may vary depending on the materials and layers utilized in the first plurality of stacked transistors 218 and also the desired bandwidth of the first series connected attenuation circuit segment 208. In the same manner, the resistance of the resistors, Rg2 and Rg3, may be selected to be high relative to the second and third continuous impedance range and impedance of the parasitic capacitors Cgs, Cgd, respectively. A common resistor, R_common1, R_common2, R_common3, may also be utilized to provide part of or all of the a high resistance between the gate terminals in each of the first, second, and third plurality of stacked transistors 218, 220, 222 and the control circuit 200.

It should be noted that while all of the resistors Rg1, Rg2, Rg3 in resistive circuits 232, 233, 234 are between the gate terminals of the first, second, and third plurality of stacked transistors 218, 220, 222, in alternative embodiments, one or more of the resistors Rg1, Rg2, Rg3, may be coupled in series with the gate terminals of one of the first, second, and third plurality of stacked transistors 218, 220, 222 as described in FIG. 8. The resistive circuits 184, 186, 188, 232, 233, 234 in FIGS. 8 and 9 may have any configuration so as to provide the appropriate resistances to the gate terminals of the plurality of stacked transistors 172, 174, 176, 218, 220, 222.

In FIG. 9, the attenuation circuit segments 208, 210, 212 may also each include a biasing circuit 235, 236, 237 coupled between the bodies of each of the first, second, and third plurality of stacked transistors 218, 220, 222 respectively, and a ground node. The biasing circuits 235, 236, 237 help assure the voltage levels of the control voltages, Vcontrol_A, Vcontrol_B, are better defined within the first, second, and third plurality of stacked transistors 218, 220, 222. Furthermore, the biasing circuits 235, 236, 237 each may include resistors, Rb1, Rb2, Rb3, respectively, to provide a body bias to the first, second, and third plurality of stacked transistors 218, 220, 222. In this embodiment, the resistors, Rb1 are each coupled in between the body of one of the first plurality of stacked transistors 218 and the body of another one of the first plurality of stacked transistors 218. Similarly, the resistors Rb2, Rb3 are each coupled in between the body of one of the second and third plurality of stacked transistors 220, 222, respectively and another one of the second and third plurality of stacked transistors 220, 222, respectively. The resistance of resistors Rb1, Rb2, Rb3 may be high so that the resistors Rb1, Rb2, Rb3 do not load the attenuation circuit segments 208, 210, 212 and may be high relative to the impedance of the $C_{sb}$ and $C_{db}$ parasitic capacitors at the frequency of interest. Also, if the first, second, or third plurality of stacked transistors 218, 220, 222 have unacceptably high parasitic capacitances between the source terminals and body, or drain terminals and body, the resistance of resistors Rb1, Rb2, Rb3 may be high enough to render loading due to these the parasitic capacitances negligible.

It should be noted that while all of the resistors Rb1, Rb2, Rb3 in biasing circuits 235, 236, 237 are between the gate terminals of the first, second, and third plurality of stacked transistors 208, 210, 212, in alternative embodiments, one or more of the resistors Rb1, Rb2, Rb3, may be coupled in series with the gate terminals of one of the first, second, and third plurality of stacked transistors 208, 210, 212 as described in FIG. 8. The biasing circuits 190, 192, 194, 235, 236, 237 in FIGS. 8 and 9 may have any configuration so as to provide the appropriate resistances to the gate terminals of the plurality of stacked transistors 172 174, 176, 218, 220, 222.

Figure 10:
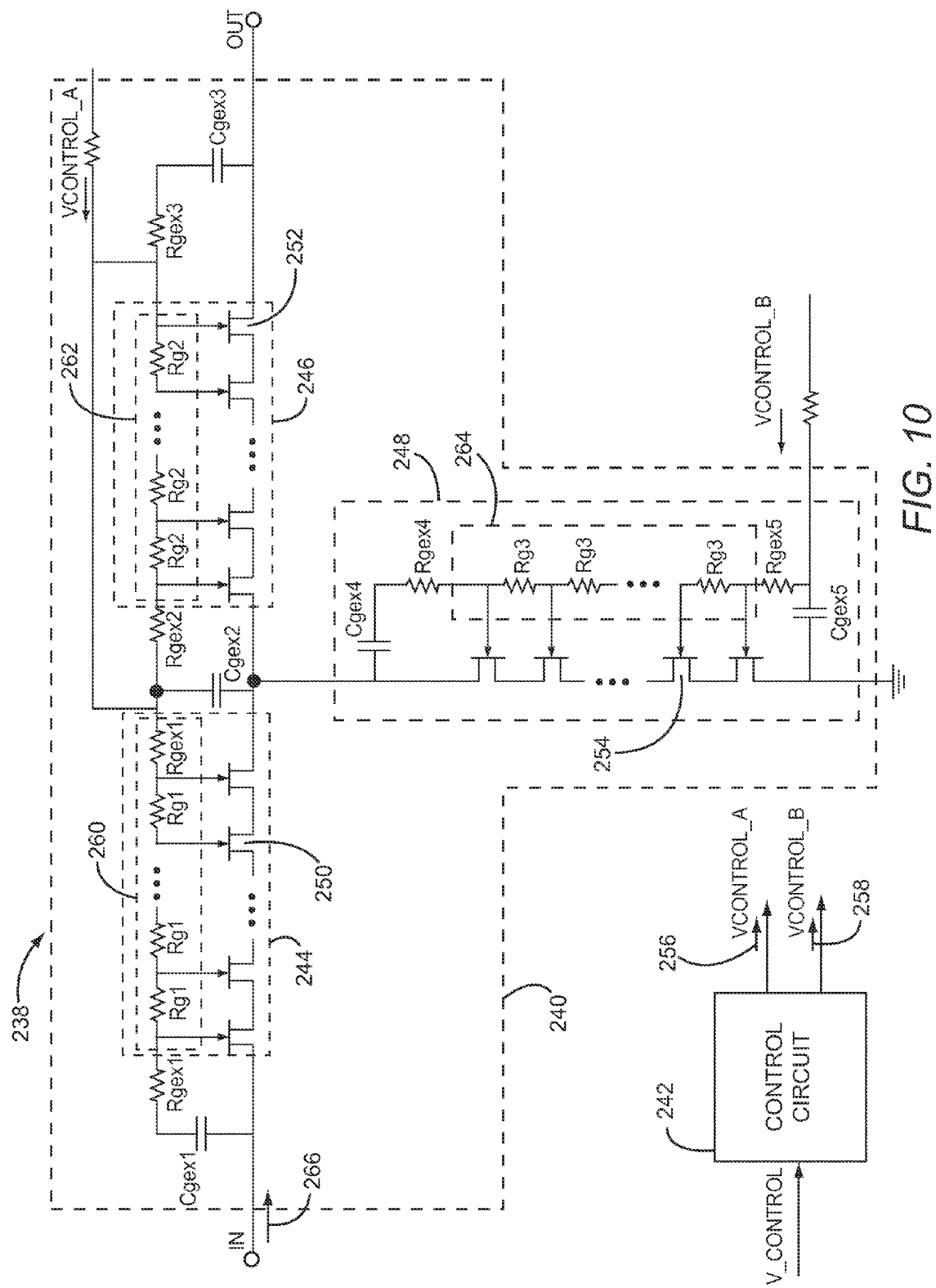
FIG. 10 is a circuit diagram of yet another embodiment of a variable attenuator having an attenuation circuit in a Tee-type configuration.

Referring now to FIG. 10, a circuit diagram of another embodiment of an attenuator 238 having an attenuation circuit 240 in a Tee-type configuration and a control circuit 242 is shown. Similar to the previous embodiments, the attenuation circuit 240 has a first and second series connected attenuation circuit segment 244, 246 and a shunt connected attenuation circuit segment 248. Also each of the attenuation circuit segments 244, 246, 248 include a first, second, and third plurality of stacked transistors 250, 252, 254. The control circuit 242 generates a control segment control signal 256, in this case, Vcontrol_A to control a first variable impedance level and a second variable impedance level of the first and second series connected attenuation circuit segments 244, 246 and a shunt connected segment control signal 258 to control a third variable impedance level of the shunt connected attenuation circuit segment 248. Also, similar to the embodiment explained above for FIG. 9, each attenuation circuit segment 244, 246, 248 includes resistive circuits 260, 262, 264 having resistors, Rg1, Rg2, Rg3, respectively. Also, the bodies of the first, second, and third plurality of stacked transistors 250, 252, 254 are floating and have no bias circuitry.

In this embodiment, a resistor, Rgex1, and capacitor, Cgex1, are coupled at one end of the first series connected attenuation circuit segment 244 and a resistor, Rgex2, and capacitor, Cgex2, are coupled between the first and second series connected attenuation circuit segment 244, 246. A resistor, Rgex3, and capacitor Cgex3 are coupled to another end of the second series connected attenuation circuit segment 246. A resistor, Rgex4, and capacitor, Cgex4, are coupled at one end of the shunt connected attenuation circuit segment 248, and a resistor, Rex5, and capacitor, Cgex5, are coupled to another end of the shunt connected attenuation circuit segments. These resistors, Rgex1, Rgex2, Rgex3, Rgex4, Rgex5, and capacitors, Cgex1, Cgex2, Cgex3, Cgex4, Cgex5 form RC networks that help distribute an input signal 266 across the first, second, and third plurality of stacked transistors 250, 252, 254.

Figure 11:
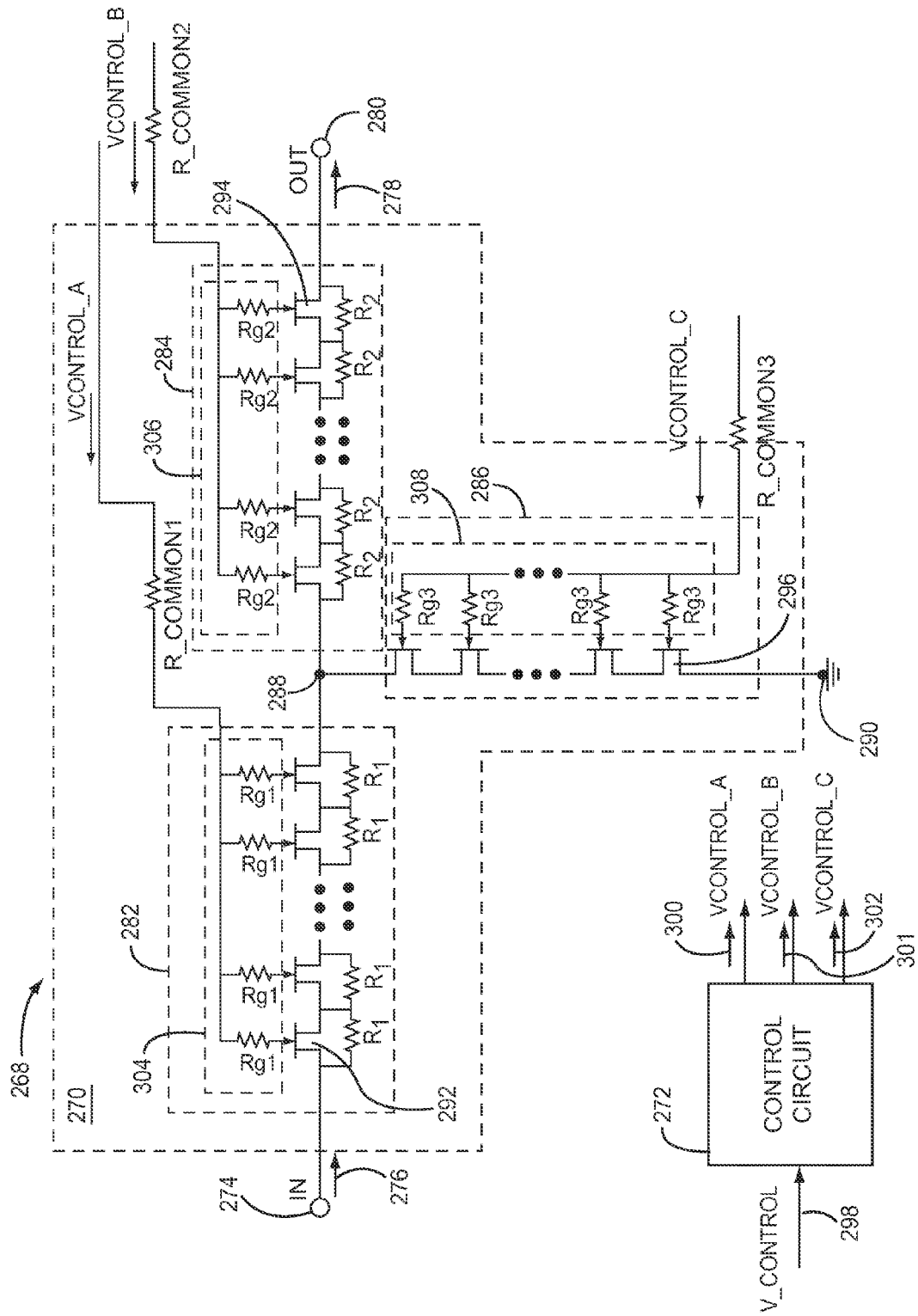
FIG. 11 is a circuit diagram of still yet another embodiment of a variable attenuator having an attenuation circuit in a Tee-type configuration.

Referring now to FIG. 11, a circuit diagram of yet another embodiment of an attenuator 268 having an attenuation circuit 270 in a Tee-type configuration and a control circuit 272 is shown. The attenuation circuit 270 has an input terminal 274 for receiving an input signal 276. The attenuation circuit 270 attenuates the input signal 276 in accordance with the variable attenuation level set by the control circuit 272. This generates an attenuated output signal 278 that is output from an output terminal 280. To attenuate the input signal 276, the attenuation circuit 270 includes a first series connected attenuation circuit segment 282, a second series connected attenuation circuit segment 284, and a shunt connected attenuation circuit segment 286. In this embodiment, the first series connected attenuation circuit segment 282 is coupled in series between the input terminal 274 and an internal node 288 and the second series connected attenuation circuit segment 284 is coupled in series between the internal node 288 and the output terminal 280. The shunt connected attenuation circuit segment 286 has a shunt connection to the internal node 288, and is connected between the internal node 288 and a ground node 290.

The attenuation circuit segments 282, 284, 286 each have a plurality of stacked transistors 292, 294, 296. The number and type of transistors in each of the plurality of stacked transistors 292, 294, 296 may be the same or vary depending on the desired attenuation characteristics of the attenuation circuit 270. In this embodiment, each of the transistors in the plurality of stacked transistors 292, 294, 296 is a FET and the transistors are stacked by coupling the source and drain terminals of each transistor in series. The first plurality of stacked transistors 292 are coupled in the first series connected attenuation circuit segment 282 to provide the first series connected attenuation circuit segment 282 with a first variable impedance level having a first continuous impedance range. In this embodiment, the first plurality of stacked transistors 292 provides part of the attenuation for the first series connected attenuation circuit segment 282. Also coupled within the first series connected attenuation circuit segment 282 are resistors, R1, that also provide attenuation to the input signal 276 in the first series connected attenuation circuit segment 282. Each of the resistors, R1, may be coupled in parallel with one of the first plurality of stacked transistors 292 and each or only some of the first plurality of stacked transistors 292 may have a transistor, R1. Since the impedance level of the first plurality of stacked transistors 292 can be varied and the first plurality of stacked transistors 292 also attenuate the input signal 276, the first plurality of stacked transistors 292 are coupled to provide the first series connected attenuation circuit segment 282 with a first variable impedance level within a first continuous impedance range. However, the first variable impedance level and first continuous impedance range is not based solely on the attenuation of the first plurality of stacked transistors 292 but also on the attenuation of the resistors, R1. In this manner, the plurality of stacked transistors 292 may be provided to be smaller but still provide the same level of attenuation. However, decreasing the size of the first plurality of stacked transistors 292 may also introduce distortion and thus a trade-off may be provided between increased linearity and a decrease in the area for the first plurality of stacked transistors 292.

Similarly, the second plurality of stacked transistors 294 are coupled in the second series connected attenuation circuit segment 284 to provide the second series connected attenuation circuit segment 284 with a second variable impedance level having a second continuous impedance range. In this embodiment, the second plurality of stacked transistors 294 provides part of the attenuation for the second series connected attenuation circuit segment 284. Also, coupled within the second series connected attenuation circuit segment 284 are resistors, R2, that also provide attenuation to the input signal 276 in the second series connected attenuation circuit segment 284. Each of the resistors, R2, may be coupled in parallel with one of the second plurality of stacked transistors 294 and each or only some of the first plurality of stacked transistors 294 may have a resistor, R2. Since the impedance level of the second plurality of stacked transistors 294 can be varied and the second plurality of stacked transistors 294 also attenuate the input signal 276, the second plurality of stacked transistors 294 are coupled to provide the second series connected attenuation circuit segment 284 with the second variable impedance level within the second continuous impedance range. However, the second variable impedance level and second continuous impedance range is not based solely on the attenuation of the second plurality of stacked transistors 294 but also on the attenuation of the resistors, R2. In this manner, the plurality of stacked transistors 294 may be smaller but still provide the same level of attenuation. However, decreasing the size of the first plurality of stacked transistors 294 may also introduce distortion and thus a trade-off may be provided between increased linearity and a decrease in the area for the second plurality of stacked transistors 294.

The third plurality of stacked transistors 296 are coupled in the shunt connected attenuation circuit segment 286 to provide the shunt connected attenuation circuit segment 286 with a third variable impedance level having a third continuous impedance range. In this embodiment, the third plurality of stacked transistors 296 provide substantially all of the attenuation for the shunt connected attenuation circuit segment 286. Thus, the third variable impedance level of the third continuous impedance range provides a third variable impedance level that is essentially equal to the variable impedance level having a continuous impedance range of the third plurality of stacked transistors 296.

It should be noted that in alternative embodiments, resistors, such as R1 or R2, may be coupled in parallel to the third plurality of stacked transistors 296. In fact, any of the first, second, or third plurality of stacked transistors 292, 294, 296 may have resistors R1 or R2 coupled in parallel depending on the requirements for the attenuator 268.

The control circuit 272 may be operably associated with the plurality of stacked transistors 292, 294, 296 in each of the attenuation circuit segments 282, 284, 286 to control the first variable impedance level, the second variable impedance level, and the third variable impedance level based on a signal level of an attenuation control signal 298 and thereby adjust the variable attenuation level to a desired value within the continuous attenuation range. In this case, the attenuation control signal 298 may be the control voltage, V_control, having a continuous voltage range of 0-5V. The control circuit 272 may be adapted to receive the control voltage, V_control, and generate a first series segment control signal 300, a second series control signal 301, and a shunt segment control signal 302 having signal levels that are based on the voltage level of the control voltage, V_control.

The gate terminals of the plurality of stacked transistors 292, 294, 296 may be coupled to the control circuit 272 to receive the first series segment control signal 300, the second series segment control signal 301, and the shunt segment control signal 302. In this embodiment, the first series segment control signal 300 is a control voltage, Vcontrol_A, that is generated by the control circuit 272 based on the control voltage, V_control, received by the control circuit 272 to control the operation of the first plurality of stacked transistors 292. The second series segment control signal 301 is a control voltage, Vcontrol_B, that is generated by the control circuit 272 based on the control voltage, V_control, received by the control circuit 272 to control the operation of the second plurality of stacked transistors 294. Similarly, the shunt segment control signal 302 is a control voltage, Vcontrol_C, that is generated by the control circuit 272 based on the control voltage, V_control, to control the third plurality of stacked transistors 296 in the shunt segment attenuation circuit segment. Consequently, the voltage levels of the control voltages, Vcontrol_A, Vcontrol_B, Vcontrol_C are set in accordance to the transfer function of the control circuit 272 which provide the appropriate bias to the gate terminals of the plurality of stacked transistors 292, 294, 296 and set the first variable impedance level, the second variable impedance level, and the third variable impedance level. In this manner, the control circuit 272 is operably associated with each of the plurality of stacked transistors 292, 294, 296 to control the first variable impedance level, the second variable impedance level, and the third variable impedance level based on the voltage level of the control voltage, V_control. As explained above, the variable attenuation level is based on the first variable impedance level, second variable impedance level, and third variable impedance level. Accordingly, the variable attenuation level of the attenuation circuit 270 is set at the desired based on the voltage level of the control voltage, V_control.

To reduce parasitic capacitances and preserve high bandwidth, each of the attenuation circuit segments 282, 284, 286 include a first, second, and third resistive circuit 304, 306, 308, respectively. The resistive circuits 304, 306, 308 may each be coupled between the first, second, and third plurality of stacked transistors 292, 294, 296 and the control circuit 272. The resistance of resistive circuits 304, 306, 308 may be high relative to the first, second, and third continuous impedance range, as explained above.

Figure 12:
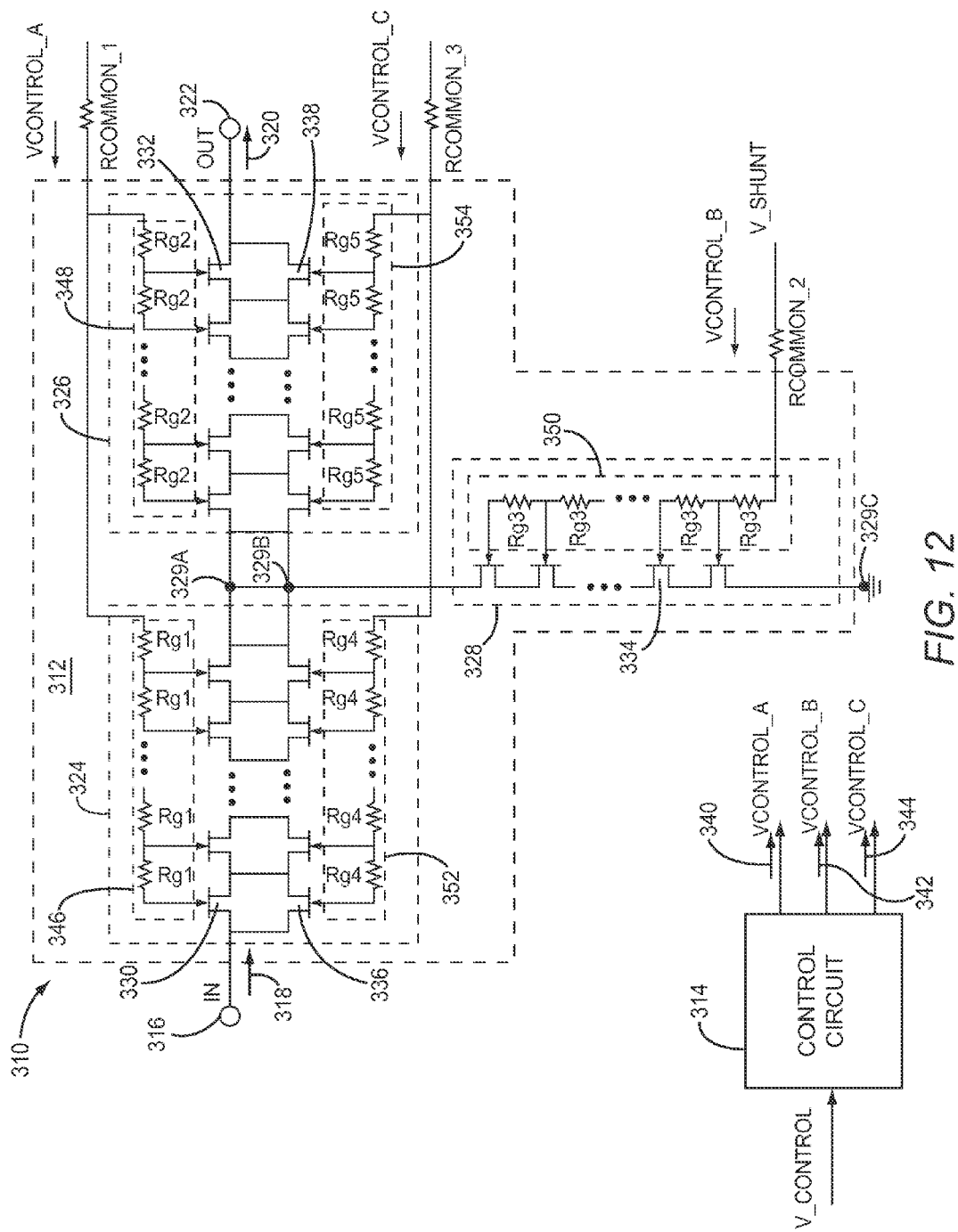
FIG. 12 is a circuit diagram of yet another additional embodiment of a variable attenuator having an attenuation circuit in a Tee-type configuration.

Referring now to FIG. 12, a circuit diagram of still yet another embodiment of an attenuator 310 having an attenuation circuit 312 in a Tee-type configuration and a control circuit 314 is shown. The attenuation circuit 312 has an input terminal 316 for receiving an input signal 318. The attenuation circuit 312 attenuates the input signal 318 in accordance with the variable attenuation level that is adjustable within a continuous attenuation range and is set by the control circuit 314. This generates an attenuated output signal 320 that is output from an output terminal 322. To attenuate the input signal 318, the attenuation circuit 312 includes a first series connected attenuation circuit segment 324, a second series connected attenuation circuit segment 326, and a shunt connected attenuation circuit segment 328. In this embodiment, the first series connected attenuation circuit segment 324 is coupled in series between the input terminal 316 and internal nodes 329A, 329B and the second series connected attenuation circuit segment 326 is coupled in series between the internal node 329A and the output terminal 322. The shunt connected attenuation circuit segment 328 has a shunt connection to the internal nodes 329A, 329B and is connected between the internal nodes 329A, 329B and a ground node 329C.

The attenuation circuit segments 324, 326, 328 each have a first, second, and third plurality of stacked transistors 330, 332, 334, which in this example are floating body stacked NFET devices. The number and type of transistors in each of the plurality of stacked transistors 330, 332, 334 may be the same or vary depending on the desired attenuation characteristics of the attenuation circuit 312. In this embodiment, each of the transistors in the plurality of stacked transistors 330, 332, 334 is a FET and the transistors are stacked by coupling the source and drain terminals of each transistor in series. The first plurality of stacked transistors 330 are coupled in the first series connected attenuation circuit segment 324 to provide the first series connected attenuation circuit segment 324 with a first variable impedance level having a first continuous impedance range. As in the previous embodiment discussed above for FIG. 11, the first plurality of stacked transistors 330 provides part of the attenuation for the first series connected attenuation circuit segment 324.

Also coupled within the first series connected attenuation circuit segment 324 are a fourth plurality of stacked transistors 336 that also provide attenuation to the input signal 318 in the first series connected attenuation circuit segment 324. This fourth plurality of stacked transistors 336 are also floating body stacked NFET devices. Each of the fourth plurality of stacked transistors 336 may be coupled in parallel with one of the first plurality of stacked transistors 330 and each or only some of the first plurality of stacked transistors 330 may be coupled to one of the fourth plurality of stacked transistors 336. Since the impedance level of the first plurality of stacked transistors 330 can be varied and the first plurality of stacked transistors 330 also attenuate the input signal 318, the first plurality of stacked transistors 330 are coupled to provide the first series connected attenuation circuit segment 324 with a first variable impedance level within a first continuous impedance range. However, the fourth plurality of stacked transistors 336 also have an impedance level that can be varied and the fourth plurality of stacked transistors 336 also attenuate the input signal 318. Thus, the fourth plurality of stacked transistors 336 are also coupled to provide the first variable impedance level which in this example is a combination of the variable impedance level of the first plurality of stacked transistors 330 and the variable impedance level of the fourth plurality of stacked transistors 336. By providing the fourth plurality of stacked transistors 336, the first plurality of stacked transistors 330 may be smaller while allowing the first series connected attenuation circuit segment 324 to provide the same level of attenuation. The second plurality of stacked transistors 336 may have different degrees of stacking and the transistors may be of a different size than the first plurality of stacked transistors 330. In this manner, the first series connected attenuation circuit segment 324 having the fourth plurality of stacked transistors 336 in parallel with one or more of the first plurality of stacked transistors 330 may utilize a more compact design while providing distortion cancellation, improved temperature stability, and greater bandwidth.

Similarly, the second plurality of stacked transistors 332 are coupled in the second series connected attenuation circuit segment 326 to provide the second series connected attenuation circuit segment 326 with a second variable impedance level having a second continuous impedance range. In this embodiment, the second plurality of stacked transistors 332 provides part of the attenuation for the second series connected attenuation circuit segment 326.

Also coupled within the second series connected attenuation circuit segment 326 are a fifth plurality of stacked transistors 338, that also provides attenuation to the input signal 318 in the second series connected attenuation circuit segment 326 and are floating body stacked NFET devices. Each of the fifth plurality of stacked transistors 338 may be coupled in parallel with one of the second plurality of stacked transistors 332 and each or only some of the second plurality of stacked transistors 332 may be coupled to one of the fifth plurality of stacked transistors 338. Since the impedance level of the second plurality of stacked transistors 332 can be varied and the second plurality of stacked transistors 332 also attenuate the input signal 318, the second plurality of stacked transistors 332 are coupled to provide the second series connected attenuation circuit segment 326 with a second variable impedance level within a second continuous impedance range. However, the fifth plurality of stacked transistors 338 also have an impedance level that can be varied and the fifth plurality of stacked transistors 338 also attenuate the input signal 318. Thus, the fifth plurality of stacked transistors 338 are also coupled to provide the second variable impedance level which in this example is a combination of the variable impedance level of the second plurality of stacked transistors 332 and the variable impedance level of the fifth plurality of stacked transistors 338. By providing the fifth plurality of stacked transistors 338, the second plurality of stacked transistors 332 may be smaller while allowing the second series connected attenuation circuit segment 326 to provide the same level of attenuation. The second plurality of stacked transistors 338 may have different degrees of stacking and the transistors may be of a different size than the second plurality of stacked transistors 332. In this manner, the second series connected attenuation circuit segment 326 having the fifth plurality of stacked transistors 338 in parallel with one or more of the second plurality of stacked transistors 332 may utilize a more compact design while providing distortion cancellation and greater bandwidth.

The third plurality of stacked transistors 334 are coupled in the shunt connected attenuation circuit segment 328 to provide the shunt connected attenuation circuit segment 328 with a third variable impedance level having a third continuous impedance range. In this embodiment, the third plurality of stacked transistors 334 provide substantially all of the attenuation for the shunt connected attenuation circuit segment 328. Thus, the third variable impedance level of the third continuous impedance range is essentially equal to the variable impedance level having a continuous impedance range of the third plurality of stacked transistors 334.

Note that in alternative embodiments, another plurality of stacked transistors, such as the fourth and fifth plurality of stacked transistors, 336 and 338, may be coupled in parallel to the third plurality of stacked transistors 334. In fact, any of the first, second, or third plurality of stacked transistors 330, 332, 334 may have another plurality of stacked transistors coupled in parallel depending on the requirements for the attenuator 310.

The control circuit 314 may be operably associated with the plurality of stacked transistors 330, 332, 334, 336, 338 in each of the attenuation circuit segments 324, 326, 328 to control the first variable impedance level, the second variable impedance level, and the third variable impedance level based on a signal level of an attenuation control signal 298. In this case, the attenuation control signal 298 may be the control voltage, V_control, having a continuous voltage range of 0-5V. The control circuit 314 may be adapted to receive the control voltage, V_control, and generate a first series segment control signal 340, a shunt segment control signal 342, and a second series segment control signal 344 having signal levels that are based on the voltage level of the control voltage, V_control.

The gate terminals of the plurality of stacked transistors 330, 332, 334, 336, 338 may be coupled to the control circuit 314 to receive the first series segment control signal 340, the shunt segment control signal 342, the second series segment control signal 344. In this embodiment, the first series segment control signal 340 is a control voltage, Vcontrol_A that is generated by the control circuit 314 based on the control voltage, V_control received by the control circuit 314 to control the operation of the first and second plurality of stacked transistors 330, 332 in the first and second series connected attenuation circuit segments 324, 326. Similarly, the shunt segment control signal 342 is a control voltage, Vcontrol_B that is generated by the control circuit 314 based on the control voltage, V_control to control the third plurality of stacked transistors 334 in the shunt segment attenuation circuit segment. Finally, the second series segment control signal 344 is a control voltage, Vcontrol_C, that is generated by the control circuit 314 based on the control voltage, V_control, to control the operation of the fourth and fifth plurality of stacked transistors 336, 338 in the first and second series connected attenuation circuit segments 324, 326. Consequently, the voltage levels of the control voltages, Vcontrol_A, Vcontrol_B, Vcontrol_C, are set in accordance to the transfer function of the control circuit 314 which provide the appropriate bias to the gate terminals of the plurality of stacked transistors 330, 332, 334, 336, 338 and set the first variable impedance level, the second variable impedance level, and the third variable impedance level. In this manner, the control circuit 314 is operably associated with each of the plurality of stacked transistors 330, 332, 334, 336, 338 to control the first variable impedance level, the second variable impedance level, and the third variable impedance level and the variable attenuation level of the attenuation circuit 312 is set at the desired attenuation level based on the voltage level of the control voltage, V_control.

To reduce parasitic capacitances and preserve high bandwidth, the attenuation circuit segments 324, 326, 328 include a first, second, third, fourth, and fifth resistive circuit 346, 348, 350, 352, 354. The resistive circuits 346, 348, 350, 352, 354 may each be coupled between one of the first, second, third, fourth, and fifth plurality of stacked transistors 330, 332, 334, 336, 338 and the control circuit 314. The resistance of each of the resistive circuits 346, 348, 350, 352, 354 may be selected to be high relative to the continuous impedance ranges of the respective plurality of stacked transistors 330, 332, 334, 336, 338 and thereby reduce or eliminate the parasitic capacitances in the plurality of stacked transistors 330, 332, 334, 336, 338. A common resistor, R_common1, R_common2, R_common3, may also be utilized to provide part of or all of the high resistance between the gate terminals in each of the first, second, third, fourth, and fifth plurality of stacked transistors 330, 332, 334, 336, 338 and the control circuit 314.

Figure 13:
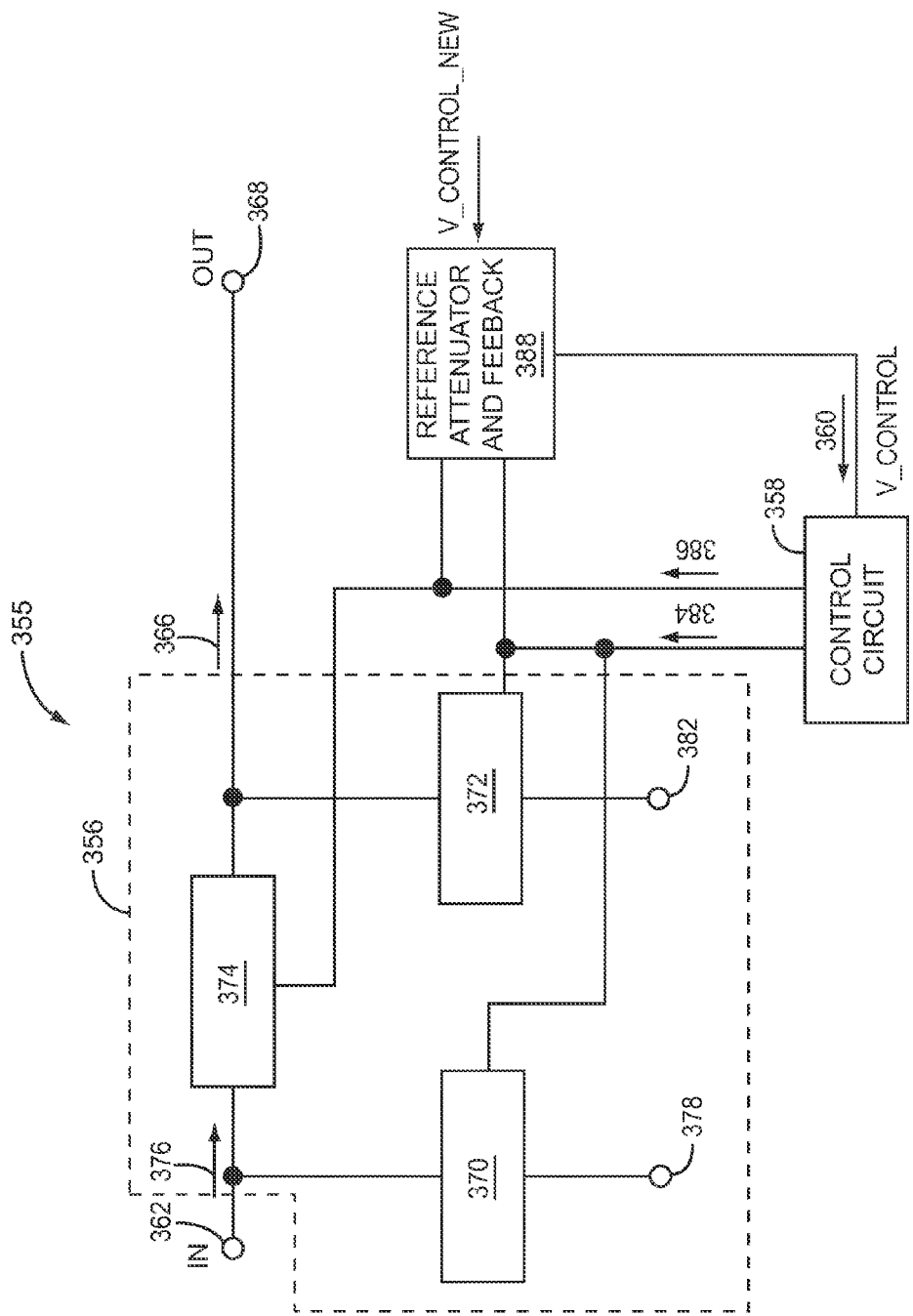
FIG. 13 illustrates one embodiment of a variable attenuator in accordance with the present disclosure that has an attenuation circuit in a classic Pi-type configuration.

FIG. 13 illustrates another embodiment of an attenuator 355 having an attenuation circuit 356 and a control circuit 358. The attenuation circuit 356 has a variable attenuation level having a continuous attenuation range. The variable attenuation level of the attenuation circuit 356 is controlled by the control circuit 358. The control circuit 358 receives an attenuation control signal 360 which in this example is the control voltage, V_control. The control voltage, V_control, may be a DC voltage having a voltage level that can be varied to any voltage level within a continuous voltage range. In this embodiment, the continuous voltage range of control voltage, V_control, is between 0-5V. The control circuit 358 is operably associated with the attenuation circuit 356 to control the variable attenuation level based on the voltage level of the control voltage, V_control. Thus, the variable attenuation level of the attenuation circuit 356 is varied within a continuous attenuation range as the voltage level of the control voltage, V_control, is varied through the continuous voltage range. If desirable, the transfer function of the control circuit 358 may be configured so that the continuous voltage range of the control voltage, V_control, allows the control circuit 358 to span the entire continuous attenuation range of the attenuation circuit 356. Thus, the variable attenuation level may be set to any attenuation level within the continuous attenuation range by the control circuit 358.

In this embodiment, the attenuation circuit 356 has an input terminal 362 for receiving an input signal 364. The attenuation circuit 356 attenuates the input signal 364 in accordance with the variable attenuation level to produce an attenuated output signal 366 that is output from an output terminal 368. To attenuate the input signal 364, the attenuation circuit 356 includes a first shunt connected attenuation circuit segment 370, a second shunt connected attenuation circuit segment 372, and a series connected attenuation circuit segment 374. The attenuation circuit segments 370, 372, 374 are configured so that the attenuation circuit 356 is arranged in a Pi-type configuration. In this embodiment, the first shunt connected attenuation circuit segment 370 is coupled in shunt between an internal node 376 and another node 378. The internal node 376 may be connected to the input terminal 362. The second shunt connected attenuation circuit segment 372 is coupled in shunt between an internal node 380 and another node 382. The internal node 380 may be connected to the output terminal 368. The series connected attenuation circuit segment 374 may be coupled in series between the internal nodes 376, 380.

Each of the attenuation circuit segments 370, 372, 374 each have a plurality of stacked transistors. The plurality of stacked transistors in each of the attenuation circuit segments 370, 372, 374 may be formed on a common substrate, or the plurality of stacked transistors in each or some of the attenuation circuit segments 370, 372, 374 may be formed on separate substrates. Similarly, if the electronic components of the control circuit 358 require a substrate, the control circuit 358 may be also formed on a common substrate having one or more of the plurality of stacked transistors from the attenuation circuit segments 370, 372, 374, or on a separate substrate.

The plurality of stacked transistors in the first shunt connected attenuation circuit segment 370 are coupled to provide the first shunt connected attenuation circuit segment 370 with a first variable impedance level having a first continuous impedance range. Thus, the plurality of stacked transistors in the first shunt connected attenuation circuit segment 370 may attenuate the input signal 364 in accordance with the first variable impedance level. Similarly, the plurality of stacked transistors in the second shunt connected attenuation circuit segment 372 are coupled to provide the second shunt connected attenuation circuit segment 372 with a second variable impedance level having a second continuous impedance range. Thus, the plurality of stacked transistors in the second shunt connected attenuation circuit segment 372 may attenuate the input signal 364 in accordance with the second variable impedance level. Finally, the plurality of stacked transistors in the series connected attenuation circuit segment 374 are coupled to provide the series connected attenuation circuit segment 374 with a third variable impedance level having a third continuous impedance range. Thus, the plurality of stacked transistors in the series connected attenuation circuit segment 374 may attenuate the input signal 364 in accordance with the third variable impedance level.

The variable attenuation level of the Pi-type configuration is a function of the first variable impedance level, the second variable impedance level, and the third variable impedance level (as well as other parameter such as the impedance at the input and output terminals 362). Consequently, the variable attenuation level is based on the first, second, and third variable impedance level and the continuous attenuation range is based on the first, second, and third continuous attenuation ranges. Similarly, the total continuous impedance range of the attenuation circuit 356 may be related to the first continuous impedance range, the second continuous impedance range, and the third continuous impedance range.

The variable attenuation level of the attenuation circuit 356 may be varied within the continuous attenuation range by the control circuit 358. The control circuit 358 sets the value of the variable attenuation level based on a voltage level of the control voltage, V_control. To do this, the control circuit 358 may be operably associated with the plurality of stacked transistors in each of the attenuation circuit segments 370, 372, 374 to control the first variable impedance level, the second variable impedance level, and the third variable impedance level based on the voltage level of the control voltage, V_control. In the illustrated embodiment, the control circuit 358 is adapted to receive the control voltage, V_control, and generate a shunt segment control signal 384 and a series segment control signal 386 having signal levels that are based on the voltage level of the control voltage, V_control. The series segment control signal 386 controls the third variable impedance level by controlling the plurality of stacked transistors in the series connected attenuation circuit segment 374.

In this embodiment, the shunt segment control signal 384 controls the first variable impedance level and the second variable impedance level by controlling the plurality of stacked transistors in both of the first and second shunt connected attenuation circuit segments 370, 372. This may be advantageous if the first and second shunt connected attenuation circuit segments 370, 372 are the same and the first and second variable impedance levels are to have the same value. Also, if the first and second shunt connected attenuation circuit segments 370, 372 are different or if the first and second variable impedance levels are to be set to different values, electronic components may be provided within the first shunt connected attenuation circuit segment 370 and the second shunt connected attenuation circuit segment 372 so that each shunt connected attenuation circuit segment 370, 372 may be operated by the same shunt segment control signal 384. In alternative embodiments, the control circuit 358 may generate separate shunt segment control signals 384 to separately control the plurality of stacked transistors in each of the first and second shunt connected attenuation circuit segments 370, 372.

Figure 14:
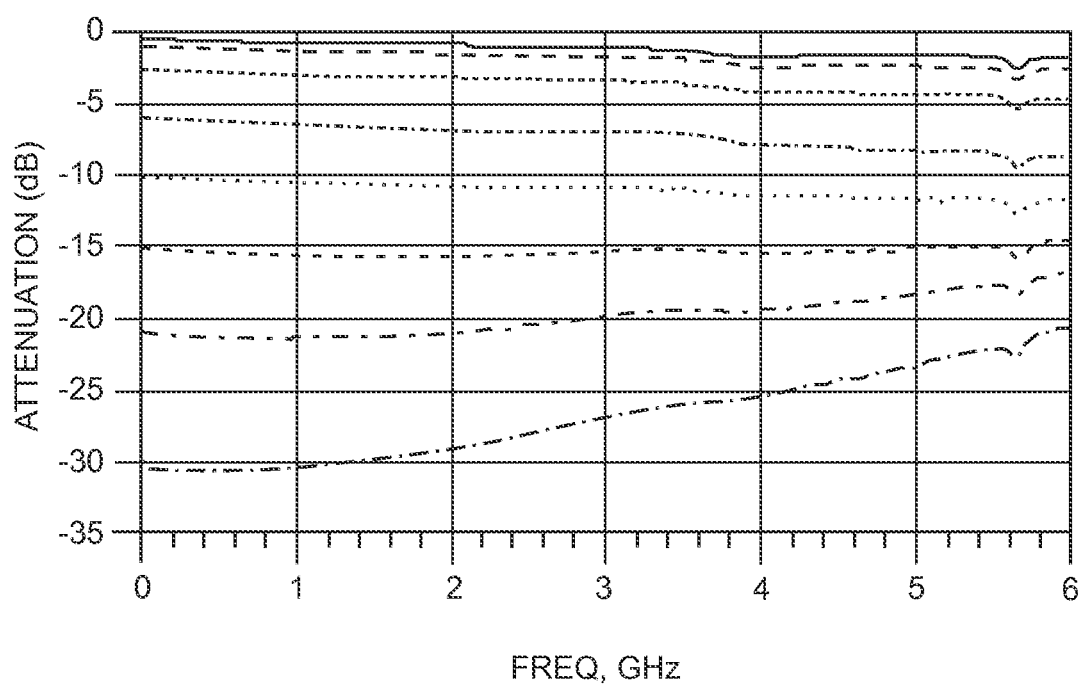
FIG. 14 is a graph illustrating a attenuation level versus frequency of one embodiment of an attenuator illustrated in FIG. 13, at different control voltage levels.

As illustrated in FIG. 13, closed loop techniques are utilized to generate the control voltage, V_control at the appropriate voltage levels. A reference attenuator and feedback 388 receives a control voltage V_control_new and generates the control voltage, V_control, as explained above for FIG. 7A, Next, FIG. 14 is a graph demonstrating the performance of one embodiment of the attenuation circuit 356 described in FIG. 13. In this case, the attenuation circuit segments 370, 372, 374 each are provided with a stack of fourteen (14) MOSFETs that formed on a silicon-on-insulator type substrate.

The graph in FIG. 14 illustrates the variable attenuation level of the attenuation circuit 356 when the voltage level of the control voltage is at various values. The variable attenuation level in FIG. 14 may be measured from the input terminal 362 and can be approximated to be the S21 scattering parameter of the attenuation circuit 356. The variable attenuation level is plotted as a function of frequency. As illustrated by FIG. 14, once the variable attenuation level has been set by the voltage level of the control voltage, V_control, the variable attenuation level remains very consistent even as the frequency of the input signal 364 varies from 0-6 GHz. Furthermore, the total continuous attenuation range of the variable attenuation level of the attenuation circuit 356 appears to have a minimum value of around 0.9 dB and a maximum value around 0.5-30 dB. The minimum value of the total continuous attenuation range may be set by the series connected attenuation circuit segment 374 while the maximum value of the variable attenuation level may be set by the first and second shunt connected attenuation circuit segment 370, 372. There is some degradation in the linearity of the variable attenuation level particularly at higher frequencies and when the variable attenuation level is set to attenuate closer to its minimum and maximum values. For example, the variable attenuation level appears to have a capacitive slope near its minimum value. This indicates the presence of some parasitic capacitance. On the other hand, variable attenuation level indicates some parasitic inductance by the inductive slope when set near its maximum value. In all however, the attenuation circuit 356 has a huge bandwidth. Also noted, it should be noted that the degradation in the linearity of the variable attenuation level may be reduced or eliminated through circuit design.

Figure 15:
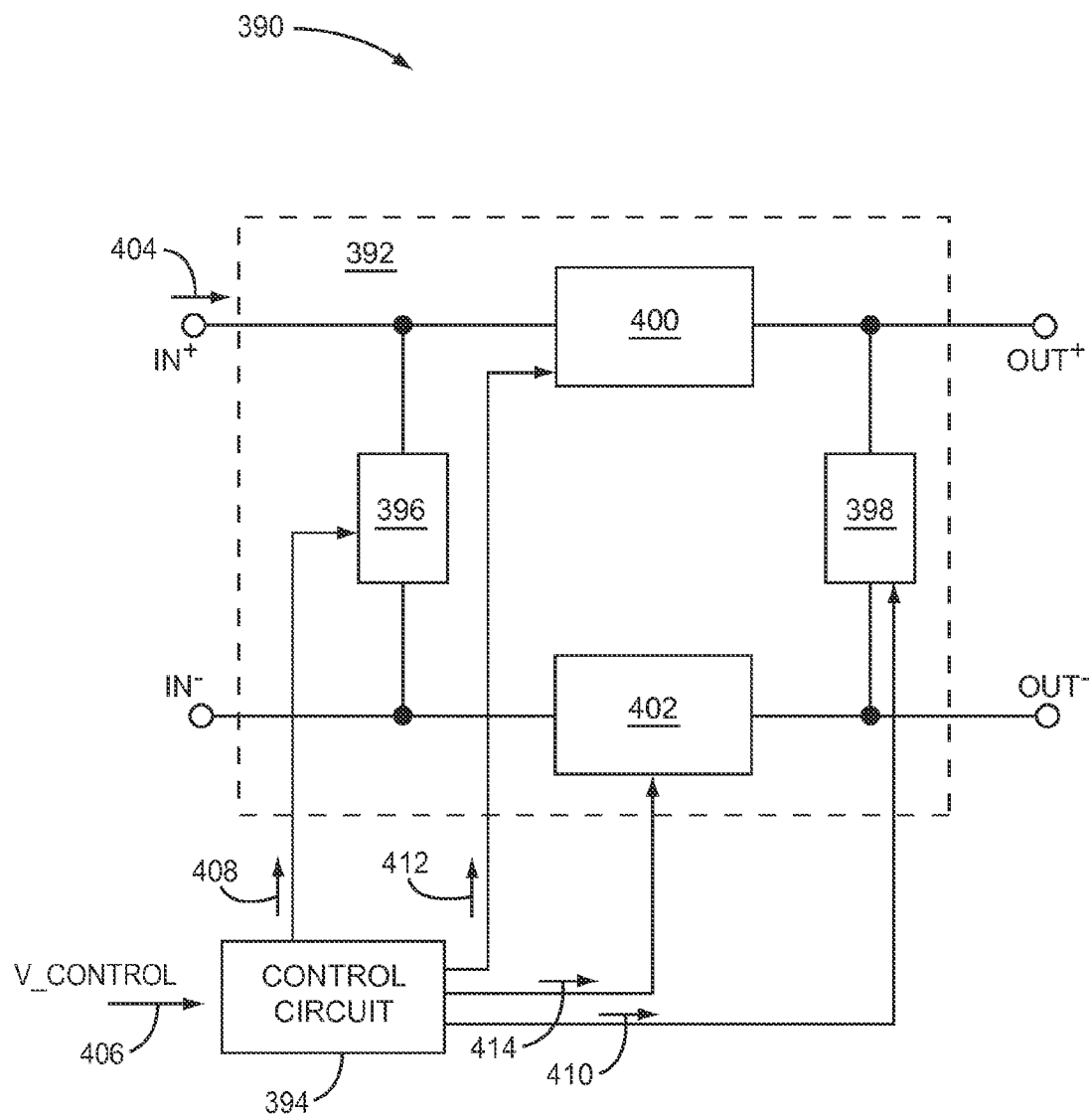
FIG. 15 illustrates one embodiment of a variable attenuator that has an attenuation circuit in a balanced Pi-type configuration.

Referring now to FIG. 15, another embodiment of an attenuator 390 having an attenuation circuit 392 and a control circuit 394. The attenuation circuit 392 shown in FIG. 15 also includes a first shunt connected attenuation circuit segment 396, a second shunt connected attenuation circuit segment 398, and a series connected attenuation circuit segment 400. The attenuation circuit segments 396, 398, 400 are configured so that the attenuation circuit 392 is arranged as a Pi-type attenuation circuit. However, in this attenuation circuit 392, the Pi-type configuration also includes a first balancing attenuation circuit segment 402. Thus, this Pi-type configuration is sometimes referred to as a balanced Pi-type configuration. In this embodiment, each of the attenuation circuit segments 396, 398, 400, 402 include a plurality of stacked transistors.

Each of the attenuation circuit segments 396, 398, 400 may also have a plurality of stacked transistors. Note however that in alternative embodiments, the balancing attenuation circuit segment 402 may not each include a plurality of stacked transistors but for example may have passive components. The plurality of stacked transistors in the first shunt connected attenuation circuit segment 396 are coupled to provide the first shunt connected attenuation circuit segment 396 with a first variable impedance level having a first continuous impedance range. Thus, the plurality of stacked transistors in the first shunt connected attenuation circuit segment 396 may attenuate an input signal 404 in accordance with the first variable impedance level. Similarly, the plurality of stacked transistors in the second shunt connected attenuation circuit segment 398 are coupled to provide the second shunt connected attenuation circuit segment 398 with a second variable impedance level having a second continuous impedance range. Thus, the plurality of stacked transistors in the second shunt connected attenuation circuit segment 398 may attenuate the input signal 404 in accordance with the second variable impedance level.

Next, the plurality of stacked transistors in the series connected attenuation circuit segment 400 are coupled to provide the series connected attenuation circuit segment 400 with a third variable impedance level having a third continuous impedance range. Thus, the plurality of stacked transistors in the series connected attenuation circuit segment 400 may attenuate the input signal 404 in accordance with the third variable impedance level. Also, the plurality of stacked transistors in the balancing attenuation circuit segment 402 are coupled to provide the balancing attenuation circuit segment 402 with a fourth variable impedance level having a fourth continuous impedance range. Thus, the plurality of stacked transistors in the balancing attenuation circuit segment 402 may attenuate the input signal 404 in accordance with the fourth variable impedance level.

The control circuit 394 receives an attenuation control signal 406, in this case a control voltage, V_control, and controls the attenuation circuit segments 396, 398, 400, 402 based on the voltage level of the control voltage, V_control. In this embodiment, the control circuit 394 generates a first and a second shunt segment control signal 408, 410 to control the plurality of stacked transistors in each of first and second shunt connected attenuation circuit segments 396, 398. A series segment control signal 412 is generated to control the plurality of stacked transistors in the series connected attenuation circuit segment 400. A balancing segment control signal 414 may be generated to control the plurality of stacked transistors in the balancing attenuation circuit segments 402. The segment control signals 408, 410, 412, 414 all have a signal level based on the voltage level of the control voltage, V_control. The transfer function of the control circuit 394 assures that the signal levels of each of the segment control signals 408, 410, 412, 414 is at the appropriate signal level so that the variable attenuation level of the attenuation circuit 392 is at the desired attenuation level.

Figure 16:
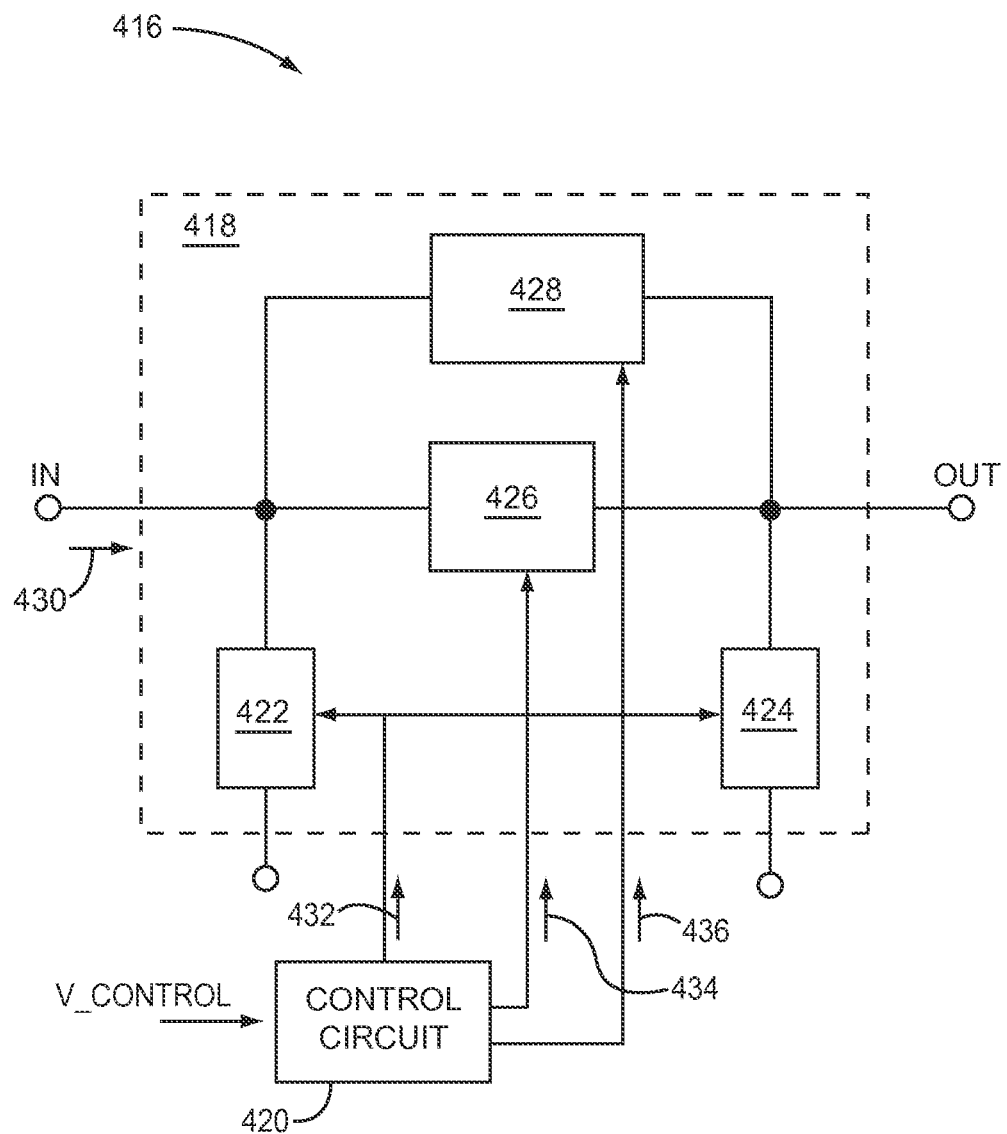
FIG. 16 illustrates one embodiment of a variable attenuator that has an attenuator having an attenuation circuit in a bridged Pi-type configuration.

FIG. 16 illustrates yet another embodiment of an attenuator 416 having an attenuation circuit 418 and a control circuit 420. The attenuation circuit 418 shown in FIG. 16 also includes a first shunt connected attenuation circuit segment 422, a second shunt connected attenuation circuit segment 424, and a series connected attenuation circuit segment 426. The attenuation circuit segments 422, 424, 426 are configured so that the attenuation circuit 418 is also arranged in a Pi-type attenuation configuration. However, in this attenuation circuit 418, the Pi-type configuration also includes a bridge attenuation circuit segment 428. Thus, attenuation circuit 418 may be referred to as being in a bridged Pi-type configuration.

In this embodiment, each of the attenuation circuit segments 422, 424, 426, 428 include a plurality of stacked transistors. Note however that in alternative embodiments, the bridge attenuation circuit segment 428 may not have a plurality of stacked transistors but for example may have passive components. The plurality of stacked transistors in the first shunt connected attenuation circuit segment 422 are coupled to provide the first shunt connected attenuation circuit segment 422 with a first variable impedance level having a first continuous impedance range. Thus, the plurality of stacked transistors in the first shunt connected attenuation circuit segment 422 may attenuate an input signal 430 in accordance with the first variable impedance level. Similarly, the plurality of stacked transistors in the second shunt connected attenuation circuit segment 424 are coupled to provide the second shunt connected attenuation circuit segment 424 with a second variable impedance level having a second continuous impedance range. Thus, the plurality of stacked transistors in the second shunt connected attenuation circuit segment 424 may attenuate the input signal 430 in accordance with the second variable impedance level.

Next, the plurality of stacked transistors in the series connected attenuation circuit segment 426 are coupled to provide the series connected attenuation circuit segment 426 with a third variable impedance level having a third continuous impedance range. Thus, the plurality of stacked transistors in the series connected attenuation circuit segment 426 may attenuate the input signal 430 in accordance with the third variable impedance level. Finally, the plurality of stacked transistors in the bridge attenuation circuit segment 428 are coupled to provide the bridge attenuation circuit segment 428 with a fourth variable impedance level having a fourth continuous impedance range. Thus, the plurality of stacked transistors in the bridged attenuation circuit segment 428 may attenuate the input signal 430 in accordance with the fourth variable impedance level.

The control circuit 420 may be operably associated with the plurality of stacked transistors in each of the attenuation circuit segments 422, 424, 426, 428 to control the first variable impedance level, the second variable impedance level, the third variable impedance level, and the fourth variable impedance level based on the voltage level of the control voltage, V_control. In the illustrated embodiment, the control circuit 420 is adapted to receive the control voltage, V_control, and generate a shunt segment control signal 432, a series segment control signal 434, and a bridge segment control signal 436 having signal levels that are based on the voltage level of the control voltage, V_control. The shunt segment control signal 432 controls the first and second variable impedance level of the first and second shunt connected attenuation circuit segments 422, 424. The series segment control signal 434 controls the third variable impedance level of the series connected attenuation circuit segments 426. Finally, the bridge segment control signal 436 controls the fourth variable impedance level of the bridge attenuation circuit segment 428. In this manner, the variable attenuation level is varied within the continuous attenuation range.

Figure 17:
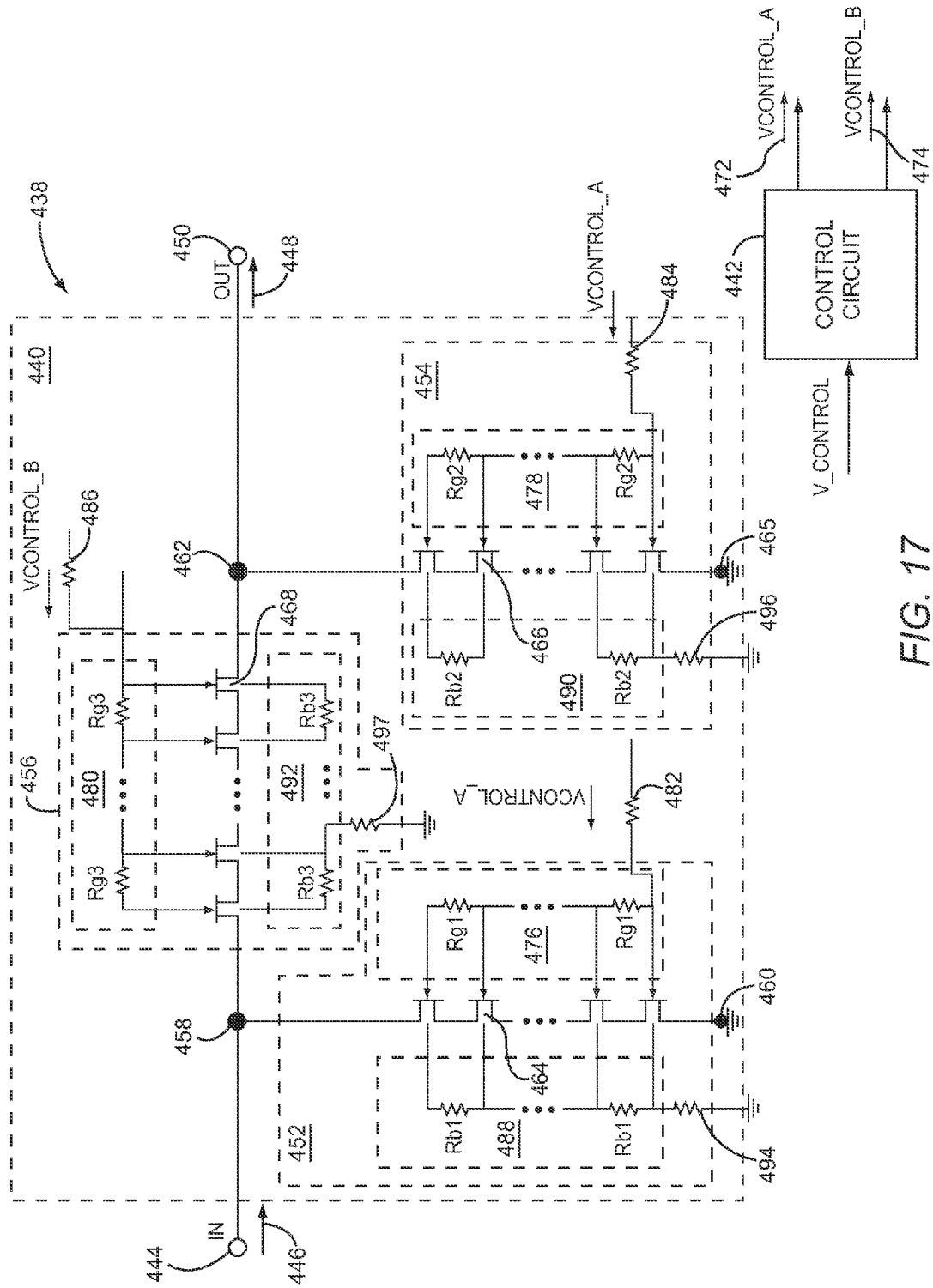
FIG. 17 is a circuit diagram of one embodiment of a variable attenuator having an attenuation circuit in a Pi-type configuration.

Referring now to FIG. 17, a circuit diagram of one embodiment of an attenuator 438 having an attenuation circuit 440 in a Pi-type configuration and a control circuit 442 is shown. All of the components in the attenuator 438 may be formed on a common substrate provided by a Monolific Microwave Integrated Chip (MMIC) or some or all of the components may be provided on separate substrates. The attenuation circuit 440 has an input terminal 444 for receiving an input signal 446. The attenuation circuit 440 attenuates the input signal 446 in accordance with the variable attenuation level set by the control circuit 442. This generates an attenuated output signal 448 that is output from an output terminal 450. To attenuate the input signal 446, the attenuation circuit 440 includes a first shunt connected attenuation circuit segment 452, a second shunt connected attenuation circuit segment 454, and a series connected attenuation circuit segment 456. In this embodiment, the first shunt connected attenuation circuit segment 452 is coupled in shunt between an internal node 458 and another node 460. The internal node 458 is coupled to the input terminal 444 which receives the input signal 446. The second shunt connected attenuation circuit segment 454 is coupled in shunt between an internal node 462 and another node 465. The internal node 462 may be coupled to the output terminal 450 that receives the attenuated output signal 448. The series connected attenuation circuit segment 456 may be coupled in series between the internal nodes 458, 462.

The attenuation circuit segments 452, 454, 456 each have a plurality of stacked transistors 464, 466, 468. The number and type of transistors in each of the plurality of stacked transistors 464, 466, 468 may be the same or vary depending on the desired distortion and attenuation characteristics of the attenuation circuit 440. In this embodiment, each of the transistors in the plurality of stacked transistors 464, 466, 468 is a FET and the transistors are stacked by coupling the source and drain terminals of each transistor in series and are body connected. The first plurality of stacked transistors 464 are coupled in the first shunt connected attenuation circuit segment 452 to provide the first shunt connected attenuation circuit segment 452 with a first variable impedance level having a first continuous impedance range. In this embodiment, the first plurality of stacked transistors 464 provide substantially all of the attenuation for the first shunt connected attenuation circuit segment 452. Thus, the first variable impedance level of the first continuous impedance range is essentially equal to the variable impedance level having a continuous impedance range of the first plurality of stacked transistors 464. Similarly, the second plurality of stacked transistors 466 are coupled to provide the second shunt connected attenuation circuit segment 454 with a second variable impedance level having a second continuous impedance range. Similarly, the third plurality of stacked transistors 468 are coupled to provide the series connected attenuation circuit segment 456 with a third variable impedance level having a third continuous impedance range. As with the first shunt connected attenuation circuit segment 452, the second and third plurality of stacked transistors 466, 468 provide substantially all of the attenuation in the second shunt connected attenuation circuit segment 454 and in the series connected attenuation circuit segment 456.

The control circuit 442 may be operably associated with the plurality of stacked transistors 464, 466, 468 in each of the attenuation circuit segments 452, 454, 456 to control the first variable impedance level, the second variable impedance level, and the third variable impedance level based on a signal level of an attenuation control signal 470. In this case, the attenuation control signal 470 may be the control voltage, V_control, having a continuous voltage range of 0-5V. The control circuit 442 may be adapted to receive the control voltage, V_control, and generate a shunt segment control signal 472 and a series segment control signal 474 having signal levels that are based on the voltage level of the control voltage, V_control.

The gate terminals of the plurality of stacked transistors 464, 466, 468 may be coupled to the control circuit 442 to receive the shunt segment control signal 472 and the series segment control signal 474. In this embodiment, the shunt segment control signal 472 is a control voltage, Vcontrol_A that is generated by the control circuit 442 based on the control voltage, V_control that controls the operation of the first and second plurality of stacked transistors 464, 466 in the first and second shunt connected attenuation circuit segments 452, 454. Similarly, the series segment control signal 474 is a control voltage, Vcontrol_B that is generated by the control circuit 442 based on the control voltage, V_control and control the third plurality of stacked transistors 468 in the series connected attenuation circuit segment 456. Consequently, the voltage levels of the control voltages, Vcontrol_A, Vcontrol_B, are set in accordance with a transfer function of the control circuit 442 which provide the appropriate bias to the gate terminals of the plurality of stacked transistors 464, 466, 468 and set the first variable impedance level, the second variable impedance level, and the third variable impedance level. In this manner, the control circuit 442 is operably associated with each of the plurality of stacked transistors 464, 466, 468 to control the first variable impedance level, the second variable impedance level, and the third variable impedance level based on the voltage level of the control voltage, V_control and the variable attenuation level of the attenuation circuit 440 is set at the desired attenuation level based on the voltage level of the control voltage, V_control.

To reduce parasitic capacitances and preserve high bandwidth, each of the attenuation circuit segments 452, 454, 456 include a first, second, and third resistive circuits 476, 478, 480, respectively. The resistive circuits 476, 478, 480 may each be coupled between the first, second, and third plurality of stacked transistors 464, 466, 468 and the control circuit 442. The resistance of the first resistive circuit 476 may be selected to be high relative to the first continuous impedance range provided by the first shunt connected attenuation circuit segment 452. If the resistance of the first resistive circuit 476 is high enough, the parasitic capacitances between the source terminals and gate terminals, and the drain terminals and gate terminals become negligible within the first continuous impedance range since these parasitic capacitances are coupled to the high resistances of the first resistive circuit 476. Also, as discussed above, the resistance may be high relative to the $C_{ds}$ and $C_{gd}$ parasitic capacitances at the frequency of interest.

Generally, the first resistive circuit 476 may provide a resistance at the gate terminals in the first plurality of stacked transistors 464 that is at least around 10 times greater than the highest value of the first continuous impedance range provided by the first plurality of stacked transistors 464. The control voltage, Vcontrol_A, may appear effectively as an open circuit voltage at the gate terminals of the first plurality of stacked transistors 464 so that the gate terminals of the first plurality of stacked transistors 464 do not load the first shunt connected attenuation circuit segment 452. However, the resistance at the gate terminals may vary depending on the materials and layers utilized in the first plurality of stacked transistors 464 and the desired bandwidth of the first shunt connected attenuation circuit segment 452. In the same manner, the resistance of the second and third resistive circuits 478, 480 may be selected to be high relative to the second and third continuous impedance range, respectively.

In the illustrated embodiment, each of the resistive circuits 476, 478, 480 has resistors, Rg1, Rg2, Rg3, respectively. Each of the resistors, Rg1, Rg2, Rg3, may be coupled between the gate terminal of one of the plurality of stacked transistors 464, 466, 468 and another one of the plurality of stacked transistors 464, 466, 468. While the resistance of each of the resistors Rg1 in the first shunt connected attenuation circuit segment 452 may be the same, this is not required. For example, each of the resistors, Rg1 may have different resistances so long as the resistance of the first resistive circuit 476 presented at the gate terminals of the first plurality of stacked transistors 464 is high with respect to the first continuous impedance range. Similarly the resistance of each of the resistors Rg2, Rg3, may be the same but this however is not required. A common resistor 482, 484, 486 may also be utilized to provide part of or all of the a high resistance between the gate terminals in each of the first, second, and third plurality of stacked transistors 464, 466, 468 and the control circuit 442.

Next, the attenuation circuit segments 452, 454, 456 may also each include a biasing circuit 488, 490, 492 coupled between the bodies of each of the first, second, and third plurality of stacked transistors 464, 466, 468, respectively, and a ground node. The biasing circuits 488, 490, 492 help assure the voltage levels of the control voltages, Vcontrol_A, Vcontrol_B, are better defined within the first, second, and third plurality of stacked transistors 464, 466, 468. Furthermore, the biasing circuits 488, 490, 492 each may include resistors, Rb1, Rb2, Rb3, respectively, to provide a body bias to the first, second, and third plurality of stacked transistors 464, 466, 468. In this embodiment, the resistors, Rb1 are coupled between the body of one of the first plurality of stacked transistors 464 and another one of the first plurality of stacked transistors 464. Similarly, the resistors Rb2, Rb3 are coupled between the body of one of the second and third plurality of stacked transistors 466, 468, respectively and the body of another one of the second and third plurality of stacked transistors 466, 468, respectively. The resistance of resistors Rb1, Rb2, Rb3 may be high relative to their respective $C_{sb}$ and $C_{db}$ parasitic capacitances so that the resistors Rb1, Rb2, Rb3 do not load the attenuation circuit segments 452, 454, 456. Also, if the first, second, or third plurality of stacked transistors 464, 466, 468 have unacceptably high parasitic capacitances between the source terminals and body, or drain terminals and body, the resistance of resistors Rb1, Rb2, Rb3 may be high enough to render these the parasitic capacitances negligible. A common biasing resistor 494, 496, 497 may also be provided to provide a high resistance between the bodies of the first, second, or third plurality of stacked transistors 464, 466, 468 and a ground node.

Figure 18:
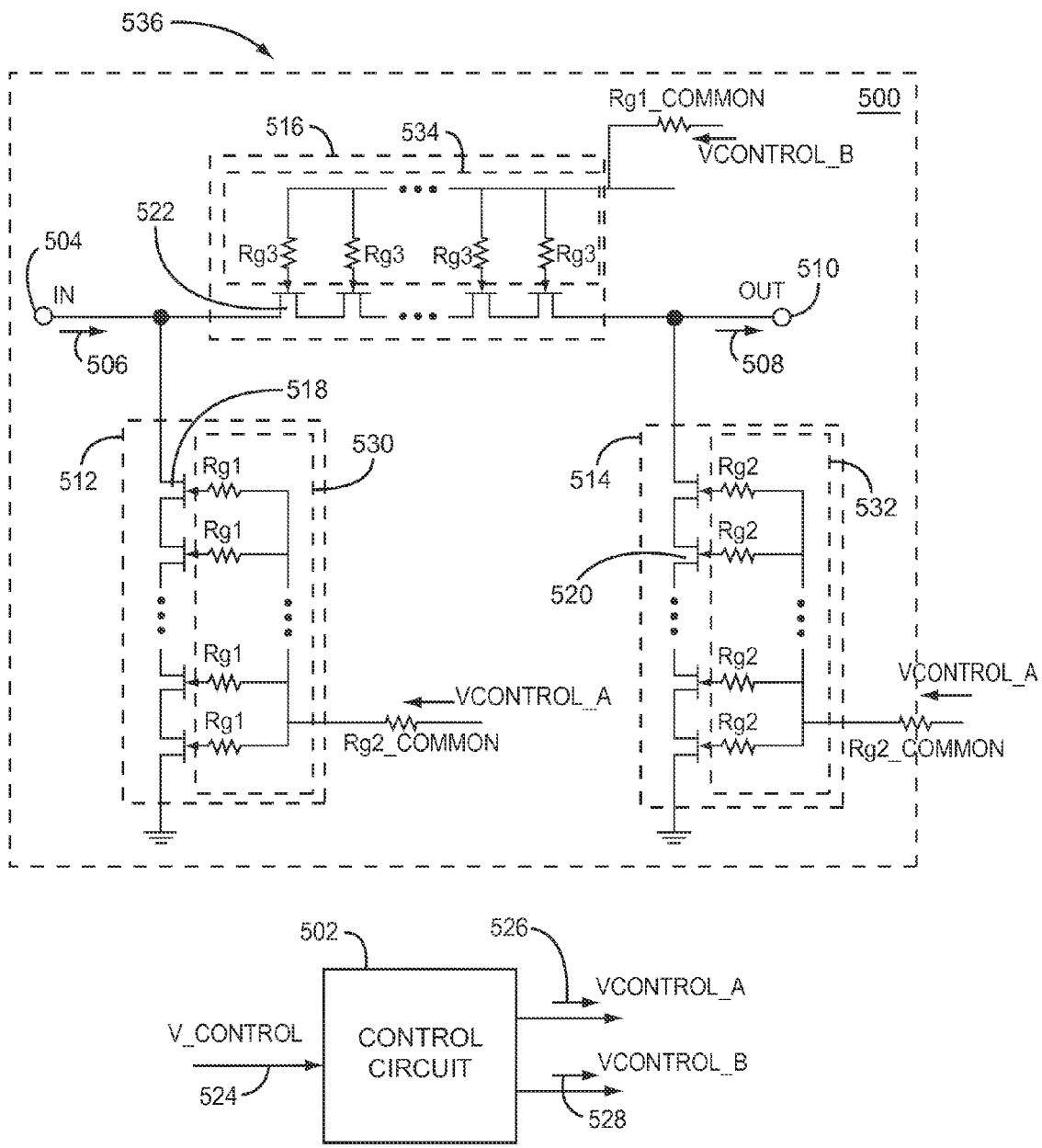
FIG. 18 is a circuit diagram of another embodiment of a variable attenuator having an attenuation circuit in a Pi-type configuration.

Referring now to FIG. 18, a circuit diagram of another embodiment of an attenuator 498 having an attenuation circuit 500 in a Pi-type configuration and a control circuit 502 is shown. The attenuation circuit 500 has an input terminal 504 for receiving an input signal 506. The attenuation circuit 500 attenuates the input signal 506 in accordance with the variable attenuation level set by the control circuit 502. This generates an attenuated output signal 508 that is output from an output terminal 510. To attenuate the input signal 506, the attenuation circuit 500 includes a first shunt connected attenuation circuit segment 512, a second shunt connected attenuation circuit segment 514, and a shunt connected attenuation circuit segment 516.

The attenuation circuit segments 512, 514, 516 each have a plurality of stacked transistors 518, 520, 522, which in this example are body connected stacked FET devices. The number and type of transistors in each of the plurality of stacked transistors 518, 520, 522 may be the same or vary depending on the desired attenuation characteristics of the attenuation circuit 500. In this embodiment, each of the transistors in the plurality of stacked transistors 518, 520, 522 is a FET and the transistors are stacked by coupling the source and drain terminals of each transistor in series. The first plurality of stacked transistors 518 are coupled in the first shunt connected attenuation circuit segment 512 to provide the first shunt connected attenuation circuit segment 512 with a first variable impedance level having a first continuous impedance range. In this embodiment, the first plurality of stacked transistors 518 provide substantially all of the attenuation for the first shunt connected attenuation circuit segment 512. Thus, the first variable impedance level of the first continuous impedance range is essentially equal to the variable impedance level having a continuous impedance range of the first plurality of stacked transistors 518. Similarly, the second plurality of stacked transistors 520 are coupled to provide the second shunt connected attenuation circuit segment 514 with a second variable impedance level having a second continuous impedance range and the third plurality of stacked transistors 522 are coupled to provide the series connected attenuation circuit segment 516 with a third variable impedance level having a third continuous impedance range. As with the first shunt connected attenuation circuit segment 512, the second and third plurality of stacked transistors 520, 522 provide substantially all of the attenuation in the second shunt connected attenuation circuit segment 514 and in the series connected attenuation circuit segment 516.

The control circuit 502 may be operably associated with the plurality of stacked transistors 518, 520, 522 in each of the attenuation circuit segments 512, 514, 516 to control the first variable impedance level, the second variable impedance level, and the third variable impedance level based on a signal level of an attenuation control signal 524. The variable attenuation level is based on the first, second, and third variable impedance level. In this case, the attenuation control signal 524 may be the control voltage, V_control, having a continuous voltage range of 0-5V. The control circuit 502 may be adapted to receive the control voltage, V_control, and generate a shunt segment control signal 526 and a series segment control signal 528 having signal levels that are based on the voltage level of the control voltage, V_control. The gate terminals of the plurality of stacked transistors 518, 520, 522 may be coupled to the control circuit 502 to receive the shunt segment control signal 526 and the series segment control signal 528. In this embodiment, the shunt segment control signal 526 is a control voltage, Vcontrol_A and the series segment control signal 528 is a control voltage, Vcontrol_B, which are generated by the control circuit 502 based on the control voltage, V_control. Consequently, the voltage levels of the control voltages, Vcontrol_A, Vcontrol_B, are set in accordance to the transfer function of the control circuit 502 which provide the appropriate bias to the gate terminals of the plurality of stacked transistors 518, 520, 522 and set the first variable impedance level, the second variable impedance level, and the third variable impedance level. In this manner, the control circuit 502 is operably associated with each of the plurality of stacked transistors 518, 520, 522 to control the first variable impedance level, the second variable impedance level, and the third variable impedance level based on the voltage level of the control voltage, V_control. Thus, the variable attenuation level of the attenuation circuit 500 is set at the desired attenuation level within the total continuous impedance range based on the voltage level of the control voltage, V_control.

To reduce parasitic capacitances and preserve high bandwidth, each of the attenuation circuit segments 512, 514, 516 include a first, second, and third resistive circuit 530, 532, 534, respectively. In this embodiment, each of the resistive circuits 530, 532, 534, have resistors Rg1, Rg2, Rg3 coupled in series with the gate terminals of the first, second, and third plurality of stacked transistors 518, 520, 522. The resistance of the resistive circuit 530 may be selected to be high relative to the first continuous impedance range provided by the first shunt connected attenuation circuit segment 512 and high relative to the $C_{gs}$ and $C_{gd}$, at the frequencies of interest. If the resistance of the resistive circuit 530 is high enough, the parasitic capacitances between the source terminals and gate terminals, and the drain terminals and gate terminals of the first plurality of stacked transistors 518 become negligible within the first continuous impedance range since these parasitic capacitances are coupled to the high resistances provided by the resistive circuit 530.

Generally, the resistor Rg1, may be at least around 10 times greater than the inverse of the highest value of the drain to source conductance of one of the first plurality of stacked transistors 518, and the RC high pass pole created by Rg1 and $C_{gs}$ and $C_{gd}$ may ideally be lower than the frequency of operation. The control voltage, Vcontrol_A, may appear effectively as an open circuit voltage at the gate terminals of the first plurality of stacked transistors 518 so that the gate terminals of the first plurality of stacked transistors 518 do not load the first shunt connected attenuation circuit segment 512. However, the resistance at the gate terminals may vary depending on the materials and layers utilized in the first plurality of stacked transistors 518 and also the desired bandwidth of the first shunt connected attenuation circuit segment 512. In the same manner, the resistance of the second and third resistive circuits 532, 534 may be selected to be high relative to the second and third continuous impedance range, respectively.

It should be noted that while all of the resistors Rg1, Rg2, Rg3 in resistive circuits 530, 532, 534 are coupled in series with one of the gate terminals of the first, second, and third plurality of stacked transistors 518, 520, 522. In alternative embodiments, one or more of the resistors Rg1, Rg2, Rg3, may be coupled between one of the gate terminals of one of the first, second, and third plurality of stacked transistors 518, 520, 522 and another of the gate terminals of another one of the first, second, and third plurality of stacked transistors 518, 520, 522, as described in FIG. 17. The resistive circuits 476, 478, 480, 530, 532, 534 in FIGS. 17 and 18 may have any configuration so as to provide the appropriate resistances to the gate terminals of the plurality of stacked transistors 464, 466, 468, 518, 520, 522.

Figure 19:
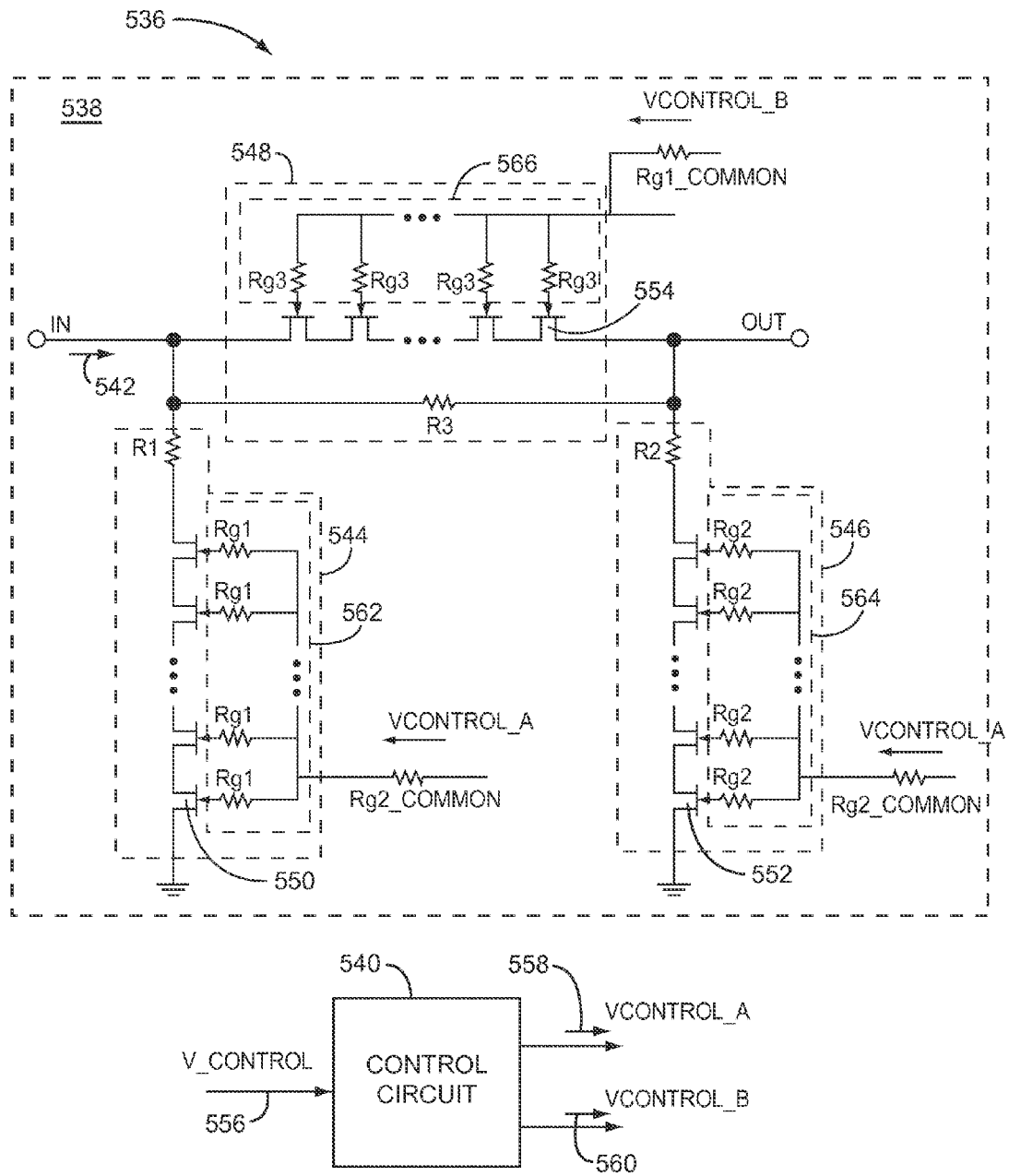
FIG. 19 is a circuit diagram of an additional embodiment of a variable attenuator having an attenuation circuit in a bridged Pi-type configuration.

Referring now to FIG. 19, a circuit diagram of another embodiment of an attenuator 536 having an attenuation circuit 538 in a Pi-type configuration and a control circuit 540 is shown. To attenuate an input signal 542, the attenuation circuit 538 includes a first shunt connected attenuation circuit segment 544, a second shunt connected attenuation circuit segment 546, and a series connected attenuation circuit segment 548.

The attenuation circuit segments 544, 546, 548 each have a plurality of stacked transistors 550, 552, 554, which in this example are body connected stacked FET devices. The number and type of transistors in each of the plurality of stacked transistors 550, 552, 554 may be the same or vary depending on the desired attenuation characteristics of the attenuation circuit 538. In this embodiment, each of the transistors in the plurality of stacked transistors 550, 552, 554 is a FET and the transistors are stacked by coupling the source and drain terminals of each transistor in series. The first shunt connected attenuation circuit segment 544 has a first variable impedance level within a first continuous impedance range. In this embodiment, the first plurality of stacked transistors 550 has an impedance level that may be varied within a continuous impedance range. Thus, the first plurality of stacked transistors 550 are coupled in the first shunt connected attenuation circuit segment 544 to provide the first variable impedance level. However, the resistor, R1, is coupled in series with the first plurality of stacked transistors 550 and also provides attenuation within the first shunt connected attenuation circuit segment 544. Thus, the first variable impedance level and the first continuous impedance range are also defined by the resistor, R1. Similarly, the second plurality of stacked transistors 552 are coupled within the second shunt connected attenuation circuit segment 546 to provide a second variable impedance level having a second continuous impedance range. However, resistor R2 is also provided in series with the second plurality of stacked transistors 552 to attenuate within the second shunt connected attenuation circuit segment 546. Thus, the second variable impedance level and the second continuous impedance range also defined by the resistor R2.

Finally, the series connected attenuation circuit segment 548 has a third variable impedance level having a third continuous impedance range. The third plurality of stacked transistors 554 are also coupled within the series connected attenuation circuit segment 548 to provide the third variable impedance level having the third continuous impedance range. However, resistor R3 is coupled in parallel with the third plurality of stacked transistors 554 to provide attenuation in the series connected attenuation circuit segment 548. Thus, the third variable impedance level and the third continuous impedance range are also defined by the resistor R3.

The resistors R1, R2, R3, provide an improvement in the linearity of the attenuation circuit 538 but may also be utilized in the other attenuation circuits described in this disclosure, including the Tee-type configurations described above. The resistors R1, R2 improve linearity by defining the maximum impedance level of the attenuation circuit 538. In an alternative embodiment, the resistors R1, R2 could also be placed in parallel with the first and second plurality of stacked transistors 550, 552, respectively. In another alternative embodiment, the resistors R1, R2 could be replaced by a plurality of resistors each coupled in parallel with one of the first plurality of stacked transistors 550 or second plurality of stacked transistors 552. In yet another alternative embodiment, the resistors R1 and R2 may each be replaced with a transistor or a stack of transistors operated using relatively large control voltages, which may be much greater than the threshold voltages of the transistor(s).

The resistor R3 also provides improved linearity within the attenuation circuit 538 by defining the minimum impedance level of the attenuation circuit 538. In an alternative embodiment, the resistor R3 may be coupled in series with the third plurality of stacked transistors 554. In yet another alternative embodiment, the resistor, R3 may be replaced with a plurality of resistors, each coupled in parallel with one of the third plurality of stacked transistors. In still yet another embodiment, the resistor R3 may be replaced with a transistor or another plurality of stacked transistors operated using relatively large control voltages, which may be much greater than the threshold voltages of the transistor(s). In fact, any resistive circuit may be utilized to provide the desired minimum and/or maximum impedance levels of the attenuation circuit 538 and the other attenuation circuits described throughout this disclosure.

The control circuit 540 in FIG. 19 may be operably associated with the plurality of stacked transistors 550, 552, 554 in each of the attenuation circuit segments 544, 546, 548 to control the first variable impedance level, the second variable impedance level, and the third variable impedance level based on a signal level of an attenuation control signal 556. In this case, the attenuation control signal 556 may be the control voltage, V_control, having a continuous voltage range of 0-5V. The control circuit 540 may be adapted to receive the control voltage, V_control, and generate a shunt segment control signal 558 and a series segment control signal 560 having signal levels that are based on the voltage level of the control voltage, V_control. The gate terminals of the plurality of stacked transistors 550, 552, 554 may be coupled to the control circuit 540 to receive the shunt segment control signal 558 and the series segment control signal 560. In this embodiment, the shunt segment control signal 558 is a control voltage, Vcontrol_A and the series segment control signal 560 is a control voltage, Vcontrol_B, which are generated by the control circuit 540 based on the control voltage, V_control. Consequently, the voltage levels of the control voltages, Vcontrol_A, Vcontrol_B, are set in accordance to the transfer function of the control circuit 540 which provide the appropriate voltage to the gate terminals of the plurality of stacked transistors 550, 552, 554 and set the first variable impedance level, the second variable impedance level, and the third variable impedance level. In this manner, the control circuit 540 is operably associated with each of the plurality of stacked transistors 550, 552, 554 to control the variable attenuation level of the attenuation circuit 538 based on the voltage level of the control voltage, V_control. Also, each of the attenuation circuit segments 544, 546, 548 include a first, second, and third resistive circuit 562, 564, 566, respectively to reduce distortion. In this embodiment, each of the resistive circuits 562, 564, 566, have resistors, Rg1, Rg2, Rg3 coupled in series with the gate terminals of the first, second, and third plurality of stacked transistors 550, 552, 554.

Figure 20:
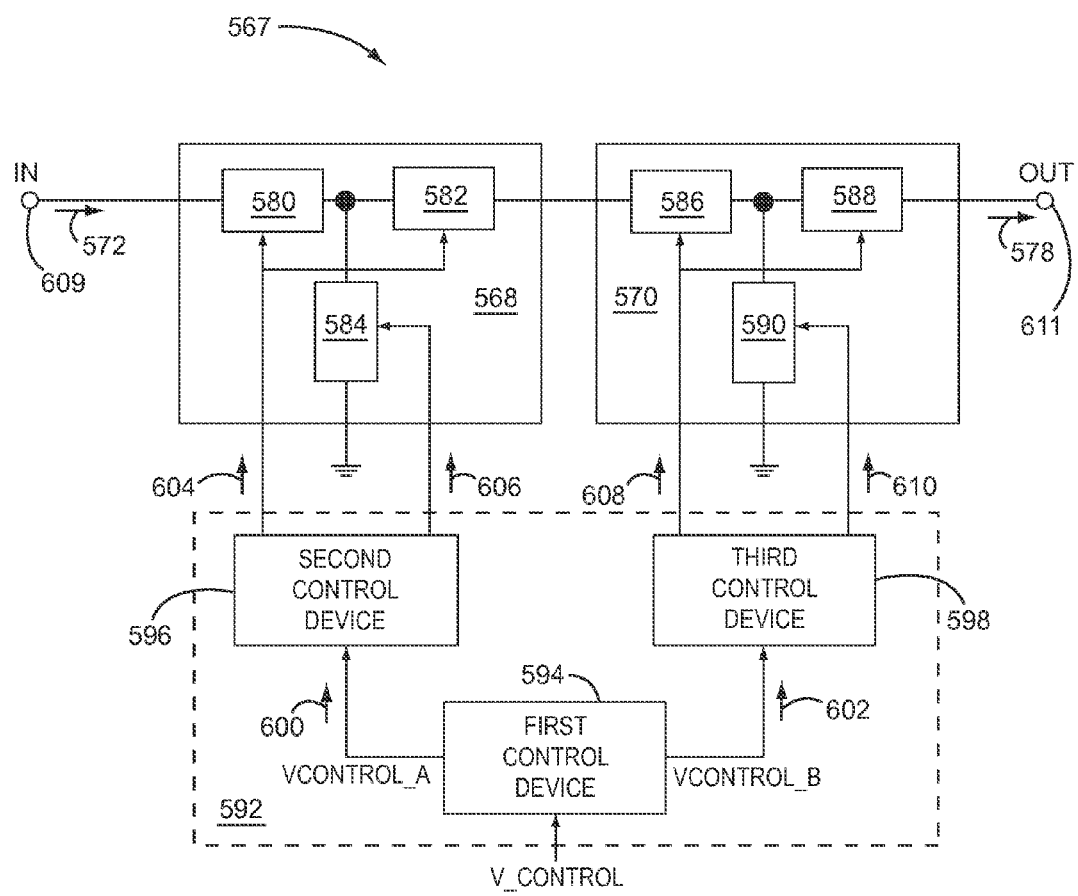
FIG. 20 illustrates an embodiment of a variable attenuator in accordance with the present disclosure having a cascaded first and second attenuation circuits wherein each attenuation circuit is in a Tee-type configuration.

Referring now to FIG. 20, an attenuator 567 may also have attenuation circuits 568, 570 cascaded with one another to attenuate an input signal 572. For example, in the illustrated embodiment of FIG. 20, the attenuator 567 has a first attenuation circuit 568 cascaded with a second attenuation circuit 570. In this embodiment, both the first and the second attenuation circuits 568, 570 are configured in a Tee type configuration. Each attenuation circuit 568, 570 is coupled between an input terminal 574 and an output terminal 576 to attenuate the input signal 572 and generate an attenuated output signal 578. The first attenuation circuit 568 includes a first series connected attenuation circuit segment 580, a second series connected attenuation circuit segment 582, and a first shunt connected attenuation circuit segment 584. The second attenuation circuit 570 includes a third series connected attenuation circuit segment 586, a fourth series connected attenuation circuit segment 588, and a second shunt connected attenuation circuit segment 590. Each attenuation circuit segment 580, 582, 584, 586, 588, 590 has a plurality of stacked transistors coupled that are coupled in the attenuation circuit segments 580, 582, 584, 586, 588, 590 to provide a total variable attenuation level having a continuous attenuation range between the input and output terminals 609, 611.

To control the variable impedance levels of each of the attenuation circuit segments 580, 582, 584, 586, 588, 590, the attenuator 567 has a control circuit 592. In this embodiment, the control circuit 592 includes a first control device 594, a second control device 596, and a third control device 598. The first control device 594 is adapted to receive a control voltage, V_control that controls the total variable attenuation level of the attenuator 567. To do this, the first control device 594 generates a first attenuation circuit control signal 600 based on the control voltage, V_control, that is utilized to control the variable attenuation level of the first attenuation circuit 568. The first attenuation circuit control signal 600 may be a control voltage, Vcontrol_A, having a continuous voltage range. The first control device 594 also generates a second attenuation circuit control signal 602 based on the control voltage, V_control that is utilized to control the variable attenuation level of the second attenuation circuit 570. The second attenuation circuit control signal 602 may be a control voltage, Vcontrol_B having a continuous voltage range. The transfer function of the illustrated first control device 594 is configured to generate the control voltages, Vcontrol_A, Vcontrol_B, at the appropriate voltage levels based on the voltage level of the control voltage, V_control.

Next, the control voltage, Vcontrol_A, is received by the second control device 596. Based on the voltage level of the control voltage, Vcontrol_A, the second control device 596 generates a first series segment control signal 604 and a first shunt segment control signal 606. The first series segment control signal 604 is received to control the operation of the plurality of stacked transistors in each of the first and second series connected attenuation circuit segments 580, 582 in the first attenuation circuit 568. The first shunt segment control signal 606 controls the operation of the plurality of stacked transistors in the first shunt connected attenuation circuit segment 584. In this manner, the second control device 596 can control the variable attenuation level of the first attenuation circuit 568. Similarly, the control voltage, Vcontrol_B is received by the third control device 598. Based on the voltage level of the control voltage, Vcontrol_B, the third control device 598 generates a second series segment control signal 608 and a second shunt segment control signal 610. The second series segment control signal 608 is received to control the operation of the plurality of stacked transistors in each of the third and fourth series connected attenuation circuit segments 586, 588 in the second attenuation circuit 570. The second shunt segment control signal 610 controls the operation of the plurality of stacked transistors in the second shunt connected attenuation circuit segment 590. In this manner, the third control device 598 controls the variable attenuation level of the second attenuation circuit 570. By controlling the variable attenuation level of both of the attenuation circuits 568, 570, the control circuit 592 can control the total variable attenuation level of the attenuator 567 based on the voltage level of the control voltage, V_control.

In alternative embodiments, the attenuator 567 may have any number of additional attenuation circuits cascaded with the first and second attenuation circuits 568, 570. Additional control devices may be provided in the control circuit 592 in addition to the first, second, and third control devices 594, 596, 598 to control the additional attenuation circuits. Each attenuation circuit 568, 570 provides a variable attenuation level from its input to its output and the provide the total variable attenuation level of the attenuator 567 from the input terminal 609 to the output terminal 611

Figure 21:
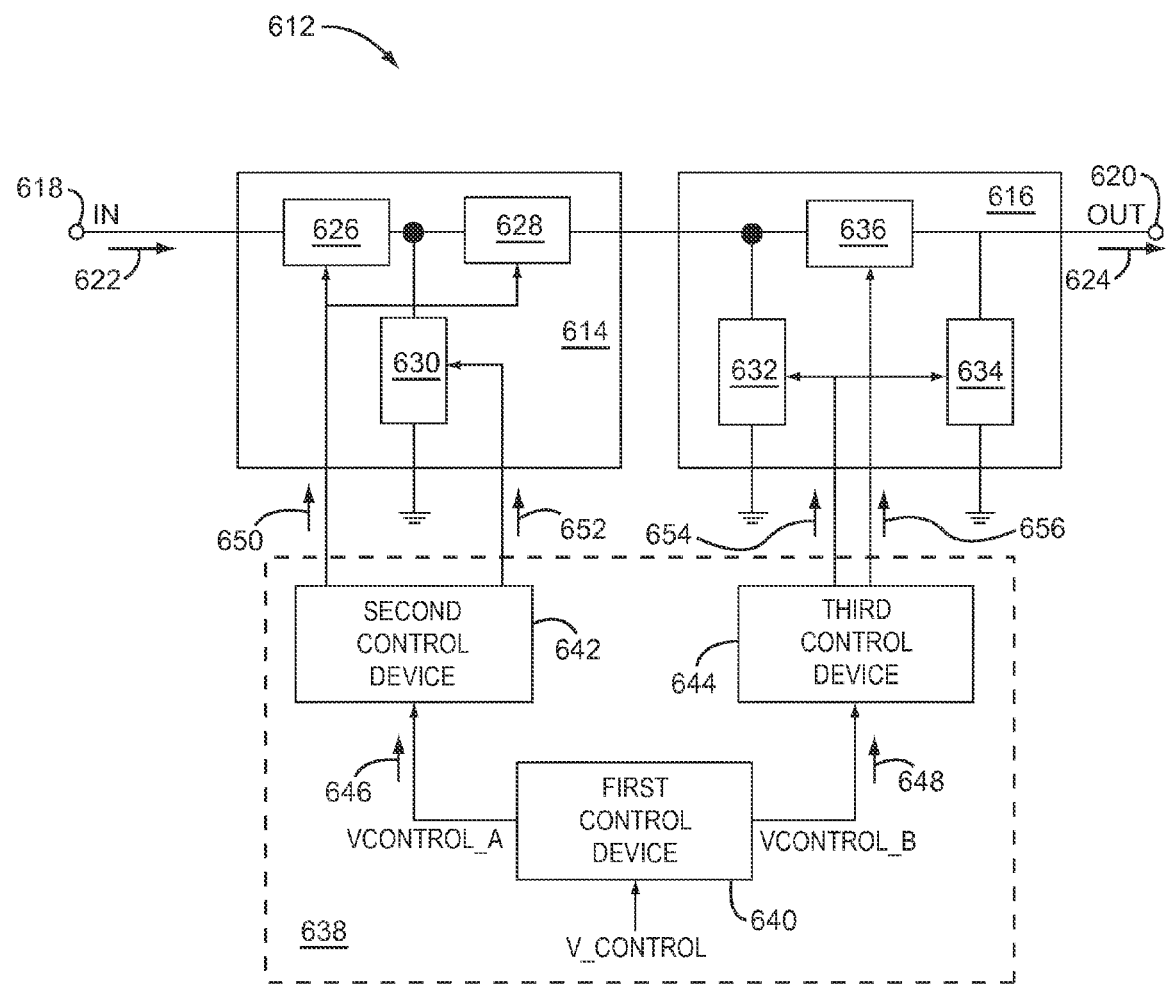
FIG. 21 is illustrates an embodiment of a variable attenuator in accordance with this disclosure having a cascaded first and second attenuation circuits wherein the first attenuation circuit is in a Tee-type configuration and the second attenuation circuit is in a Pi-type configuration.

Referring now to FIG. 21, an attenuator 612 may have cascaded attenuation circuits 614, 616 that have any combination of attenuator configurations. In the embodiment of the attenuator 612 illustrated in FIG. 21, a first attenuation circuit 614 is in a Tee-type configuration and a second attenuation circuit 616 is in a Pi-type configuration. Each attenuation circuit 614, 616 is coupled between an input terminal 618 and an output terminal 620 to attenuate an input signal 622 and generate an attenuated output signal 624. The first attenuation circuit 614 includes a first series connected attenuation circuit segment 626, a second series connected attenuation circuit segment 628, and a first shunt connected attenuation circuit segment 630. The second attenuation circuit 616 includes a second shunt connected attenuation circuit segment 632, a third shunt connected attenuation circuit segment 634, and a third series connected attenuation circuit segment 636. Each attenuation circuit segment 626, 628, 630, 632, 634, 636 has a plurality of stacked transistors that are coupled in the attenuation circuit segment 626, 628, 630, 632, 634, 636 to provide a variable impedance level having a continuous impedance range.

To control the variable impedance levels of each of the attenuation circuit segments 626, 628, 630, 632, 634, 636, the attenuator 612 has a control circuit 638. In this embodiment, the control circuit 638 includes a first control device 640, a second control device 642, and a third control device 644. The first control device 640 is adapted to receive a control voltage, V_control that controls the total variable attenuation level of the attenuator 612. To do this, the first control device 640 generates a first attenuation circuit control signal 646 based on the control voltage, V_control, that is utilized to control the variable attenuation level of the first attenuation circuit 614. The first attenuation control signal 646 may be a control voltage, Vcontrol_A, having a continuous voltage range. The first control device 640 also generates a second attenuation circuit control signal 648 based on the control voltage, V_control that is utilized to control the variable attenuation level of the second attenuation circuit 616. The second attenuation circuit control signal 648 may be a control voltage, Vcontrol_B, having a continuous voltage range. The transfer function of the illustrated first control device 640 is configured to generate the control voltages, Vcontrol_A, Vcontrol_B, at the appropriate voltage levels based on the voltage level of the control voltage, V_control.

Next, the control voltage, Vcontrol_A is received by the second control device 642. Based on the voltage level of the control voltage, Vcontrol_A, the second control device 642 generates a first series segment control signal 650 and a first shunt segment control signal 652. The first series segment control signal 650 is received to control the operation of the plurality of stacked transistors in each of the first and second series connected attenuation circuit segments 626, 628 in the first attenuation circuit 614. The first shunt segment control signal 652 controls the operation of the plurality of stacked transistors in the first shunt connected attenuation circuit segment 630. In this manner, the second control device 642 can control the variable attenuation level of the first attenuation circuit 614. Similarly, the control voltage, Vcontrol_B is received by the third control device 644. Based on the voltage level of the control voltage, Vcontrol_B, the third control device 644 generates a second shunt segment control signal 654 and a second series segment control signal 656. The second shunt segment control signal 654 is received to control the operation of the plurality of stacked transistors in each of the second and third shunt connected attenuation circuit segments 632, 634 in the second attenuation circuit 616. The second series segment control signal 656 controls the operation of the plurality of stacked transistors in the third series connected attenuation circuit segment 636. By controlling the variable attenuation level of both of the attenuation circuits 614, 616 the control circuit 638 can control the total variable attenuation level of the attenuator 612 based on the voltage level of the control voltage, V_control.

Figure 22:
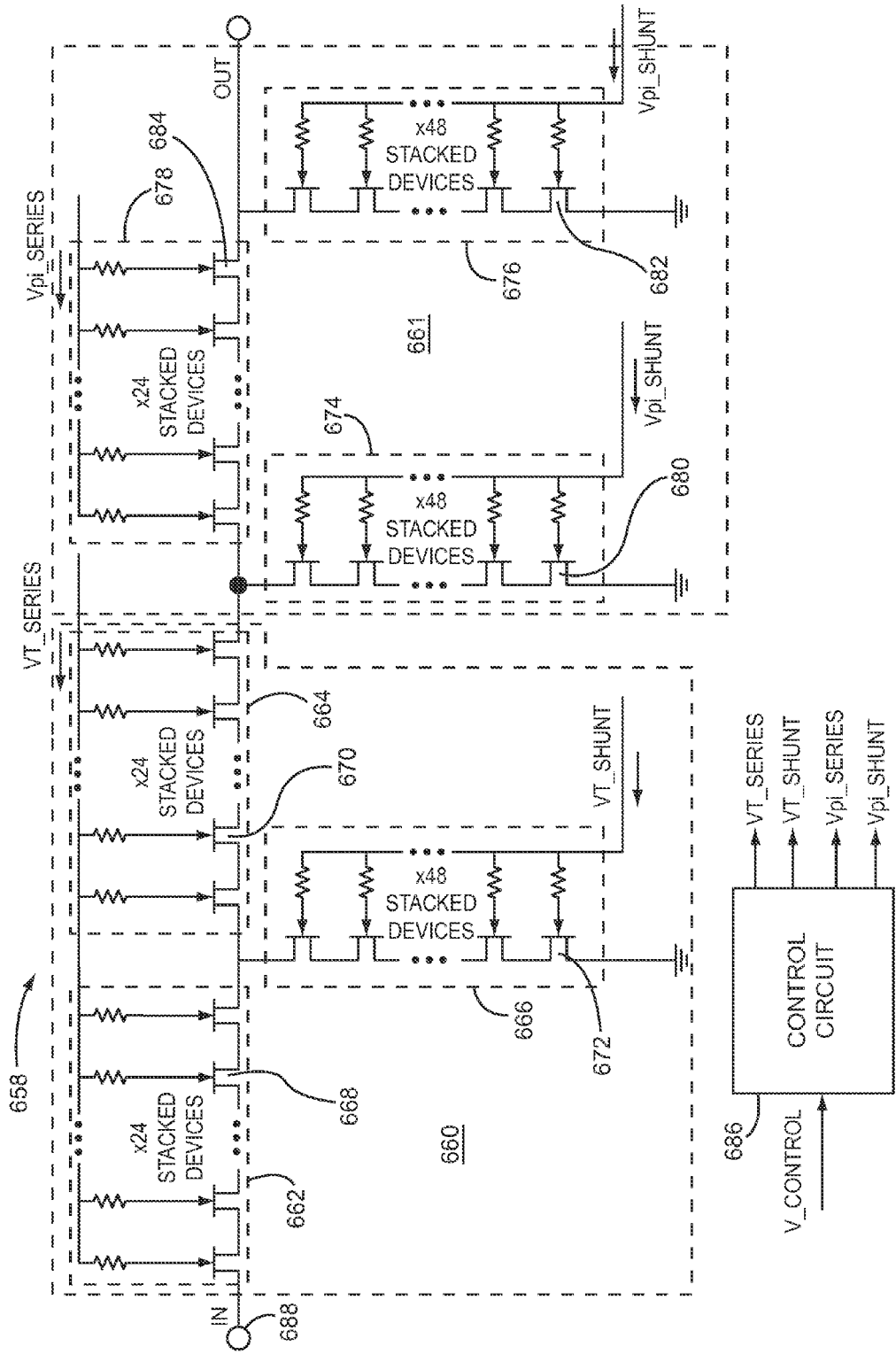
FIG. 22 is a circuit diagram of an embodiment of a variable attenuator in accordance with FIG. 21 having cascaded first and second attenuation circuits wherein the first attenuation circuit is in a Tee-type configuration and the second attenuation circuit is in a Pi-type configuration.

FIG. 22 is a circuit diagram of one embodiment of an attenuator 658 having a first attenuation circuit 660 in a Tee-type configuration cascaded with a second attenuation circuit 661 in a Pi-type configuration. The first attenuation circuit 660 includes a first series connected attenuation circuit segment 662, a second series connected attenuation circuit segment 664, and a first shunt connected attenuation circuit segment 666. The first and second series connected attenuation circuit segments 662, 664 each include a stack 668, 670 of twenty-four (24) MOSFETs. In this embodiment, the MOSFETs in each stack 668, 670 are formed on a silicon-on-insulator type substrate and the MOSFETs have a width around 4 mm and a depth around 0.32 microns. The first shunt connected attenuation circuit segment 666 includes a stack 672 of forty-eight (48) MOSFETs formed on the same silicon-on-insulator type substrate.

Next, the second attenuation circuit 661 includes a second shunt connected attenuation circuit segment 674, a third shunt connected attenuation circuit segment 676, and a third series connected attenuation circuit segment 678. Each of the second and third shunt connected attenuation circuit segments, 674, 676 in the second attenuation circuit 661 has a stack 680, 682 of forty-eight (48) MOSFETs formed on the silicon-on-insulator type substrate. In this embodiment, the MOSFETs in each stack 680, 682 have a width of around 1 mm and a depth of around 0.32 microns. The third series connected attenuation circuit segment 678 in the second attenuation circuit 661 has a stack 684 of twenty-four (24) MOSFETs formed on the silicon-on-insulator type substrate.

To control the variable attenuation level of the first attenuation circuit 660, a control circuit 686 is adapted to receive a control voltage, V_control, having a continuous voltage range from 0-5V. The control circuit 686 may be operable to generate a control voltage, VT_series that controls the stack 668, 670 of MOSFETs in the first and second series connected attenuation circuit segments 662, 664 of the first attenuation circuit 660. The control circuit 686 may generate a control voltage, VT_shunt that controls the stack 672 of MOSFETs in the first shunt connected attenuation circuit segment 666 of the first attenuation circuit 660. To control the variable attenuation level of the second attenuation circuit 661, the control circuit 686 generates a control voltage, Vpi_series, that controls the stack 684 in the third series connected attenuation circuit segment of the second attenuation circuit 661. Also, a control voltage, Vpi_shunt, may be generated by the control circuit 686 to control the stacks 680, 682 in the second and third shunt connected attenuation circuit segments 674, 676 of the second attenuation circuit 661. By controlling the variable attenuation level of the first attenuation circuit 660 and the variable attenuation level of the second attenuation circuit 661, the control circuit 686 can control the total variable attenuation level of the attenuator 658 based on the voltage level of the control voltage, V_control.

Figure 23:
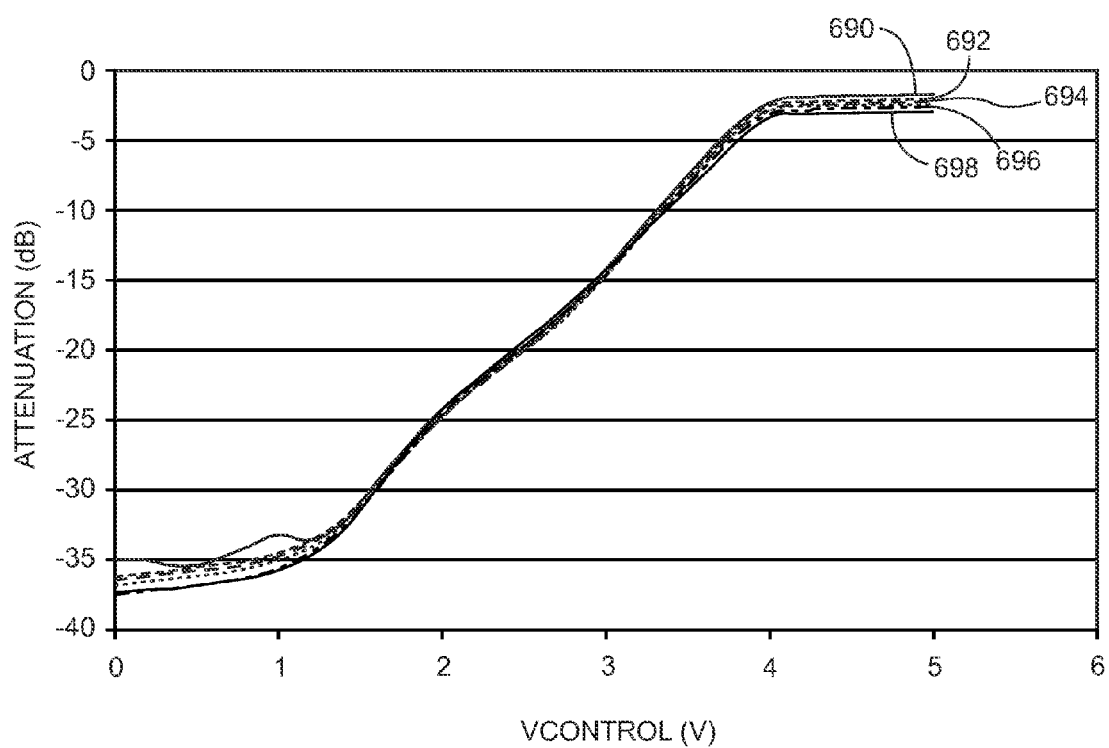
FIG. 23 illustrates a total attenuation level of the cascaded first and second attenuation circuits versus the control voltage level of the variable attenuator described in FIG. 22.

Referring now to FIG. 22 and FIG. 23, FIG. 23 is a graph that plots the total variable attenuation level of the cascaded attenuation circuits 660, 661, as measured from an input terminal 688, throughout the range of the control voltage, V_control, 0-5V. The total variable attenuation level has a total continuous attenuation range of about 3 dB to 35 dB. A first line 690 plots the total variable attenuation level of the attenuator 658 through the total continuous attenuation range at the frequency of 10 MHz. A second line 692, third line 694, fourth line 696, fifth line 698 plots the total variable attenuation level at the frequencies of 100 MHz, 500 MHz, 1 GHz, 2 GHz, and 3 GHz, respectively. FIG. 23 demonstrates that the total variable attenuation level of the attenuator 658 may be remarkably consistent and linear in dB throughout a large bandwidth.

Figure 24:
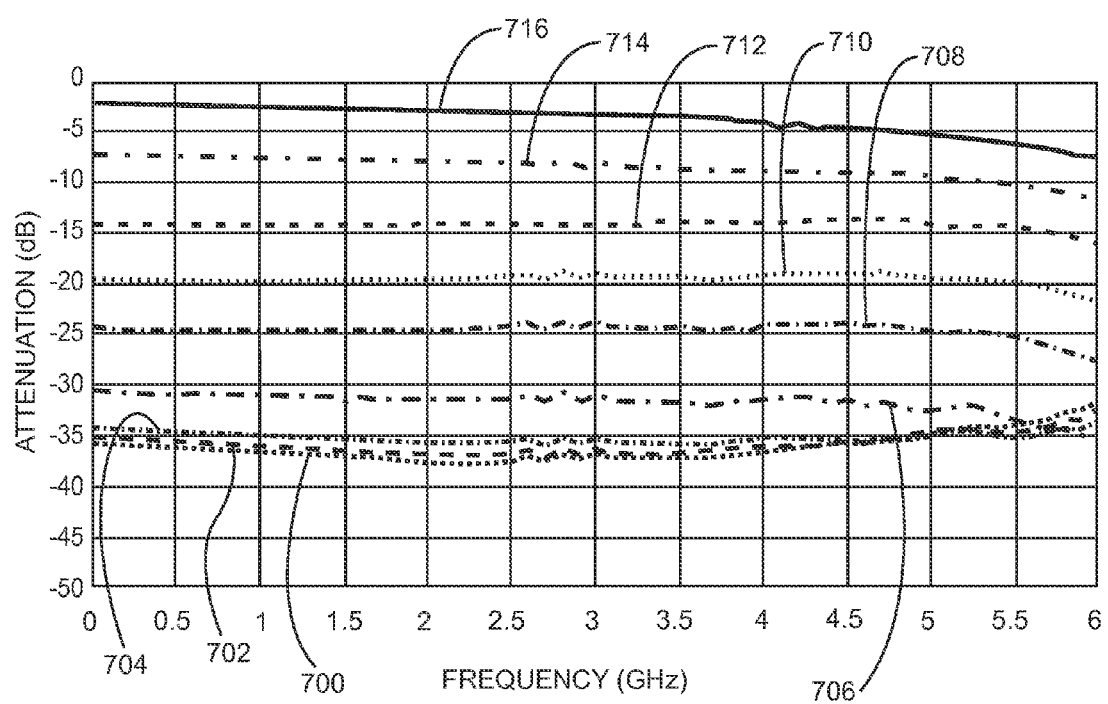
FIG. 24 is a graph illustrating the total attenuation level versus frequency of the variable attenuator described in FIG. 22, at different control voltage levels.

Referring now to FIGS. 22 and 24, FIG. 24 is a graph that plots the total variable attenuation level, as measured from the input terminal 688, versus frequency when the control voltage, V_control is set at different voltage levels. A first line 700 plots the total variable attenuation level when the control voltage, V_control, is at 0V. A second line 702, third line 704, fourth line 706, fifth line 708, sixth line 710, seventh line 712, eighth line 714, and ninth line 716, plot the total variable attenuation level when the control voltage, V_control, is set at 1.0V, 2.0V, 2.5V, 3.0V, 3.5V, 4.0V, 4.5V, and 5V, respectively. FIG. 24 also demonstrates that the total variable attenuation level may be remarkably consistent and linear in dB throughout a wide bandwidth.

Figure 25:
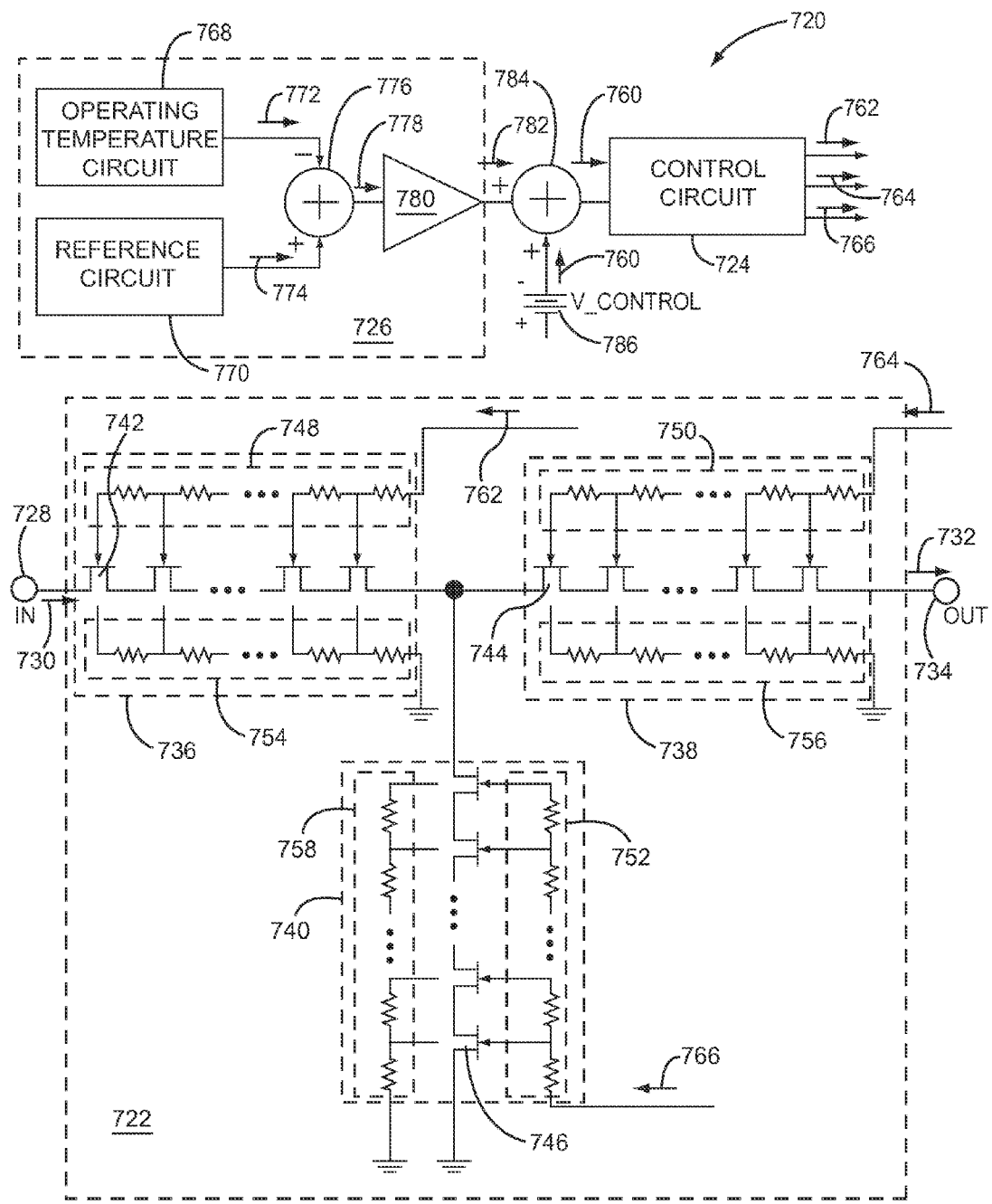
FIG. 25 illustrates a circuit diagram of one embodiment of a temperature compensation attenuator having an attenuation circuit in a Tee-type configuration.

The attenuation circuits and cascade of attenuation circuits described in the Figures above may also be utilized in temperature compensation attenuators having less distortion and a relatively high bandwidth. For example, FIG. 25 is a circuit diagram of a temperature compensating attenuator 720 having an attenuation circuit 722, a control circuit 724, and a temperature compensation circuit 726. The attenuation circuit 722 has an input terminal 728 for receiving an input signal 730. The attenuation circuit 722 attenuates the input signal 730 to generate an attenuated output signal 732 that is output from an output terminal 734. To attenuate the input signal 730, the attenuation circuit 722 includes a first series connected attenuation circuit segment 736, a second series connected attenuation circuit segment 738, and a shunt connected attenuation circuit segment 740.

The first series connected attenuation circuit segment 736, the second series connected attenuation circuit segment 738, and the shunt connected attenuation circuit segment 740 may each have a first, second, and third plurality of stacked transistors 742, 744, 746, respectively. The transistors in each of the first, second, and third plurality of stacked transistors 742, 744, 746 may be any type of transistors. In FIG. 25, the transistors in each of the first, second, and third plurality of stacked transistors 742, 744, 746 are heterostructure FETs (HFETs) or metal semiconductor FETs (MESFETs). Also, in this embodiment, the first series connected attenuation circuit segment 736, the second series connected attenuation circuit segment 738, and the shunt connected attenuation circuit segment 740 each include first, second, and third resistive circuit 748, 750, 752, respectively, and first, second, and third biasing circuitry 754, 756, 758, respectively, that help reduce distortion in the attenuation circuit 722.

In this embodiment, the temperature compensation circuit 726 adjusts an attenuation control signal 760, which in this example is a control voltage, V_control. The control circuit 724 receives the control voltage, V_control, and is operable to generate a first series segment control signal 762, a second series segment control signal 764, and a shunt segment control signal 766. To adjust the control voltage, V_control, the temperature compensation circuit 726 includes an operating temperature circuit 768 and a reference circuit 770. The operating temperature circuit 768 generates an operating temperature signal 772 having a signal level that is related to an operating temperature associated with the attenuation circuit 722. This may be done utilizing various techniques. For example, the operating temperature circuit 768 may have a temperature sensitive component(s), such as a transistor, thermally associated with one or more of the transistors in the first series connected attenuation circuit segment 736, the second series connected attenuation circuit segment 738, and/or the shunt connected attenuation circuit segment 740. The operating temperature circuit 768 could thus sense the operating temperature based on the operation of the temperature sensitive component. In the alternative, the operating temperature circuit 768 may receive a feedback signal from the attenuation circuit 722 that varies in accordance with the operating temperature. Also, the operating temperature circuit 768 may be time-based and may be configured to generate the operating temperature signal 772 based on the thermal characteristics of the attenuation circuit 722 and the amount of time that has passed since the attenuation circuit 722 began to operate. These and other embodiments of the operating temperature circuit 768 that generate an operating temperature signal 772 having a signal level that is related to the operating temperature associated with the attenuation circuit 722 are within the scope of the disclosure. The operating temperature signal 772 may be scaled by components, such as a resistor(s), within the operating temperature circuit 768.

A reference circuit 770 is operable to generate a reference signal 774. The temperature compensation circuit 726 may include a comparator 776 that generates a comparison signal 778 having a signal level related to a difference between the operating temperature signal 772 and the reference signal 774. The reference signal 774 may thus have a signal level that is utilized by the comparator 776 to determine a change in temperature. The reference circuit 770 may simply be a DC voltage or current source having a constant signal level selected so as to represent a reference temperature. In the alternative, the reference circuit 770 may have a temperature insensitive component that generates a current or a voltage that is substantially constant over a desired temperature range. The reference circuit 770 may generate the reference signal 774 based on the operation of the temperature insensitive component. Also, the reference circuit 770 may receive a current or a voltage having a signal level that is substantially constant over a desired temperature range. In this manner, the reference circuit 770 can generate the reference signal 774 based on the signal level of the received current or voltage. Also, the reference circuit 770 may include a temperature sensitive component(s), such as a transistor, that is thermally associated with a device other than the attenuation circuit 722. The reference circuit 770 could thus sense a reference temperature thermally associated with device and generate the reference signal 774 based on the operation of the temperature sensitive component(s). These and other embodiment of a reference circuit 770 operable to generate a reference signal 774 are within the scope of the disclosure.

The comparison signal 778 is received by an amplifier 780 that provides a gain of the temperature compensation circuit 726. The amplifier 780 amplifies the comparison signal 778 to generate an attenuation control adjustment signal 782 which in this example is a voltage output from the temperature compensation circuit 726. In this embodiment, both the control voltage, V_control and the temperature compensation circuit are received at an adding device 784. The adding device 784 adds the attenuation control adjustment signal 782 to the control voltage, V_control.

In this example, the control voltage, V_control, is from a constant DC source 786 that outputs a DC voltage at a fixed nominal voltage level. The fixed nominal voltage level sets a total variable attenuation level of the attenuation circuit 722 to a desired attenuation value when the operating temperature is at a predetermined temperature value. Thus, the temperature compensation circuit 726 illustrated in FIG. 25 is designed to maintain the total variable attenuation level of the attenuation circuit 722 at the desired attenuation value as the temperature drifts. This is desirable since, as is known in the art, the operation of the transistors in the first, second, and third plurality of stacked transistors 742, 744, 746 may change as the operating temperature of the transistors changes. If no difference is detected between the operating temperature signal 772 and the reference signal 774, then the attenuation control adjustment signal 726 does not adjust the voltage level of the control voltage, V_control. On the other hand, if a difference is detected between the operating temperature signal 772 and the reference signal 774, then the attenuation control adjustment signal 726 adjust the voltage level of the control voltage, V_control, to maintain the attenuation circuit 722 operating at the desired attenuation value.

Since the control voltage, V_control, is received having a fixed voltage level, the temperature compensation circuit 726 is designed to maintain each of the first series connected attenuation circuit segment 736, the second series connected attenuation circuit segment 738, and the shunt connected attenuation circuit segment 740 at a constant impedance level so that the variable attenuation level of the attenuation circuit 722 is kept at the desired attenuation value. To do this, the control circuit 724 is operable to generate the first series segment control signal 762, the second series segment control signal, 764, and the shunt segment control signal 766 in accordance with the voltage level of the control voltage, V_control, after adjustment by the attenuation control adjustment signal 782.

The control circuit 724 is operably associated with each of the first, second, and third plurality of stacked transistors 742, 744, 746. The first series segment control signal 762 controls the operation of the first plurality of stacked transistors 742. Similarly, the second series segment control signal 764 controls the operation of the second plurality of stacked transistors 744 and the shunt segment control signal 766 controls the operation of the third plurality of stacked transistors 746. By adjusting the voltage level of the control voltage, V_control, the temperature compensation circuit 726 also adjust a signal level of the control signals 762, 764, 766 to maintain the first series connected attenuation circuit segment 736 operating at its constant impedance level, the second series connected attenuation circuit segment 738 operating at its constant impedance level, and the shunt connected attenuation circuit segment 740 operating at its constant impedance level thereby keeping the attenuation circuit 722 operating at the desired attenuation value. The attenuation control adjustment signal 726 thus adjust the control voltage, V_control, from its nominal value set by the constant DC source 786 based on the operating temperature associated with the attenuation circuit 722.

Figure 26:
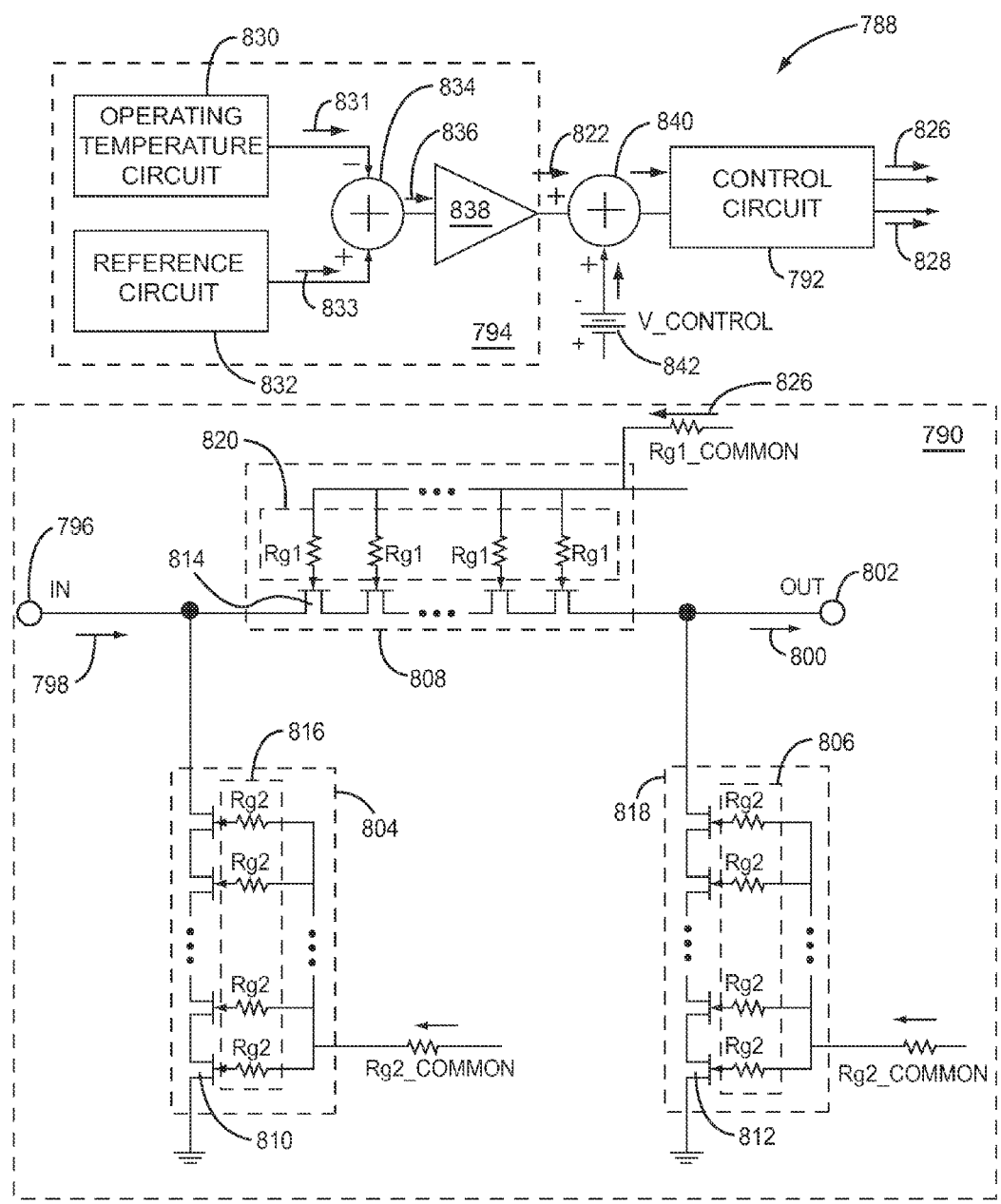
FIG. 26 illustrates a circuit diagram of one embodiment of a temperature compensation attenuator having an attenuation circuit in a Pi-type configuration.

FIG. 26 is a circuit diagram of yet another embodiment of an attenuator 788 having an attenuation circuit 790, a control circuit 792, and a temperature compensation circuit 794. In this embodiment, the attenuation circuit 790 is in a Pi-type configuration. The attenuation circuit 790 has an input terminal 796 for receiving an input signal 798. The attenuation circuit 790 attenuates the input signal 798 to generate an attenuated output signal 800 that is output from an output terminal 802. To attenuate the input signal 798, the attenuation circuit 790 includes a first shunt connected attenuation circuit segment 804, a second shunt connected attenuation circuit segment 806, and a series connected attenuation circuit segment 808.

The first shunt connected attenuation circuit segment 804, the second shunt connected attenuation circuit segment 806, and the series connected attenuation circuit segment 808 may each have a first, second, and third plurality of stacked transistors 810, 812, 814, respectively. The transistors in each of the first, second, and third plurality of stacked transistors, 810, 812, 814 may be any type of transistors. In FIG. 26, the transistors in each of the first, second, and third plurality of stacked transistors 810, 812, 814 are HFETs or MESFETs. Also, in this embodiment, the first shunt connected attenuation circuit segment 804, the second shunt connected attenuation circuit segment 806, and the series connected attenuation circuit segment 808 each include a first, second, and third resistive circuit 816, 818, 820, respectively, that help reduce distortion in the attenuation circuit 790.

In this embodiment, the temperature compensation circuit 794 generates an attenuation control adjustment signal 822, which adjusts the control voltage, V_control. The control circuit 792 receives the control voltage, V_control, and is operable to generate a shunt segment control signal 826 and a series segment control signal 828. To adjust the control voltage, V_control, the temperature compensation circuit 794 includes an operating temperature circuit 830 and a reference circuit 832. The operating temperature circuit 830 generates an operating temperature signal 831 having a signal level that is related to an operating temperature associated with the attenuation circuit 790. The operating temperature signal 831 may be scaled by components, such as a resistor(s), within the operating temperature circuit 830.

The reference circuit 832 is operable to generate a reference signal 833. The temperature compensation circuit 794 may include a comparator 834 that generates a comparison signal 836 having a signal level related to a difference between the operating temperature signal 831 and the reference signal 833. The reference signal 833 may thus have a signal level that is utilized by the comparator 834 to determine a change in temperature.

The comparison signal 836 is received by an amplifier 838 that provides a gain of the temperature compensation circuit 794. The amplifier 838 amplifies the comparison signal 836 to generate the attenuation control adjustment signal 822. In this embodiment, an adding device 840 receives the attenuation control adjustment signal 822 and a control voltage, V_control that may be generated at a fixed voltage level by constant voltage source 842. The adding device 840 adds the attenuation control adjustment signal 822 to the control voltage, V_control to adjust the control voltage, V_control.

The temperature compensation circuit 794 illustrated in FIG. 26 is also designed to maintain the variable attenuation level of the attenuation circuit 790 at the desired attenuation value if the temperature drifts. This is desirable since, as is known in the art, the operation of the transistors in the first, second, and third plurality of stacked transistors 810, 812, 814 may change as the operating temperature of the transistors changes. If no difference is detected between the operating temperature signal 831 and the reference signal 833, then the attenuation control adjustment signal 822 does not adjust the voltage level of the control voltage, V_control. On the other hand, if a difference is detected between the operating temperature signal 831 and the reference signal 833, then the attenuation control adjustment signal 822 adjust the voltage level of the control voltage, V_control, to maintain the attenuation circuit 790 operating at the desired attenuation value.

Since the control voltage is input at a fixed voltage level, the temperature compensation circuit 794 is designed to maintain each of the first shunt connected attenuation circuit segment 804, the second shunt connected attenuation circuit segment 806, and the series connected attenuation circuit segment 808 at a constant impedance level so that the variable level of the attenuation circuit 790 is kept at the desired attenuation value. To do this, the control circuit 792 is operable to generate the shunt segment control signal 826 and the series segment control signal 828 in accordance with the control voltage, V_control after adjustment by the attenuation control adjustment signal 822.

The control circuit 792 may be operably associated with each of the first, second, and third plurality of stacked transistors 810, 812, 814 to set each of the first shunt connected attenuation circuit segment 804, the second shunt connected attenuation circuit segment 806, and the series connected attenuation circuit segment 808 to their respective constant impedance levels. The shunt segment control signal 826 controls the operation of the first plurality of stacked transistors 810 and the second plurality of stacked transistors 812 coupled in the first and second shunt connected attenuation circuit segments 804, 806. Similarly, the series segment control signal 828 controls the operation of the series connected attenuation circuit segment 808. By adjusting the voltage level of the control voltage, V_control, the temperature compensation circuit 794 also adjust a signal level of the control signals 826, 828 in accordance with the difference between the operating temperature signal 831 and reference signal 833 to maintain the first shunt connected attenuation circuit segment 804 operating at its constant impedance level, the second shunt connected attenuation circuit segment 806 operating at its constant impedance level, and the series connected attenuation circuit segment 808 operating at its constant impedance level thereby keeping the attenuation circuit 790 operating at the desired attenuation value. The attenuation control adjustment signal 822 thus adjust the control voltage, V_control, from its nominal value set by the constant DC source 786 based on the operating temperature associated with the attenuation circuit 722.

Figure 27:
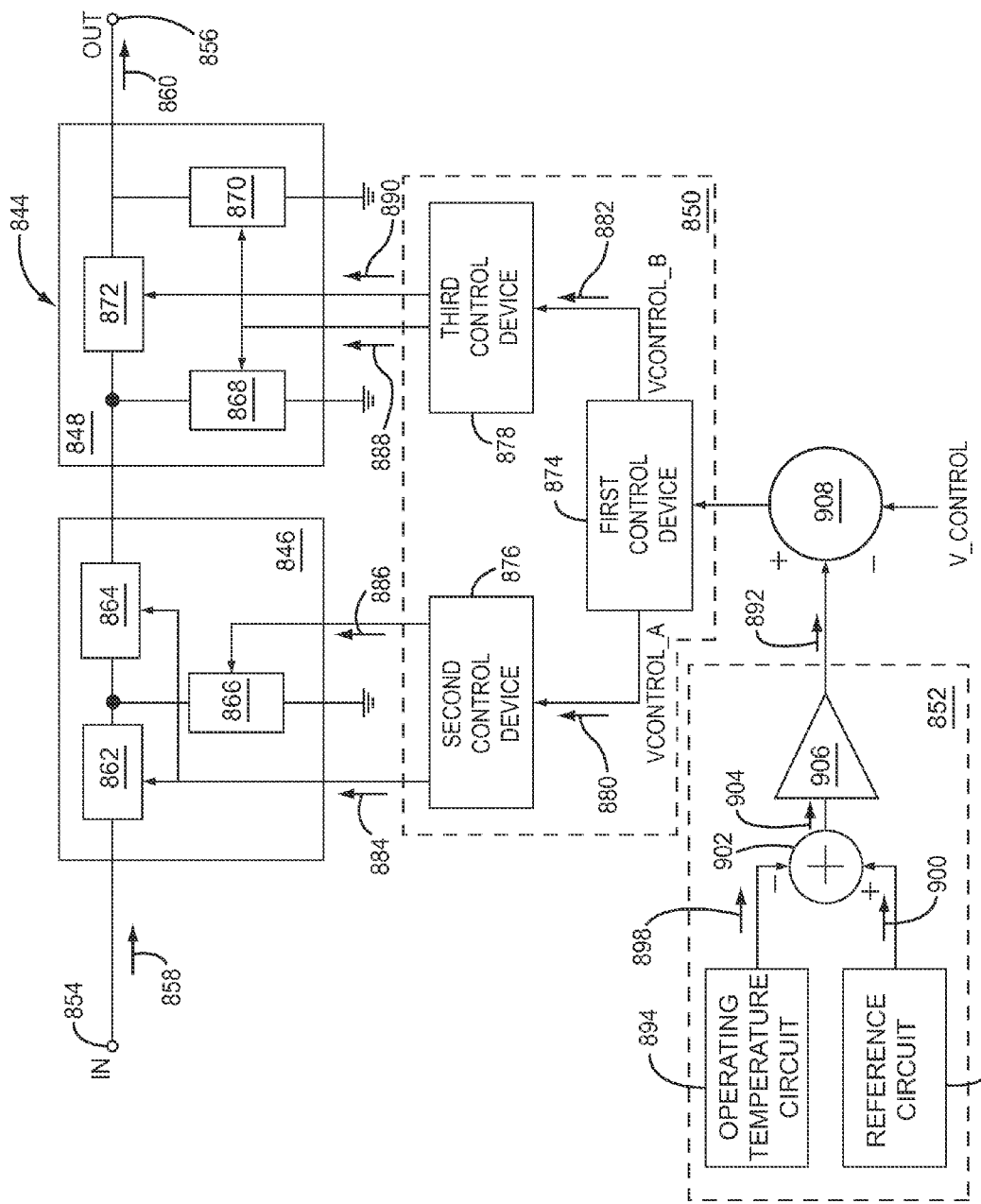
FIG. 27 illustrates one embodiment of a temperature compensation attenuator having cascaded first and second attenuation circuit segments, the first attenuation circuit segment being in a Tee-type configuration and the second attenuation circuit segment being in a Pi-type configuration.

FIG. 27 illustrates yet another embodiment of an attenuator 844 having a first attenuation circuit 846 in a Tee-type configuration, a second attenuation circuit 848 in a Pi-type configuration, a control circuit 850, and a temperature control circuit 852. The first attenuation circuit 846 and second attenuation circuit 848 are similar to the cascaded attenuation circuits 614, 616 described in FIG. 21. Each attenuation circuit 846, 848 is coupled between an input terminal 854 and an output terminal 856 to attenuate an input signal 858 and generate an attenuated output signal 860. The first attenuation circuit 846 includes a first series connected attenuation circuit segment 862, a second series connected attenuation circuit segment 864, and a first shunt connected attenuation circuit segment 866. The second attenuation circuit 848 includes a second shunt connected attenuation circuit segment 868, a third shunt connected attenuation circuit segment 870, and a third series connected attenuation circuit segment 872. Each attenuation circuit segment 862, 864, 866, 868, 870, 872 has a plurality of stacked transistors that are coupled in the attenuation circuit segment 862, 864, 866, 868, 870, 872 to provide a variable impedance level having a continuous impedance range.

To control the variable impedance levels of each of the attenuation circuit segments 862, 864, 866, 868, 870, 872, the attenuator 844 has the control circuit 850. A total variable attenuation level of the attenuator 844 is based on variable attenuation levels of the first attenuation circuit 846 and second attenuation circuit 848 at their inputs and outputs, which are each based on the variable impedance levels of the attenuation circuit segments 862, 864, 866, 868, 870, 872. The control circuit 850 includes a first control device 874, a second control device 876, and a third control device 878. The first control device 874 is adapted to receive a control voltage, V_control, that controls the total variable attenuation level of the attenuator 844. In this embodiment, a voltage level of the control voltage, V_control, can be varied within a continuous voltage range of 0-5V. As described above for the control circuit 638 of attenuator 612 in FIG. 21, the first control device 874 generates a first attenuation circuit control signal 880 based on the control voltage, V_control, that is utilized to control the variable attenuation level of the first attenuation circuit 846. The first attenuation control signal 880 may be a control voltage, Vcontrol_A having a continuous voltage range. The first control device 874 also generates a second attenuation circuit control signal 882 based on the control voltage, V_control, that is utilized to control the variable attenuation level of the second attenuation circuit 848. The second attenuation circuit control signal 882 may be a control voltage, Vcontrol_B having a continuous voltage range. The transfer function of the illustrated first control device 874 is configured to generate the control voltages, Vcontrol_A, Vcontrol_B, at the appropriate voltage levels based on the voltage level of the control voltage, V_control.

Next, the control voltage, Vcontrol_A, is received by the second control device 876. Based on the voltage level of the control voltage, Vcontrol_A, the second control device 876 generates a first series segment control signal 884 and a first shunt segment control signal 886. The first series segment control signal 884 is received to control the operation of the plurality of stacked transistors in each of the first and second series connected attenuation circuit segments 862, 864 in the first attenuation circuit 846. The first shunt segment control signal 886 controls the operation of the plurality of stacked transistors in the first shunt connected attenuation circuit segment 866. In this manner, the second control device 876 can control the variable attenuation level of the first attenuation circuit 846. Similarly, the control voltage, Vcontrol_B is received by the third control device 878. Based on the voltage level of the control voltage, Vcontrol_B, the third control device 878 generates a second shunt segment control signal 888 and a second series segment control signal 890. The second shunt segment control signal 888 is received to control the operation of the plurality of stacked transistors in each of the second and third shunt connected attenuation circuit segments 868, 870 in the second attenuation circuit 848. The second series segment control signal 890 controls the operation of the plurality of stacked transistors in the third series connected attenuation circuit segment 872. By controlling the variable attenuation level of both of the attenuation circuits 846, 848 the control circuit 850 can control the total variable attenuation level of the attenuator 844 based on the voltage level of the control voltage, V_control.

In this embodiment, the temperature compensation circuit 852 is operable to generate an attenuation control adjustment signal 892 that adjust the control voltage, V_control, based on an operating temperature associated with the first and/or second attenuation circuits 846, 848. To generate the attenuation control adjustment signal 892, the temperature compensation circuit 852 includes an operating temperature circuit 894 and a reference circuit 896. The operating temperature circuit 894 generates an operating temperature signal 898 having a signal level that is related to an operating temperature associated with the first and/or second attenuation circuit 846, 848. This may be done utilizing various techniques. For example, the operating temperature circuit 894 may have a temperature sensitive component(s), such as a transistor, thermally associated with one or more of the transistors in the attenuation circuit segments 862, 864, 866, 868, 870, 872. The operating temperature circuit 894 could thus sense the operating temperature based on the operation of the temperature sensitive component. In the alternative, the operating temperature circuit 894 may receive a feedback signal from the first and/or second attenuation circuit 846, 848 that varies in accordance with the operating temperature. Also, the operating temperature circuit 894 may be time-based and may be configured to generate the operating temperature signal 898 based on the thermal characteristics of the first and/or second attenuation circuit 846, 848 and the amount of time that has passed since the first and/or second attenuation circuit 846, 848 began to operate. These and other embodiments of the operating temperature circuit 894 that generate an operating temperature signal 898 having the signal level that is related to the operating temperature associated with the first and/or second attenuation circuit 846, 848 are within the scope of the disclosure. The operating temperature signal 898 may be scaled by components, such as a resistor(s), within the operating temperature circuit 894.

The reference circuit 896 is operable to generate a reference signal 900. The temperature compensation circuit 852 may include a comparator 902 that generates a comparison signal 904 having a signal level related to a difference between the operating temperature signal 898 and the reference signal 900. The reference signal 900 may thus have a signal level that is utilized by the comparator 902 to determine a change in temperature. The reference circuit 896 may simply be a DC voltage or current source having a constant signal level selected so as to represent a reference temperature. In the alternative, the reference circuit 896 may have a temperature insensitive component that generates a current or a voltage that is substantially constant over a desired temperature range. The reference circuit 896 may generate the reference signal 900 based on the operation of the temperature insensitive component. Also, the reference circuit 896 may receive a current or a voltage having a signal level that is substantially constant over a desired temperature range. In this manner, the reference circuit 896 can generate the reference signal 900 based on the signal level of the received current or voltage. Also, the reference circuit 896 may include a temperature sensitive component(s), such as a transistor, that is thermally associated with a device other than the first and/or second attenuation circuit 846, 848. The reference circuit 896 could thus sense a reference temperature thermally associated with the device and generate the reference signal 900 based on the operation of the temperature sensitive component(s). These and other embodiments of a reference circuit 896 operable to generate a reference signal 900 are within the scope of the disclosure.

The comparison signal 904 is received by an amplifier 906 that provides a gain of the temperature compensation circuit 852. The amplifier 906 amplifies the comparison signal 904 to generate the attenuation control adjustment signal 892, which is output from the temperature compensation circuit 852. In this embodiment, an adding device 908 is provided between the control circuit 850 and the temperature compensation circuit 852. The adding device 908 receives the control voltage, V_control, and adjusts the voltage level of the control voltage, V_control, in accordance with the signal level of the attenuation control adjustment signal 892. In this manner, the temperature compensation circuit 852 reduces changes in the total variable attenuation level of the attenuator 844 due to variations in the operating temperature.

Figure 28:
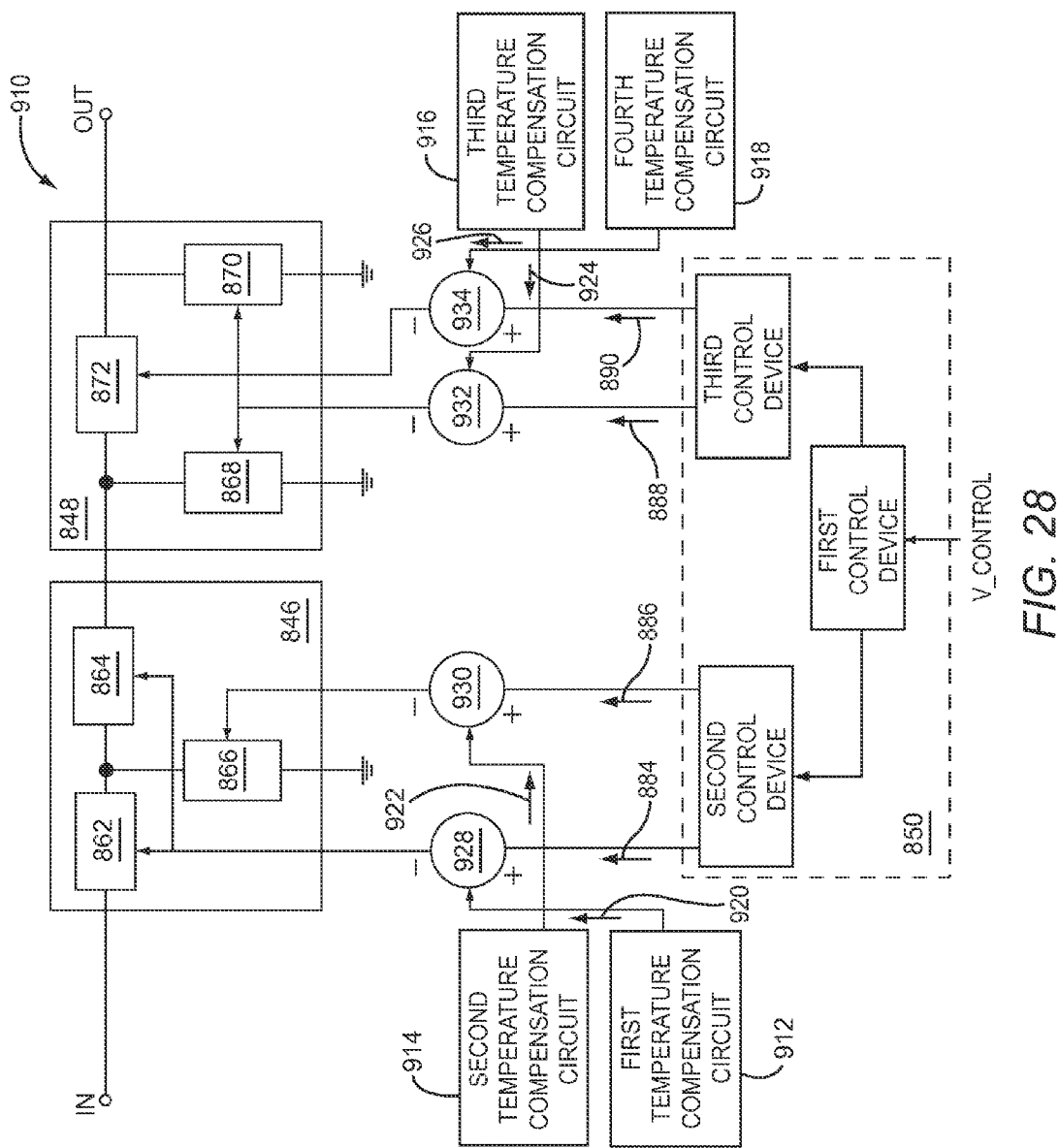
FIG. 28 illustrates another embodiment of a temperature compensation attenuator having cascaded first and second attenuation circuit segments, the first attenuation circuit segment being in a Tee-type configuration and the second attenuation circuit segment being in a Pi-type configuration.

FIG. 28 illustrates an additional embodiment of an attenuator 910. The attenuator 910 has the same first and second attenuation circuits 846, 848 and the control circuit 850 described above in FIG. 27. However, in this embodiment, the attenuator 910 includes a first, second, third, and fourth temperature compensation circuit 912, 914, 916, 918. The first temperature compensation circuit 912 generates a first attenuation control adjustment signal 920 that adjusts the first series segment control signal 884 based on an operating temperature associated with the first and/or second series connected attenuation circuit segments 862, 864. The second temperature compensation circuit 914 generates a second attenuation control adjustment signal 922 that adjusts the first shunt segment control signal 886 based on an operating temperature associated with the first shunt connected attenuation circuit segments 866. The third temperature compensation circuit 916 generates a third attenuation control adjustment signal 924 that adjusts the second shunt segment control signal 888 based on an operating temperature associated with the second and/or third shunt connected attenuation circuit segments 868, 870. Finally, the fourth temperature compensation circuit 918 generates a fourth attenuation control adjustment signal 926 that adjust the second series segment control signal 890 based on an operating temperature associated with the third series connected attenuation circuit segment 872. In the illustrated embodiment, the segment control signals 884, 886, 888, 890 are adjusted in accordance with the attenuation control adjustment signals 920, 922, 924, 926 by adders 928, 930, 932, 934, respectively.

Figure 29:
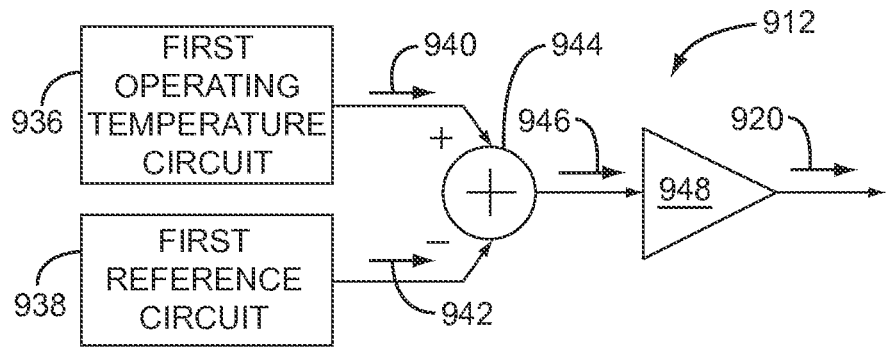
FIG. 29 illustrates a first temperature compensation circuit for the temperature compensation attenuator in FIG. 28.

FIG. 29 is an illustration of the first temperature compensation circuit 912. To generate the first attenuation control adjustment signal 920, the first temperature compensation circuit 912 includes a first operating temperature circuit 936 and a first reference circuit 938. The first operating temperature circuit 936 generates a first operating temperature signal 940 having a signal level that is related to an operating temperature associated with the first and/or second series connected attenuation circuit segments 862, 864 (shown in FIG. 28). The first operating temperature signal 940 may be scaled by components, such as a resistor(s), within the first operating temperature circuit 936.

The first reference circuit 938 is operable to generate a first reference signal 942. The first temperature compensation circuit 912 may include a first comparator 944 that generates a first comparison signal 946 having a signal level related to a difference between the first operating temperature signal 940 and the first reference signal 942. The first reference signal 942 may thus have a signal level that is utilized by the comparator 944 to determine a change in temperature. The first comparison signal 946 is received by a first amplifier 948 that provides a gain of the first temperature compensation circuit 912. The first amplifier 948 amplifies the first comparison signal 946 to generate the first attenuation control adjustment signal 920, which is output from the first temperature compensation circuit 912. In this manner, the first temperature compensation circuit 912 reduces changes in a first variable impedance level of the first series connected attenuation circuit segment 862 (shown in FIG. 28) and a second variable impedance level of the second series connected attenuation circuit segment 864 (shown in FIG. 28) due to variations in the operating temperature.

Figure 30:
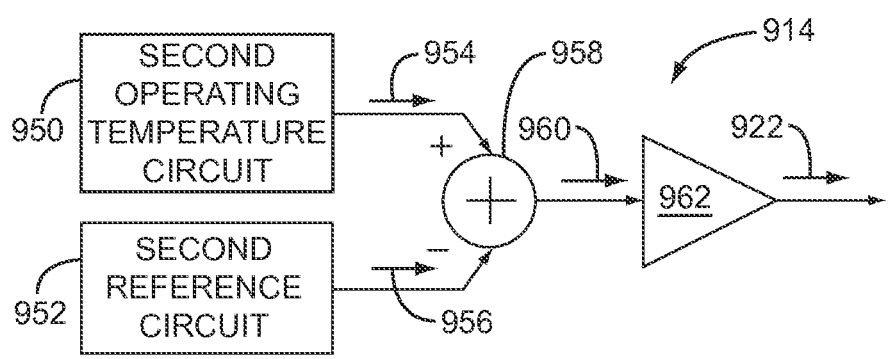
FIG. 30 illustrates a second temperature compensation circuit for the temperature compensation attenuator in FIG. 28.

FIG. 30 is an illustration of the second temperature compensation circuit 914. To generate the second attenuation control adjustment signal 922, the second temperature compensation circuit 914 includes a second operating temperature circuit 950 and a second reference circuit 952. The second operating temperature circuit 950 generates a second operating temperature signal 954 having a signal level that is related to an operating temperature associated with the first shunt connected attenuation circuit segment 866 (shown in FIG. 28). The second operating temperature signal 954 may be scaled by components, such as a resistor(s), within the second operating temperature circuit 950.

The second reference circuit 952 is operable to generate a second reference signal 956. The second temperature compensation circuit 914 may include a second comparator 958 that generates a second comparison signal 960 having a signal level related to a difference between the second operating temperature signal 954 and the second reference signal 956. The second reference signal 956 may thus have a signal level that is utilized by the comparator 958 to determine a change in temperature. The second comparison signal 960 is received by a second amplifier 962 that provides a gain of the second temperature compensation circuit 914. The second amplifier 962 amplifies the second comparison signal 960 to generate the second attenuation control adjustment signal 922, which is output from the second temperature compensation circuit 914. In this manner, the second temperature compensation circuit 914 reduces changes in a second variable impedance level of the first shunt connected attenuation circuit segment 866 (shown in FIG. 28) due to variations in the operating temperature.

Figure 31:
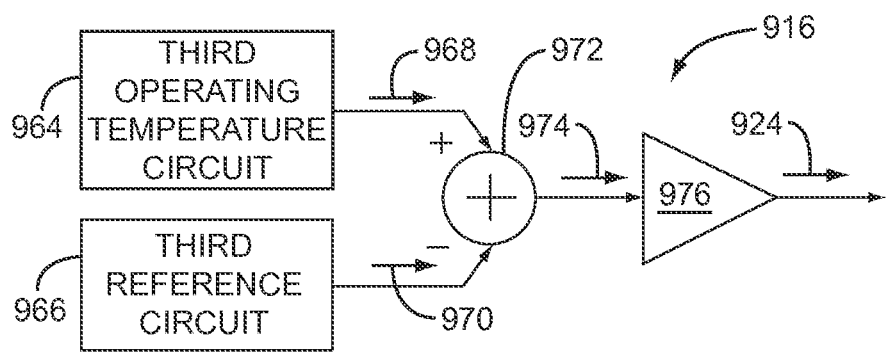
FIG. 31 illustrates a third temperature compensation circuit for the temperature compensation attenuator in FIG. 28.

FIG. 31 is an illustration of the third temperature compensation circuit 916. To generate the third attenuation control adjustment signal 924, the third temperature compensation circuit 916 includes a third operating temperature circuit 964 and a third reference circuit 966. The third operating temperature circuit 964 generates a third operating temperature signal 968 having a signal level that is related to an operating temperature associated with the second and/or third shunt connected attenuation circuit segments 868, 870 (shown in FIG. 28). The third operating temperature signal 968 may be scaled by components, such as a resistor(s), within the third operating temperature circuit 964.

The third reference circuit 966 is operable to generate a third reference signal 970. The third temperature compensation circuit 916 may include a third comparator 972 that generates a third comparison signal 974 having a signal level related to a difference between the third operating temperature signal 968 and the third reference signal 970. The third reference signal 970 may thus have a signal level that is utilized by the third comparator 972 to determine a change in temperature. The third comparison signal 974 is received by a third amplifier 976 that provides a gain of the third temperature compensation circuit 916. The third amplifier 976 amplifies the third comparison signal 974 to generate the third attenuation control adjustment signal 924, which is output from the third temperature compensation circuit 916. In this manner, the third temperature compensation circuit 916 reduces changes in a fourth variable impedance level of the second shunt connected attenuation circuit segment 868 (shown in FIG. 28) and a fifth variable impedance level of the third shunt connected attenuation circuit segment 870 (shown in FIG. 28) due to variations in the operating temperature.

Figure 32:
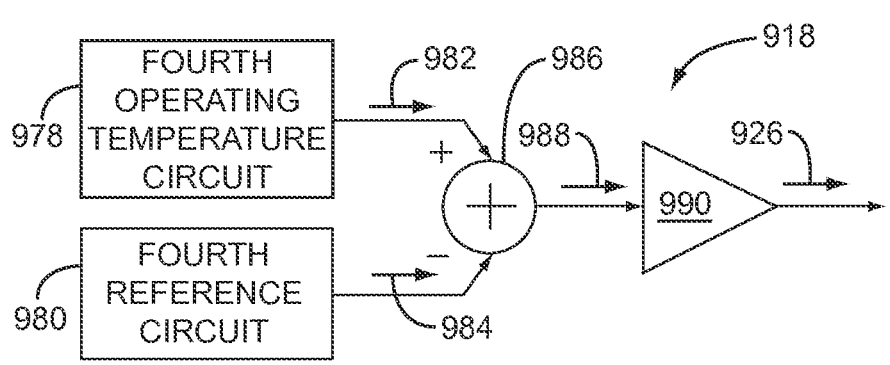
FIG. 32 illustrates a fourth temperature compensation circuit for the temperature compensation attenuator in FIG. 28.

FIG. 32 is an illustration of the fourth temperature compensation circuit 918. To generate the fourth attenuation control adjustment signal 926, the fourth temperature compensation circuit 918 includes a fourth operating temperature circuit 978 and a fourth reference circuit 980. The fourth operating temperature circuit 978 generates a fourth operating temperature signal 982 having a signal level that is related to an operating temperature associated with the third series connected attenuation circuit segment 872 (shown in FIG. 28). The fourth operating temperature signal 982 may be scaled by components, such as a resistor(s), within the fourth operating temperature circuit 978.

The fourth reference circuit 980 is operable to generate a fourth reference signal 984. The fourth temperature compensation circuit 918 may include a fourth comparator 986 that generates a fourth comparison signal 988 having a signal level related to a difference between the fourth operating temperature signal 982 and the fourth reference signal 984. The fourth reference signal 984 may thus have a signal level that is utilized by the fourth comparator 986 to determine a change in temperature. The fourth comparison signal 988 is received by a fourth amplifier 990 that provides a gain of the fourth temperature compensation circuit 918. The fourth amplifier 990 amplifies the fourth comparison signal 988 to generate the fourth attenuation control adjustment signal 926, which is output from the fourth temperature compensation circuit 918. In this manner, the fourth temperature compensation circuit 918 reduces changes in the sixth variable impedance level of the third shunt connected attenuation circuit segment 872 (shown in FIG. 28) due to variations in the operating temperature.

The temperature compensation circuits and techniques described above for FIGS. 25-32 above may be utilized with the attenuators described in FIGS. 1, 3, 6-13, and 15-22 to provide temperature compensation and/or to create temperature compensation attenuators.

Figure 33:
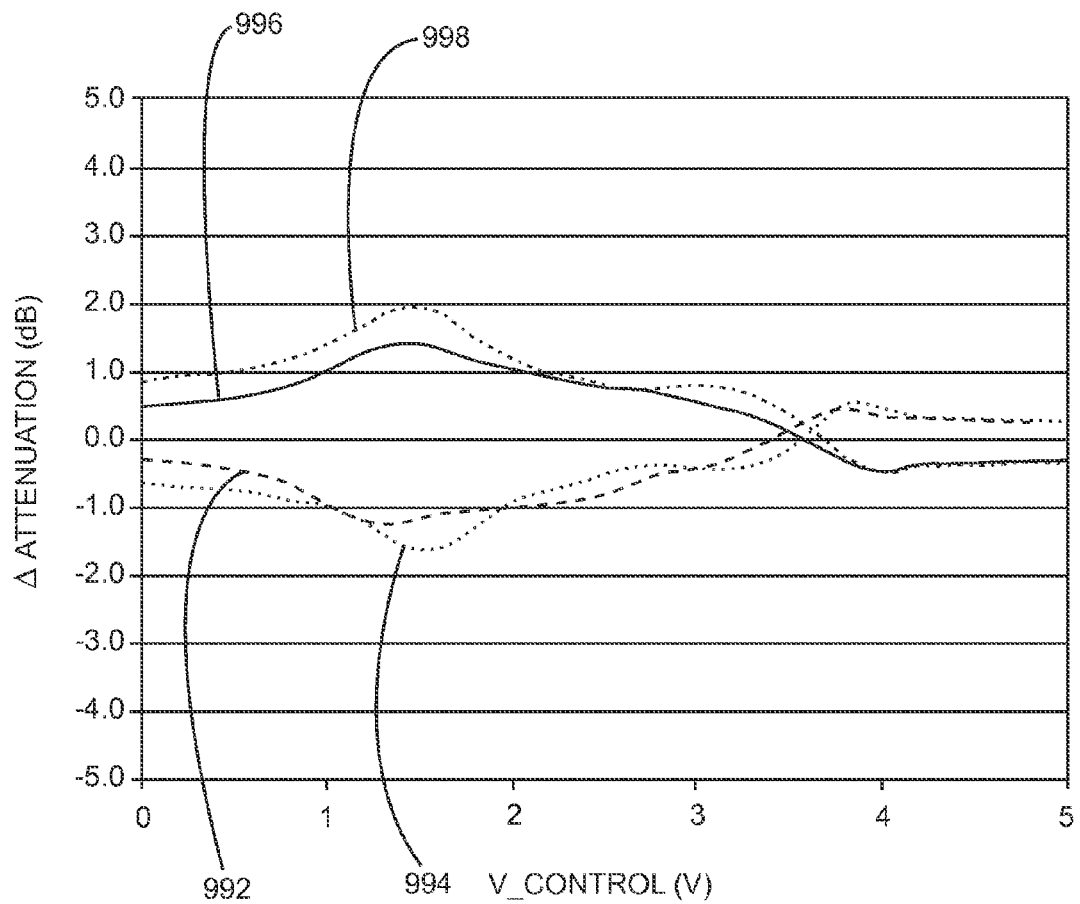
FIG. 33 illustrates the change in the total attenuation level of the cascaded first and second attenuation circuit segments as a function of the control voltage level for the temperature compensation attenuator in FIG. 28.

For example, FIG. 33 is a graph illustrating the temperature performance of the cascaded first and second attenuation circuits 660, 661 described above in the circuit diagram of FIG. 22, controlled by the control circuit 850 and the temperature compensation circuit 852 described in FIG. 27. The graph plots the change in the total variable attenuation level of the cascaded first and second attenuation circuits 660, 661 from a reference operating temperature of 25° C. versus the voltage level of the control voltage, V_control. The first line 992 is the simulated change in the total variable attenuation level when the operating temperature associated with the first and second attenuation circuits 660, 661 rises to 30° C. The second line 994 is the measured change in the total variable attenuation level when the operating temperature associated with the first and second attenuation circuits rises to 30° C. The third line 996 is the simulated change in the total variable attenuation level when the operating temperature associated with the first and second attenuation circuits 660, 661 rises to 85° C. Finally, the fourth line 998 is the measured change in the total variable attenuation level when the operating temperature associated with the first and second attenuation circuits 660, 661 rises to 85° C. As illustrated, the maximum change in the total variable attenuation level is less than +/−2 dB and the temperature performance is consistent with simulations.

Figure 34:
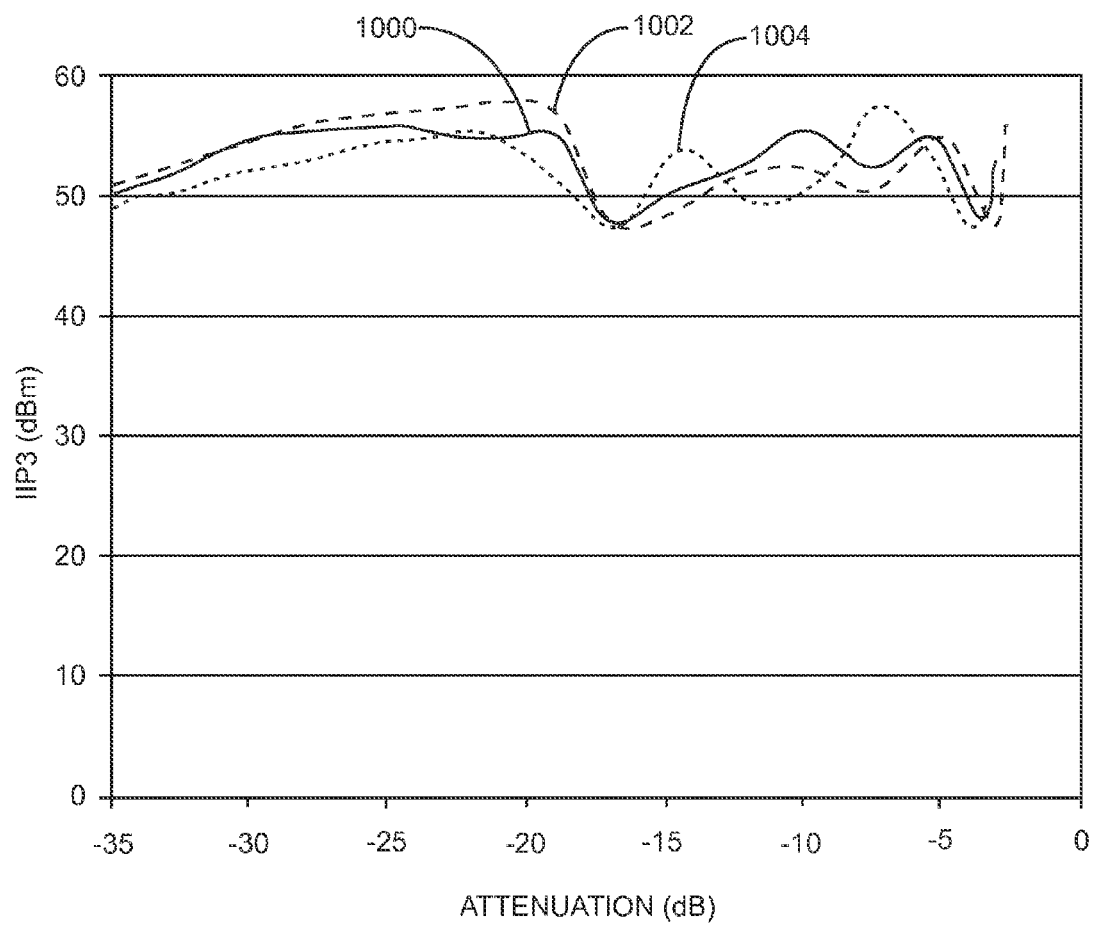
FIG. 34 illustrates the third order intercept point of the cascaded first and second attenuation circuit segments as a function of the total attenuation level for the temperature compensation attenuator in FIG. 28.

FIG. 34 is a graph illustrating the IIP3 of the cascaded first and second attenuation circuits 660, 661 described above in the circuit diagram of FIG. 22 versus the total variable attenuation level at different temperatures, when the first and second attenuation circuits 660, 661 are controlled by the control circuit 850 and the temperature compensation circuit 852 described in FIG. 27. The first line 1000 is the IIP3 at 25° C. The second line 1002 is the IIP3 at 30° C. The third line 1004 is the IIP3 at 85° C. As illustrated, the linearity of the total variable attenuation level is maintained relatively consistent despite changes in temperature.

Figure 35:
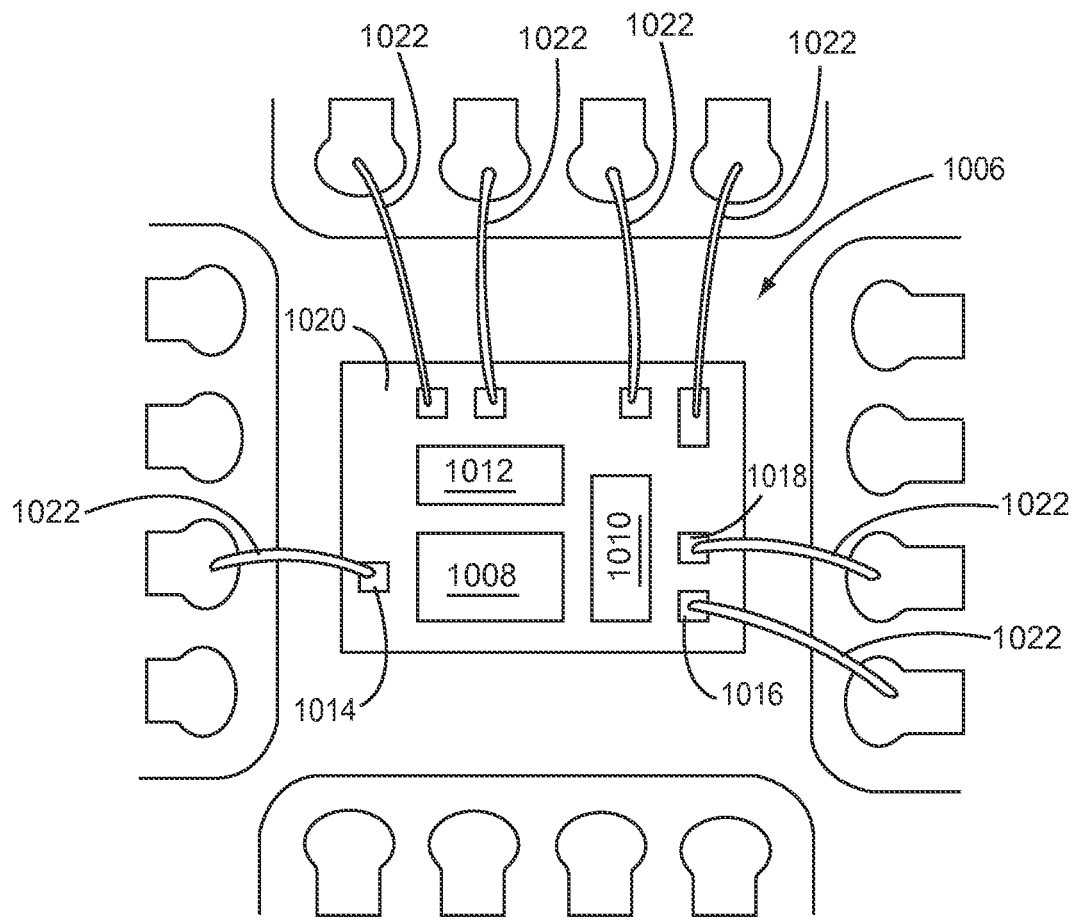
FIG. 35 illustrates one embodiment of an attenuator built on a quad no leads package.

Referring now to FIG. 35, one embodiment of an integrated circuit layout for providing an attenuator 1006 in accordance with this disclosure is shown which may be utilized in a radio frequency (RF) circuit (not shown). The attenuator 1006 may be built on a 3×3 mm, 16 pin, Quad Flat No Leads (QFN) Package, such as QFN Package having part number RFCA2013. The attenuator 1006 has a first attenuation circuit 1008, a second attenuation circuit 1010, a control circuit 1012, an RF input terminal 1014, an RF ground terminal 1016, and an RF output terminal 1018 built on a single substrate 1020, which in this example is a 1.55 mm×1 mm die having part number IBM CS07RF. A temperature compensation circuit may also be provided on the substrate 1020. The pins 1022 couple the attenuator 1006 to the remainder of the RF circuit.

Figure 36:
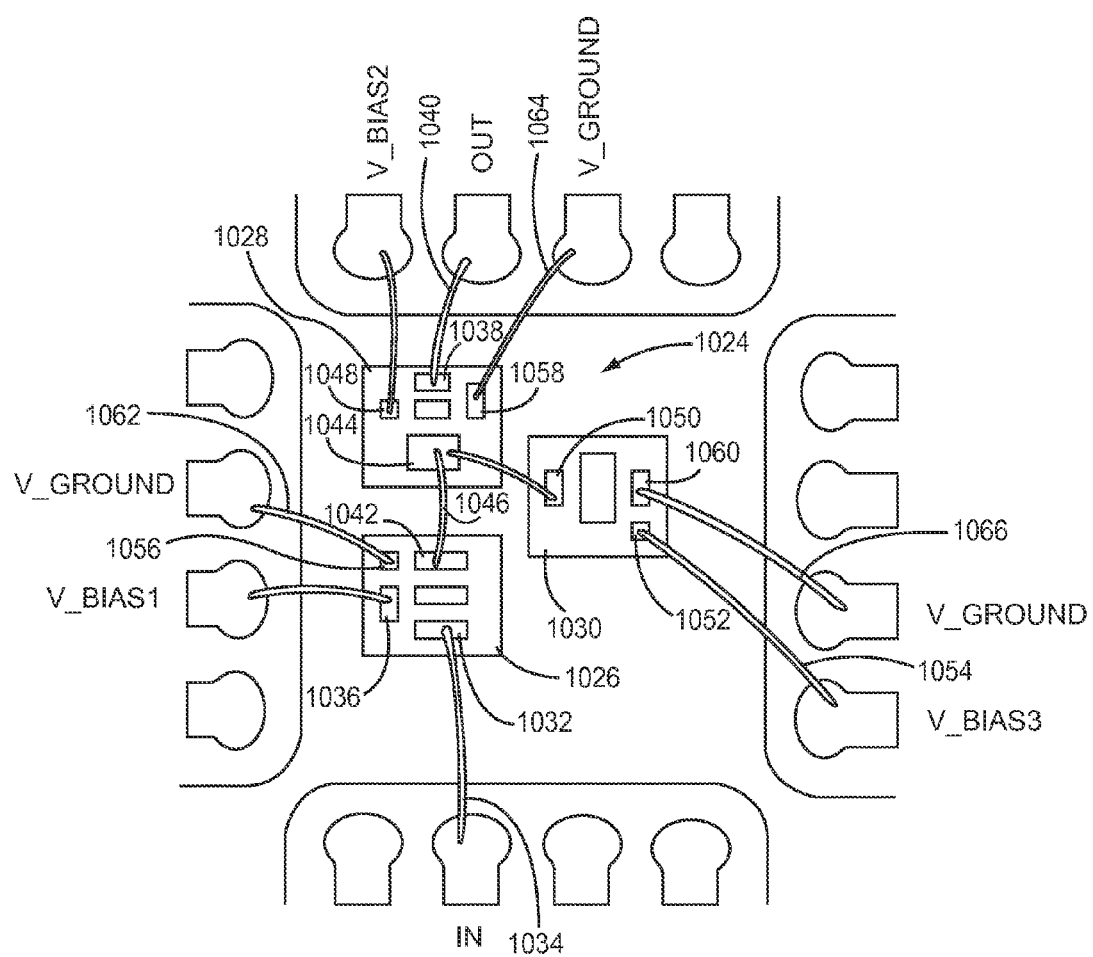
FIG. 36 illustrates one embodiment of an attenuation circuit in a Tee-type configuration built on a quad no leads package.

Referring now to FIG. 36, another embodiment of an integrated circuit layout for an attenuation circuit 1024 having a Tee-type configuration is shown. The attenuation circuit 1024 is provided on a 5 mm×5 mm QFN package. The attenuation circuit 1024 has a first series connected attenuation circuit segment 1026, a second series connected attenuation circuit segment 1028, and a shunt connected attenuation circuit segment 1030. Each attenuation circuit segment 1026, 1028, 1030 has a stack of fourteen MOSFETs. In this embodiment, all of the MOSFETs built on a separate silicon-on-insulator type substrate.

The first series connected attenuation circuit segment 1026 has an input terminal 1032 coupled to a pin 1034 for receiving an RF input signal. The first series connected attenuation circuit 1026 also includes a first control input terminal 1036 for receiving a control voltage, V_bias1, to control the stack of transistors within the first series connected attenuation circuit segment 1026. The second series connected attenuation circuit segment 1028 has an output terminal 1038 coupled to a pin 1040 for outputting an attenuated RF output signal. Each of the first and second series connected attenuation circuit segments 1026, 1028 have a connection terminal 1042, 1044 coupled in series by pin 1046. The second series connected attenuation circuit segment 1028 also includes a second control input terminal 1048 for receiving a control voltage, V_bias2, that controls the stack of MOSFETs within the second series connected attenuation circuit segment 1028. The shunt connected attenuation circuit segment 1030 has a connection terminal 1050 coupled in shunt to the connection terminal 1044 of the second series connected attenuation circuit segment 1028. The shunt connected attenuation circuit segment 1030 also includes a third control input terminal 1052 coupled to pin 1054 for receiving a control voltage, V_bias3, to control the stack of MOSFETs within the shunt connected attenuation circuit segment 1030. Each of the attenuation circuit segments 1026, 1028, 1030 also include V_ground terminals 1056, 1058, 1060 that are coupled to pins 1062, 1064, 1066 to connect the attenuation circuit segments 1026, 1028, 1030 to V_ground terminals.

Figure 37:
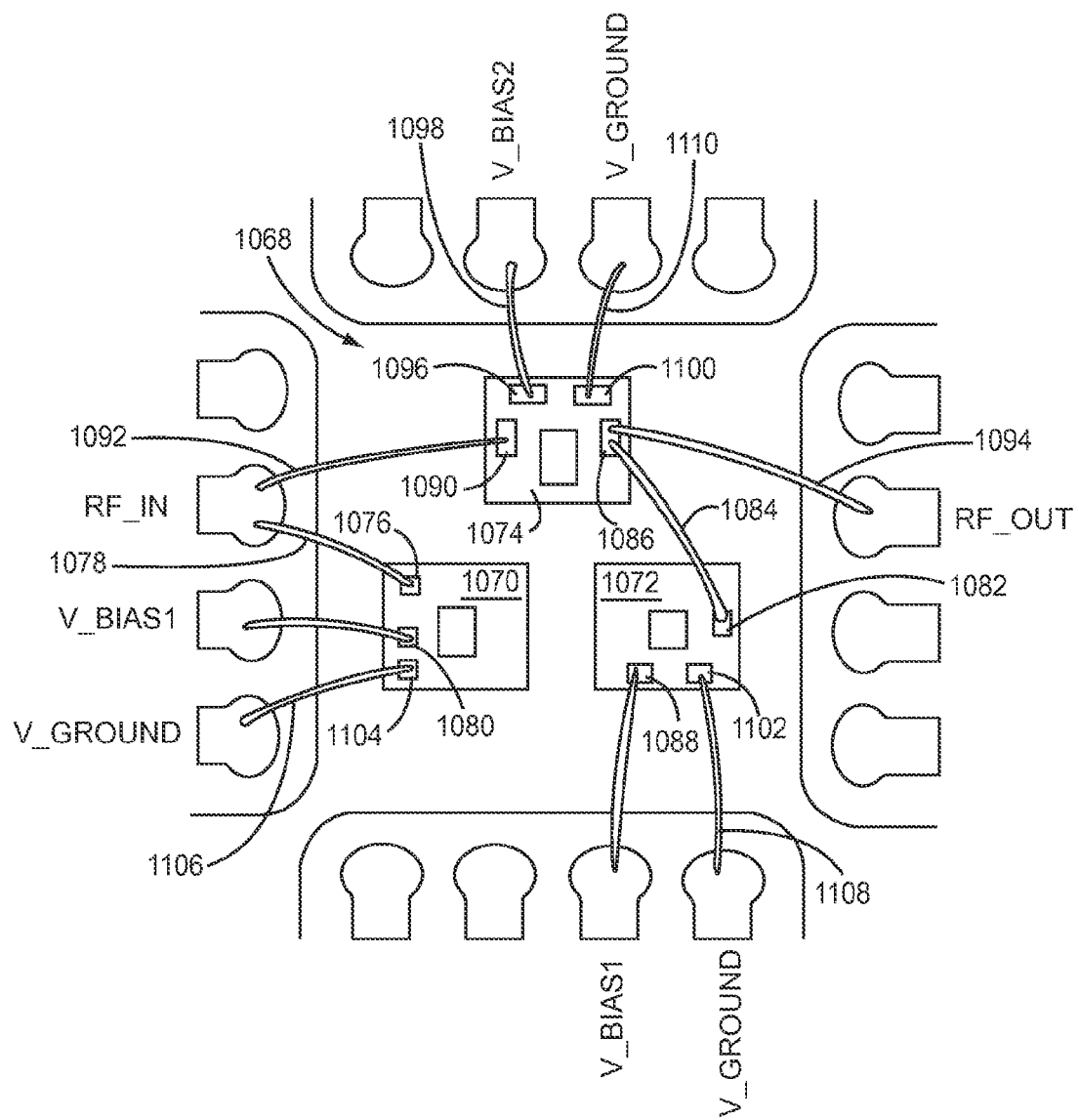
FIG. 37 illustrates one embodiment of an attenuation circuit in a Pi-type configuration build ton a quad no leads package.

Referring now to FIG. 37, another embodiment of an integrated circuit layout for an attenuation circuit 1068 in a Pi-type configuration is shown.

The attenuation circuit 1068 is provided on a 5 mm×5 mm QFN package. The attenuation circuit 1068 has a first shunt connected attenuation circuit segment 1070, a second shunt connected attenuation circuit segment 1072, and a series connected attenuation circuit segment 1074. Each attenuation circuit segment 1070, 1072, 1074 has a stack of fourteen MOSFETs. In this embodiment, all of the MOSFETs and each attenuation circuit segment 1070, 1072, 1074, are built on a separate silicon-on-insulator type substrate. The first shunt connected attenuation circuit segment 1070 has an input terminal 1076 coupled to a pin 1078 for receiving an RF input signal. The first shunt connected attenuation circuit segment 1070 also includes a first control input terminal 1080 for receiving a control voltage, V_bias1, to provide control the stack of MOSFETs within the first shunt connected attenuation circuit segment 1070. The second shunt connected attenuation circuit segment 1072 has a connection terminal 1082 coupled to a pin 1084 that connects to an output terminal 1086 in the series connected attenuation circuit segment 1074. The second shunt connected attenuation circuit segment 1072 also includes a second control input terminal 1088 for receiving the control voltage, V_bias1, to control the stack of MOSFETS within the second shunt connected attenuation circuit segment 1072. The series connected attenuation circuit segment 1074 has an input terminal 1090 coupled to pin 1092 for receiving the RF input signal. The series connected attenuation circuit 1074 also has the output terminal 1086 coupled to a pin 1094 for outputting an attenuated RF output signal. Furthermore, the series connected attenuation circuit segment 1074 has a third control input terminal 1096 coupled to a pin 1098 for receiving a control voltage, V_bias2, to control the stack of MOSFETS within the series connected attenuation circuit segment 1074. Each of the attenuation circuit segments 1070, 1072, 1074 also include V_ground terminals 1100, 1102, 1104 that are coupled to pins 1106, 1108, 1110 to connect the attenuation circuit segments 1070, 1072, 1074 to V_ground.

Figure 38:
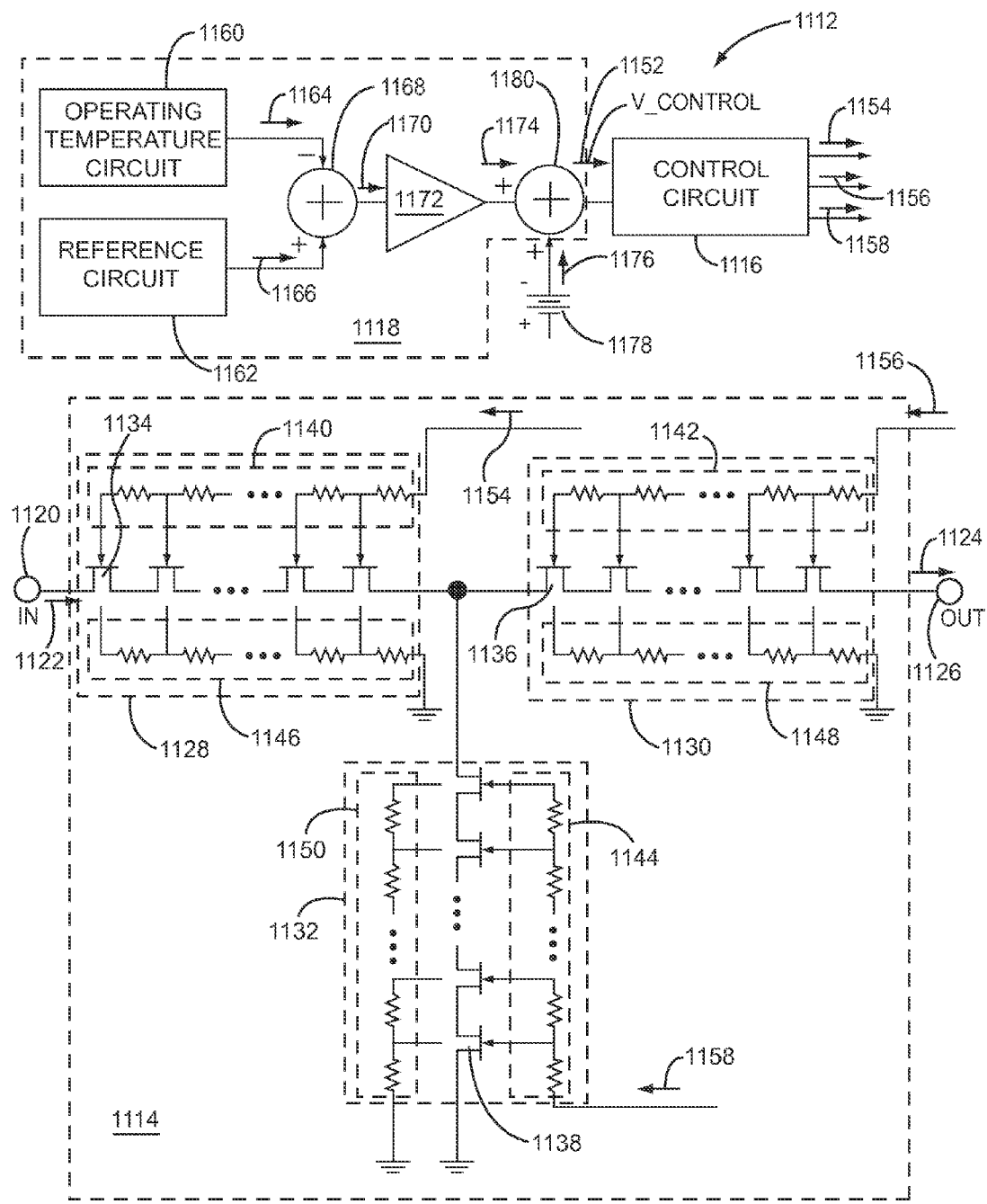
FIG. 38 illustrates a circuit diagram of one embodiment of a temperature controlled attenuator in a Tee-type configuration.

FIG. 38 is a circuit diagram of a temperature controlled attenuator 1112 having an attenuation circuit 1114, a control circuit 1116, and a temperature controlled circuit 1118. The attenuation circuit 1114 has an input terminal 1120 for receiving an input signal 1122. The attenuation circuit 1114 attenuates the input signal 1122 to generate an attenuated output signal 1124 that is output from an output terminal 1126. To attenuate the input signal 1122, the attenuation circuit 1114 includes a first series connected attenuation circuit segment 1128, a second series connected attenuation circuit segment 1130, and a shunt connected attenuation circuit segment 1132.

The first series connected attenuation circuit segment 1128, the second series connected attenuation circuit segment 1130, and the shunt connected attenuation circuit segment 1132 may each have a first, second, and third plurality of stacked transistors 1134, 1136, 1138, respectively. The transistors in each of the first, second, and third plurality of stacked transistors 1134, 1136, 1138 may be any type of transistors. In FIG. 38, the transistors in each of the first, second, and third plurality of stacked transistors 1134, 1136, 1138 are HFETs or MESFETs. Also, in this embodiment, the first series connected attenuation circuit segment 1128, the second series connected attenuation circuit segment 1130, and the shunt connected attenuation circuit segment 1132 each include first, second, and third resistive circuit 1140, 1142, 1144, respectively, and first, second, and third biasing circuitry 1146, 1148, 1150, respectively, that help reduce distortion in the attenuation circuit 1114.

In this embodiment, the temperature controlled circuit 1118 generates an attenuation control signal 1152, which in this example is a control voltage, V_control. The control circuit 1116 receives the control voltage, V_control, and is operable to generate a first series segment control signal 1154, a second series segment control signal 1156, and a shunt segment control signal 1158. To adjust the control voltage, V_control, the temperature controlled circuit 1118 includes an operating temperature circuit 1160 and a reference circuit 1162. The operating temperature circuit 1160 generates an operating temperature signal 1164 having a signal level that is related to an operating temperature associated an external electronic component or the attenuation circuit 1112. This may be done utilizing various techniques. For example, the operating temperature circuit 1160 may have a temperature sensitive component(s), such as a transistor, thermally associated with one or more of the transistors the external component or the attenuation circuit 1114. The operating temperature circuit 1160 could thus sense the operating temperature based on the operation of the temperature sensitive component. In the alternative, the operating temperature circuit 1160 may receive a feedback signal the external component or from the attenuation circuit 1114 that varies in accordance with the operating temperature. Also, the operating temperature circuit 1160 may be time-based and may be configured to generate the operating temperature signal 1164 based on the thermal characteristics of the external component or the attenuation circuit 1114 and the amount of time that has passed since external component or the attenuation circuit 1114 began to operate. These and other embodiments of the operating temperature circuit 1160 that generate an operating temperature signal 1164 having a signal level that is related to the operating temperature of the attenuation circuit 1114 or the external component are within the scope of the disclosure. The operating temperature signal 1164 may be scaled by components, such as a resistor(s), within the operating temperature circuit 1160.

The external component is not shown here but may be any type of electronic device or circuit. For example, the temperature controlled attenuator 1112 may be utilized in the front end of an RF transceiver or a transmitter chain to compensate for gain variation in amplifiers. The electronic component may be an amplifier in the RF transceiver whose gain varies in accordance to temperature. By utilizing the temperature controlled attenuator 1112, the attenuation of the attenuation circuit 1114 can be varied in accordance to the operating temperature. If the operating temperature of the external component is sufficiently related to the operating temperature of the attenuation circuit 1114 then the operating temperature circuit 1160 can detect a temperature of the attenuation circuit 1114 to vary attenuation. Otherwise, the operating temperature circuit 1160 may detect an operating temperature of the external component.

A reference circuit 1162 is operable to generate a reference signal 1166. The temperature controlled circuit 1118 may include a comparator 1168 that generates a comparison signal 1170 having a signal level related to a difference between the operating temperature signal 1164 and the reference signal 1166. The reference signal 1166 may thus have a signal level that is utilized by the comparator 1168 to determine a change in temperature. The reference circuit 1162 may simply be a DC voltage or current source having a constant signal level selected so as to represent a reference temperature. In the alternative, the reference circuit 1162 may have a temperature insensitive component that generates a current or a voltage that is substantially constant over a desired temperature range. The reference circuit 1162 may generate the reference signal 1166 based on the operation of the temperature insensitive component. Also, the reference circuit 1162 may receive a current or a voltage having a signal level that is substantially constant over a desired temperature range. In this manner, the reference circuit 1162 can generate the reference signal 1166 based on the signal level of the received current or voltage. Also, the reference circuit 1162 may include a temperature sensitive component(s), such as a transistor, that is thermally associated with a device other than the external component. The reference circuit 1162 could thus sense a reference temperature thermally associated with the attenuation circuit 1114. These and other embodiments of a reference circuit 1162 operable to generate a reference signal 1166 are within the scope of the disclosure.

The comparison signal 1170 is received by an amplifier 1172 that provides a gain of the temperature controlled circuit 1118. The gain of the amplifier 1172 is set based on a temperature coefficient of the external component. Thus, the amplifier 1172 amplifies the comparison signal 1170 to generate an attenuation control adjustment signal 1174. In this embodiment, the temperature controlled circuit 1118 receives a quiescent control signal 1176 having a quiescent signal level for defining a quiescent attenuation level within the continuous attenuation range of the first variable attenuation level at the reference temperature. The quiescent control signal 1176 may simply be set by a DC voltage source 1178 selected to have the appropriate quiescent attenuation level. The quiescent control signal 1176 is received at an adjustment device 1180, such as an adder. The adjustment device 1180 adds the attenuation control adjustment signal 1174 to the control voltage, V_control. Thus, the temperature controlled circuit 1118 illustrated in FIG. 25 is designed to adjust the variable attenuation level of the attenuation circuit 1114 as the temperature drifts in the external component and the variable attenuation level is thus temperature dependant. This is desirable since, as is known in the art, the operation of the external components may change as the operating temperature of the transistors changes. If no difference is detected between the operating temperature signal 1164 and the reference signal 1166, then the attenuation control adjustment signal 1118 does not adjust the quiescent control signal 1176 and the control voltage, V_control would simply have the signal level of the quiescent control signal 1176. On the other hand, if a difference is detected between the operating temperature signal 1164 and the reference signal 1166, then the attenuation control adjustment signal 1118 adjust the voltage level of the quiescent control signal 1176 to the appropriate voltage to provide a desired attenuation value. Since the gain of the amplifier is based on the temperature coefficient of the external component, the temperature controlled attenuator 1112 can adjust the variable attenuation level to compensate for the operating variances of the external component.

Since the control voltage, V_control, is temperature dependant, the first series connected attenuation circuit segment 1128, the second series connected attenuation circuit segment 1130, and the shunt connected attenuation circuit segment 1132 have variable impedance level that are also temperature dependant. The control circuit 1116 is operable to generate the first series segment control signal 1154, the second series segment control signal, 1156, and the shunt segment control signal 1158 in accordance with the voltage level of the control voltage, V_control which is temperature dependant, for the reasons explained above. Accordingly, the variable attenuation level is temperature dependant as well.

The control circuit 1116 is operably associated with each of the first, second, and third plurality of stacked transistors 1134, 1136, 1138. The first series segment control signal 1154 controls the operation of the first plurality of stacked transistors 1134. Similarly, the second series segment control signal 1156 controls the operation of the second plurality of stacked transistors 1136 and the shunt segment control signal 1158 controls the operation of the third plurality of stacked transistors 1138. By adjusting the voltage level of the control voltage, V_control, the temperature controlled circuit 1118 also adjust a signal level of the control signals 1154, 1156, 1158 to maintain the first series connected attenuation circuit segment 1128 operating at the appropriate impedance level, the second series connected attenuation circuit segment 1130 operating at the appropriate impedance level, and the shunt connected attenuation circuit segment 1132 operating at the appropriate impedance level thereby allowing the attenuation circuit 1114 to vary its operation to compensate for variances in the operation of the external component.

Figure 39:
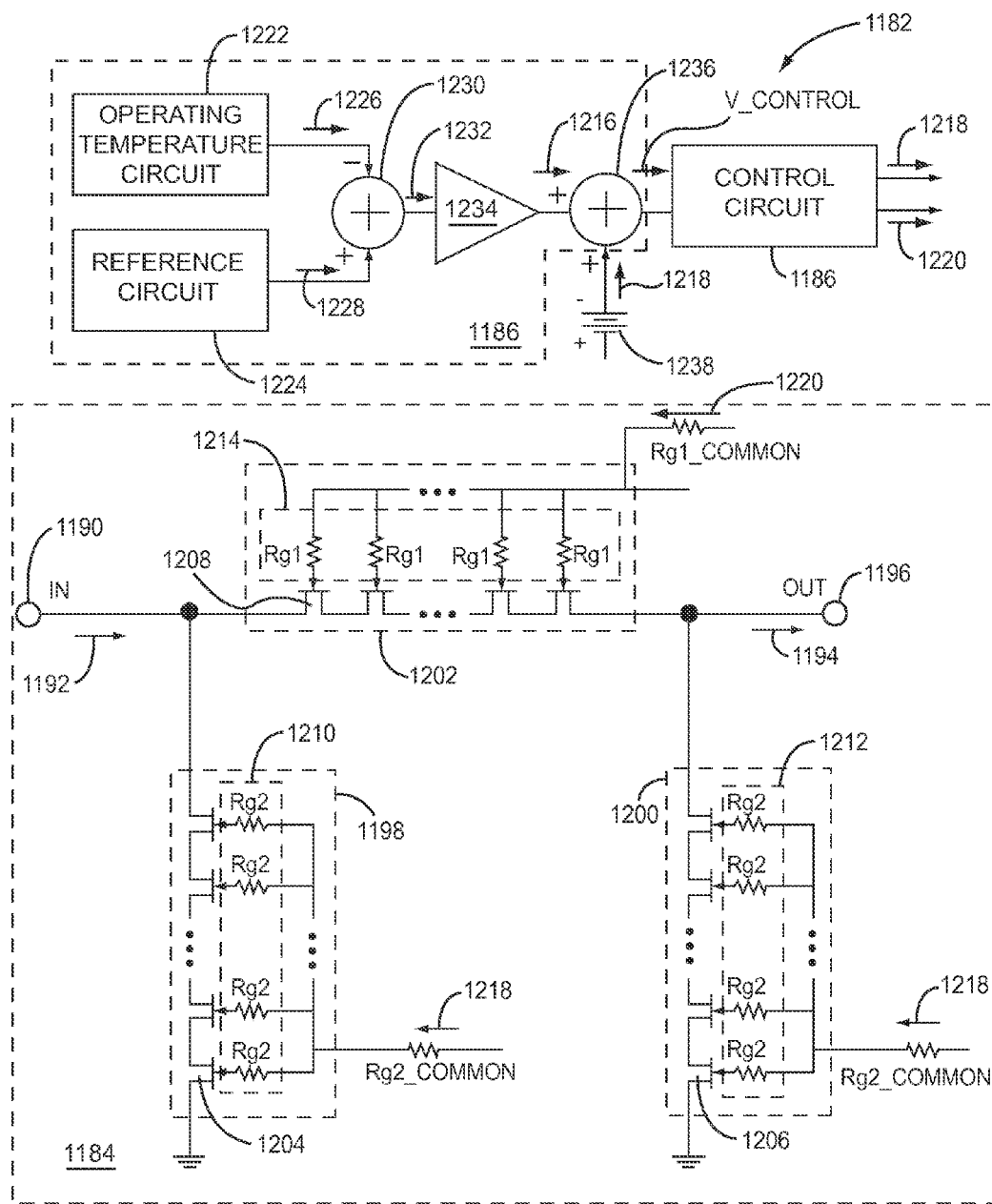
FIG. 39 illustrates one embodiment of one embodiment of a temperature controlled attenuator in a Pi-type configuration.

FIG. 39 is a circuit diagram of yet another embodiment of a temperature controlled attenuator 1182 having an attenuation circuit 1184, a control circuit 1186, and a temperature controlled circuit 1188. In this embodiment, the attenuation circuit 1184 is in a Pi-type configuration. The attenuation circuit 1184 has an input terminal 1190 for receiving an input signal 1192. The attenuation circuit 1184 attenuates the input signal 1192 to generate an attenuated output signal 1194 that is output from an output terminal 1196. To attenuate the input signal 1192, the attenuation circuit 1184 includes a first shunt connected attenuation circuit segment 1198, a second shunt connected attenuation circuit segment 1200, and a series connected attenuation circuit segment 1202.

The first shunt connected attenuation circuit segment 1198, the second shunt connected attenuation circuit segment 1200, and the series connected attenuation circuit segment 1202 may each have a first, second, and third plurality of stacked transistors 1204, 1206, 1208, respectively. The transistors in each of the first, second, and third plurality of stacked transistors, 1204, 1206, 1208 may be any type of transistors. In FIG. 39, the transistors in each of the first, second, and third plurality of stacked transistors 1204, 1206, 1208 are HFETs or MESFETs. Also, in this embodiment, the first shunt connected attenuation circuit segment 1198, the second shunt connected attenuation circuit segment 1200, and the series connected attenuation circuit segment 1202 each include a first, second, and third resistive circuit 1210, 1212, 1214, respectively, that help reduce distortion in the attenuation circuit 1184.

In this embodiment, the temperature controlled circuit 1188 generates an attenuation control adjustment signal 1216. This attenuation control adjustment signal 1216 adjust the quiescent operating signal 1218 to generate the control voltage, V_control. The control circuit 1186 receives the control voltage, V_control, and is operable to generate a shunt segment control signal 1218 and a series segment control signal 1220. To generate the control voltage, V_control, the temperature controlled circuit 1188 includes an operating temperature circuit 1222 and a reference circuit 1224. The operating temperature circuit 1222 generates an operating temperature signal 1226 having a signal level that is related to an operating temperature associated with the attenuation circuit 1184. The operating temperature signal 1226 may be scaled by components, such as a resistor(s), within the operating temperature circuit 1222.

The reference circuit 1224 is operable to generate a reference signal 1228. The temperature controlled circuit 1188 may include a comparator 1230 that generates a comparison signal 1232 having a signal level related to a difference between the operating temperature signal 1226 and the reference signal 1228. The reference signal 1228 may thus have a signal level that is utilized by the comparator 1230 to determine a change in temperature.

The comparison signal 1232 is received by an amplifier 1234 that provides a gain of the temperature controlled circuit 1188. This gain is set based on a temperature coefficient of an external component. The amplifier 1234 amplifies the comparison signal 1232 to generate the attenuation control adjustment signal 1216. In this embodiment, an adjustment device 1236 receives the attenuation control adjustment signal 1216 and the quiescent operating signal 1218 from the DC source. The adjustment device 1236 adjusts the quiescent operating signal 1218 to generate the control voltage, V_control.

The temperature controlled circuit 1188 illustrated in FIG. 39 is temperature dependant and is designed to adjust the variable attenuation level of the attenuation circuit 1184 to compensate for operational changes in an external component (not shown). For example, this may be an amplifier that is or is to be placed in operation with the temperature controlled attenuator 1182. This is desirable since, as is known in the art, the operation of external components may change as the operating temperature of the transistors changes. If no difference is detected between the operating temperature signal 1226 and the reference signal 1228, then the attenuation control adjustment signal 1216 does not adjust the quiescent operating signal 1218 and the control voltage, V_control is generated as the quiescent operating signal 1218. On the other hand, if a difference is detected between the operating temperature signal 1226 and the reference signal 1228, then the attenuation control adjustment signal 1216 adjust the quiescent operating signal 1238 to generate the control voltage, V_control.

The control circuit 1186 may be operably associated with each of the first, second, and third plurality of stacked transistors 1204, 1206, 1208 to set each of the first shunt connected attenuation circuit segment 1198, the second shunt connected attenuation circuit segment 1200, and the series connected attenuation circuit segment 1202 to their respective impedance levels. The shunt segment control signal 1218 controls the operation of the first plurality of stacked transistors 1204 and the second plurality of stacked transistors 1206 coupled in the first and second shunt connected attenuation circuit segments 1198, 1200. Similarly, the series segment control signal 1220 controls the operation of the series connected attenuation circuit segment 1202. By making the voltage level of the control voltage, V_control, temperature dependant, the temperature controlled circuit 1188 also makes the control signals 1218, 1220 temperature dependant. These techniques disclosed herein with regards to temperature controlled attenuators 1112 and 1184 may be utilized with the other attenuators described for the Figures above to create temperature controlled attenuators that are temperature dependant to compensate for operational changes in an external component.

Note that throughout this disclosure the term "continuous" is utilized to describe signals and attenuation ranges. Theoretically, a perfectly continuous signal, impedance, or attenuation range has an infinitely high resolution meaning that the signal level, impedance level or attenuation level can have any value, no matter how precise, within the signal, impedance, or attenuation range. Also, perfectly continuous signals, impedance, and attenuation ranges have no discontinuities and are completely continuous. The term "continuous" in this disclosure encompasses but is not limited to perfect continuity. In practice, the signal ranges, impedance ranges, and attenuation ranges are often not perfectly continuous. Noise, distortion, the material properties of the electronic components in the attenuator, as well as other factors, degrade the resolution and create discontinuities in signals and attenuation ranges. Also, a continuous signal and attenuation range may be designed to have selected discontinuities at particular locations or within limited sections of the signal and attenuation ranges.

For example, in practice, a continuous signal, impedance, or attenuation range may be designed to step from one continuous segment to another continuous segment or hiccup to another value. These continuous signals and attenuation ranges may be designed so as to avoid particular operating points and segments within the signal range, impedance range, or attenuation ranges that produce excessive distortion due to the particular characteristics of the electronic components in the attenuator. Consequently, in practice, continuous signals, impedance, and attenuation ranges may be imperfectly continuous since these signal, impedance and attenuation ranges do not have infinite resolution and/or are not completely continuous. While the term "continuous" is not utilized to describe signal and attenuation ranges made up mostly or entirely of discrete values, the term "continuous" in this disclosure does encompass imperfectly continuous signals and imperfectly continuous attenuation or impedance ranges, whether they are imperfectly continuous by design or due to factors that degrade resolution and/or continuity. Thus, the term "continuous" should be interpreted broadly in light of the practical characteristics, capabilities, and design of the electronic components in the attenuators that provide the signals and attenuation ranges.

Those skilled in the art will recognize improvements and modifications to the preferred embodiments of the present disclosure. All such improvements and modifications are considered within the scope of the concepts disclosed herein and the claims that follow.

What is claimed is:

1. An attenuator, comprising:
   a silicon-on-insulator type (SOI) substrate having a device layer, a handle layer, and an insulating layer between the device layer and the handle layer;
   a first attenuation circuit having a first variable attenuation level that is adjustable within a first continuous attenuation range, wherein:
      the first attenuation circuit comprises a first plurality of stacked transistors formed in the device layer of the SOI substrate;
      the first plurality of stacked transistors are coupled to provide a first variable impedance level having a first continuous impedance range;
      the first variable attenuation level is based on the first variable impedance level;
      the insulating layer of the SOI substrate is configured so that an impedance level of a parasitic capacitance of the first plurality of stacked transistors is below the first continuous impedance range; and
   a control circuit configured to receive an attenuation control signal, the control circuit being operably associated with the first plurality of stacked transistors to control the first variable impedance level based on a signal level of the attenuation control signal.

2. The attenuator of claim 1, wherein the insulating layer of the SOI substrate is configured so that the impedance level of the parasitic capacitance of the first plurality of stacked transistors is significantly below the first continuous impedance range whereby the impedance level of the parasitic capacitance is negligible.

3. The attenuator of claim 1, wherein the parasitic capacitance of the first plurality of stacked transistors is from the device layer to the handle layer.

4. The attenuator of claim 1, wherein a resistivity of the handle layer is at least 1 kohm-cm.

5. The attenuator of claim 1, wherein the first attenuation circuit further comprises:
   an input terminal;
   an output terminal; and
   wherein the first plurality of stacked transistors is coupled between the input terminal and the output terminal.

6. The attenuator of claim 5, wherein the first plurality of stacked transistors is coupled in series with the input terminal or the output terminal.

7. The attenuator of claim 5, wherein the first plurality of stacked transistors is coupled in shunt between the input terminal and the output terminal.

8. The attenuator of claim 5, further comprising a second plurality of stacked transistors and wherein:
the second plurality of stacked transistors are coupled to provide a second variable impedance level having a second continuous impedance range;
the second variable attenuation level is further based on the second variable impedance level;
the first plurality of stacked transistors is coupled in series with the input terminal or the output terminal; and
the second plurality of stacked transistors are coupled in shunt between the input terminal and the output terminal.

9. The attenuator of claim 8, wherein the control circuit is operably associated with the second plurality of stacked transistors to control the second variable impedance level based on the signal level of the attenuation control signal.

10. The attenuator of claim 8, wherein:
the second plurality of stacked transistors are formed in the device layer of the SOI substrate; and
the insulating layer of the SOI substrate is further configured so that an impedance level of a parasitic capacitance of the second plurality of stacked transistors is below the second continuous impedance range.

11. The attenuator of claim 10, wherein the insulating layer of the SOI substrate is configured so that the impedance level of the parasitic capacitance of the second plurality of stacked transistors is significantly below the second continuous impedance range whereby the impedance level of the parasitic capacitance of the second plurality of stacked transistors is negligible.

12. The attenuator of claim 11, wherein:
the parasitic capacitance of the first plurality of stacked transistors is from the device layer to the handle layer; and
the parasitic capacitance of the second plurality of stacked transistors is from the device layer to the handle layer.

13. The attenuator of claim 8, further comprising:
a second SOI substrate having a second device layer, a second handle layer, and a second insulating layer between the second device layer; and
wherein the second plurality of stacked transistors are formed in the second device layer of the second SOI substrate and the second insulating layer of the second SOI substrate is further configured so that an impedance level of a parasitic capacitance of the second plurality of stacked transistors is below the second continuous impedance range.

14. The attenuator of claim 13, wherein the second insulating layer of the SOI substrate is configured so that the impedance level of the parasitic capacitance of the second plurality of stacked transistors is significantly below the second continuous impedance range whereby the impedance level of the parasitic capacitance of the second plurality of stacked transistors is negligible.

15. The attenuator of claim 14, wherein:
the parasitic capacitance of the first plurality of stacked transistors is from the device layer to the handle layer; and
the parasitic capacitance of the second plurality of stacked transistors is from the second device layer to the second handle layer.

16. The attenuator of claim 1, further comprising a variable signal source operable to generate the attenuation control signal that has a variable signal level with a continuous signal range.

17. The attenuator of claim 16, wherein the variable signal source comprises a variable DC voltage source, the variable signal level being a variable voltage level and the continuous signal range being a continuous voltage range.

18. A method of forming an attenuator, comprising:
providing a handle layer made from a semiconductive material;
selecting a width for each of a plurality of stacked transistors, wherein the width for each of the plurality of stacked transistors is selected so that the plurality of stacked transistor provide a variable impedance level having a continuous impedance range;
providing an insulating layer on the handle layer, wherein the insulating layer is configured so that an impedance level of a parasitic capacitance of the plurality of stacked transistors is below the continuous impedance range; and
providing a device layer over the handle layer such that the device layer is formed to have the plurality of stacked transistors.

19. The method of claim 18, wherein the insulating layer is configured so that the impedance level of the parasitic capacitance of the first plurality of stacked transistors is significantly below the continuous impedance range whereby the impedance level of the parasitic capacitance is negligible.

20. The method of claim 18, wherein the parasitic capacitance of the plurality of stacked transistors is from the device layer to the handle layer.

* * * * *